United States Patent
Asayama

(10) Patent No.: US 9,190,414 B2
(45) Date of Patent: Nov. 17, 2015

(54) SEMICONDUCTOR DEVICE

(71) Applicant: Renesas Electronics Corporation, Kawasaki-shi, Kanagawa (JP)

(72) Inventor: Shinobu Asayama, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/701,787

(22) Filed: May 1, 2015

(65) Prior Publication Data

US 2015/0236025 A1 Aug. 20, 2015

Related U.S. Application Data

(63) Continuation of application No. 14/547,850, filed on Nov. 19, 2014, now Pat. No. 9,053,816, which is a continuation of application No. 13/911,703, filed on Jun. 6, 2013, now Pat. No. 8,908,420.

(30) Foreign Application Priority Data

Jun. 8, 2012 (JP) ................... 2012-131409

(51) Int. Cl.
*G11C 11/00* (2006.01)
*H01L 27/11* (2006.01)
*H01L 29/06* (2006.01)

(52) U.S. Cl.
CPC ........ *H01L 27/1116* (2013.01); *H01L 27/1104* (2013.01); *H01L 29/0692* (2013.01)

(58) Field of Classification Search
CPC ...................................... G11C 11/00
USPC ............................................. 365/154
See application file for complete search history.

(56) References Cited

U.S. PATENT DOCUMENTS

| | | | |
|---|---|---|---|
| 6,577,021 B2 | 6/2003 | Morishima et al. |
| 6,677,649 B2 | 1/2004 | Osada et al. |
| 7,453,126 B2 | 11/2008 | Ishii |
| 7,612,417 B2 | 11/2009 | Osada et al. |
| 7,687,864 B2 | 3/2010 | Yamamoto |
| 7,759,743 B2 | 7/2010 | Ishii |
| 7,781,846 B2 | 8/2010 | Osada et al. |

(Continued)

FOREIGN PATENT DOCUMENTS

| | | | |
|---|---|---|---|
| JP | 2001-028401 A | 1/2001 |
| JP | 2002-373946 A | 12/2002 |

(Continued)

*Primary Examiner* — Harry W Byrne
(74) *Attorney, Agent, or Firm* — Foley & Lardner LLP

(57) ABSTRACT

A well voltage supply cell includes third gate electrode group (including a third gate electrode corresponding to a first gate electrode) located symmetrically to first gate electrode group (including the first gate electrode constituting an access transistor) of a first SRAM cell, fourth gate electrode group (including a fourth gate electrode corresponding to a second gate electrode) located symmetrically to second gate electrode group (including the second gate electrode constituting an access transistor) of a second SRAM cell. a P-type impurity diffusion region located on a P well between the third gate electrode and the fourth gate electrode located opposite to each other, a first N-type impurity diffusion region located on the side of the third gate electrode closer to the first SRAM cell, and a second N-type impurity diffusion region located on the side of the fourth gate electrode closer to the second SRAM cell.

11 Claims, 41 Drawing Sheets

(56) References Cited

U.S. PATENT DOCUMENTS

| | | |
|---|---|---|
| 7,859,058 B2 | 12/2010 | Nakamura et al. |
| 7,888,748 B2 | 2/2011 | Ishii |
| 8,188,549 B2 | 5/2012 | Ishii |
| 2001/0019641 A1* | 9/2001 | Ikeda et al. ............ 385/14 |
| 2002/0117722 A1 | 8/2002 | Osada et al. |
| 2003/0122159 A1* | 7/2003 | Ikeda et al. ............ 257/204 |
| 2004/0012040 A1 | 1/2004 | Osada et al. |
| 2004/0264274 A1* | 12/2004 | Ikeda et al. ............ 365/202 |
| 2005/0062077 A1* | 3/2005 | Ikeda et al. ............ 257/232 |
| 2005/0078546 A1 | 4/2005 | Hirano et al. |
| 2005/0082622 A1* | 4/2005 | Ikeda et al. ............ 257/379 |
| 2006/0050588 A1 | 3/2006 | Osada et al. |
| 2006/0160297 A1* | 7/2006 | Ikeda et al. ............ 438/238 |
| 2007/0241382 A1* | 10/2007 | Ikeda et al. ............ 257/300 |
| 2007/0263428 A1 | 11/2007 | Ishii |
| 2008/0073726 A1* | 3/2008 | Ikeda et al. ............ 257/384 |
| 2008/0099854 A1* | 5/2008 | Ikeda et al. ............ 257/383 |
| 2010/0301422 A1 | 12/2010 | Osada et al. |
| 2011/0076820 A1* | 3/2011 | Ikeda et al. ............ 438/279 |
| 2011/0156155 A1* | 6/2011 | Ikeda et al. ............ 257/369 |
| 2011/0159653 A1* | 6/2011 | Ikeda et al. ............ 438/279 |
| 2012/0168875 A1 | 7/2012 | Tamaru et al. |
| 2013/0049131 A1 | 2/2013 | Osada et al. |

FOREIGN PATENT DOCUMENTS

| | | |
|---|---|---|
| JP | 2006-049784 A | 2/2006 |
| JP | 2006-253375 A | 9/2006 |
| JP | 2007-043082 A | 2/2007 |
| JP | 2007-305787 A | 11/2007 |
| WO | WO-2011/077664 A1 | 6/2011 |

* cited by examiner

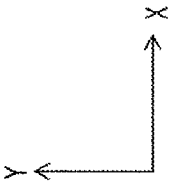

SEMICONDUCTOR DEVICE

CROSS-REFERENCE TO RELATED APPLICATIONS

This application is a continuation of U.S. application Ser. No. 14/547,850, filed Nov. 19, 2014, which is a continuation of U.S. application Ser. No. 13/911,703, filed Jun. 6, 2013, which claims benefit of priority from the prior Japanese Application No. 2012-131409, filed on Jun. 8, 2012; the entire contents of all of which are incorporated herein by reference.

BACKGROUND

The present invention relates to a semiconductor device and, particularly, to a semiconductor device with an SRAM (static random access memory) cell.

With the proliferation of mobile terminal equipment such as smartphones and the proliferation of in-vehicle microcomputers used for no-idling engines, automotive navigation systems or the like, the importance of SRAM (Static Random Access Memory) for processing high-volume digital signals at high speed is increasing today. Particularly, very high quality is required for in-vehicle microcomputers. Generally, high speed, small area and low power consumption are key features of SRAM.

In an SRAM memory cell array, cells for supplying a voltage to a well (well voltage supply cells) are arranged at specified intervals between memory cells. It is thus desirable that the size of the well voltage supply cells is small as well as the memory cells in order to reduce the area of SRAM.

It is also desirable that the well voltage supply cells are arranged with the same regularity as the surrounding memory cells in order to reduce fluctuations in characteristics and shape of transistors in the respective memory cells and enhance reliability.

It is further desirable to provide multiple power supplies in order to improve the low power consumption and the cell operating margin of the memory cells.

Japanese Unexamined Patent Application Publication No. 2001-28401 discloses a typical SRAM.

Japanese Unexamined Patent Application Publication No. 2007-305787 discloses SRAM in which stress on an isolation region is reduced.

Japanese Unexamined Patent Application Publication No. 2002-373946 discloses SRAM including well voltage supply cells that are arranged with the same regularity as the surrounding memory cells.

Japanese Unexamined Patent Application Publication No. 2007-43082 discloses SRAM provided with multiple power supplies.

SUMMARY

The present inventor has found the following problem.

In the SRAM provided with multiple power supplies described above, it has been difficult to arrange the well voltage supply cells with the same regularity as the surrounding memory cells.

The other problems and novel features of the present invention will become apparent from the description of the specification and the accompanying drawings.

According to one embodiment, a well voltage supply cell includes third gate electrode group (including a third gate electrode corresponding to a first gate electrode) located symmetrically to first gate electrode group (including the first gate electrode constituting an access transistor) of a first SRAM cell, fourth gate electrode group (including a fourth gate electrode corresponding to a second gate electrode) located symmetrically to second gate electrode group (including the second gate electrode constituting an access transistor) of a second SRAM cell, a P-type impurity diffusion region placed between the third gate electrode and the fourth gate electrode located opposite to each other on a P well, a first N-type impurity diffusion region placed on the first SRAM cell side of the third gate electrode, and a second N-type impurity diffusion region placed on the second SRAM cell side of the fourth gate electrode.

According to the above-described embodiment, it is possible to arrange well voltage supply cells with the same regularity as the surrounding memory cells in the SRAM provided with multiple power supplies.

BRIEF DESCRIPTION OF THE DRAWINGS

The above and other aspects, advantages and features will be more apparent from the following description of certain embodiments taken in conjunction with the accompanying drawings, in which:

FIG. 2 is a schematic diagram showing the arrangement of memory cells MC and well voltage supply cells WSC in a memory cell array CA;

DETAILED DESCRIPTION

Specific embodiments of the present invention will be described hereinbelow with reference to the drawings. The present invention, however, is not limited to the below-described embodiments. The following description and the appended drawings are appropriately shortened and simplified to clarify the explanation.

First Embodiment

Figure 1:
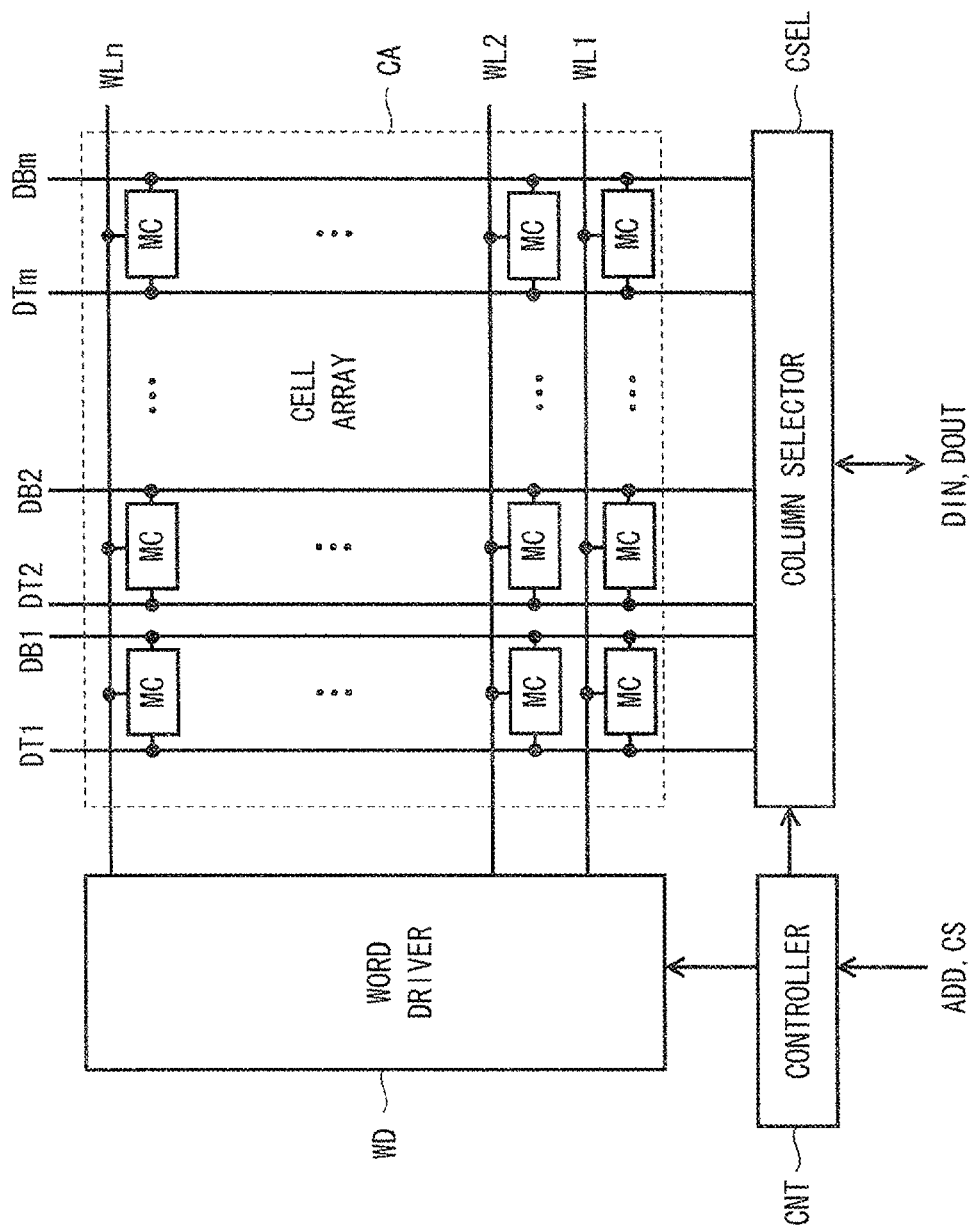
FIG. 1 is a block diagram of a semiconductor device according to a first embodiment.

FIG. 1 is a block diagram of a semiconductor device according to a first embodiment. The semiconductor device according to the first embodiment is SRAM including a controller CNT, a memory cell array CA, a word driver WD, and a column selector CSEL. The column selector CSEL has the input/output control function as well.

The controller CNT controls the word driver WD and the column selector CSEL based on input of an address ADD and a control signal CS.

The memory cell array CA has a plurality of memory cells MC arranged in a matrix. Specifically, n (n is a natural number) number of word lines WL1, WL2, ..., WLn are arranged along the row direction (x direction). Further, m number of bit line pairs DT1 and DB1, DT2 and DB2, ..., DTm and DBm are arranged in the column direction (y direction). The memory cell MC is placed at the position where each word line and each bit line pair intersect each other. Thus, in the example of FIG. 1, the memory cell array CA has n×m number of memory cells.

The word driver WD drives the word lines word lines WL1 to WLn in accordance with the control signal output from the controller CNT and selects a row of the memory cell array CA. Further, the column selector CSEL selects a bit line pair (for example, DT1 and DB1) in accordance with the control signal output from the controller CNT and writes or reads data on a target memory cell. For example, when writing data, the column selector CSEL writes input data DIN to the target memory cell MC through the selected bit line pair (for example, DT1 and DB1). On the other hand, when reading data, the column selector CSEL detects data stored in the target memory cell MC through the selected bit line pair (for example, DT1 and DB1) and outputs the data as output data DOUT.

FIG. 2 is a schematic diagram showing the arrangement of memory cells MC and well voltage supply cells WSC in the memory cell array CA. The memory cell array CA in FIG. 2 has memory cells MC arranged in a matrix. Well voltage supply cells WSC for supplying a well voltage to the N well and P well of the memory cells MC are generally arranged at regular intervals. In the example of FIG. 2, in any column, one well voltage supply cell WSC is placed with respect to four memory cells MC in the y direction. In the x direction, eight well voltage supply cells WSC are arranged in a row from end to end of the memory cell array CA. In other words, the well voltage supply cells WSC form one row. Further, in the memory cell array CA, the well voltage supply cells WSC are arranged in each of the rows at both ends in the y direction or the top and bottom rows. Note that the specific numeric values such as "four" and "eight" described above are just examples and may be altered as appropriate.

Figure 3A:
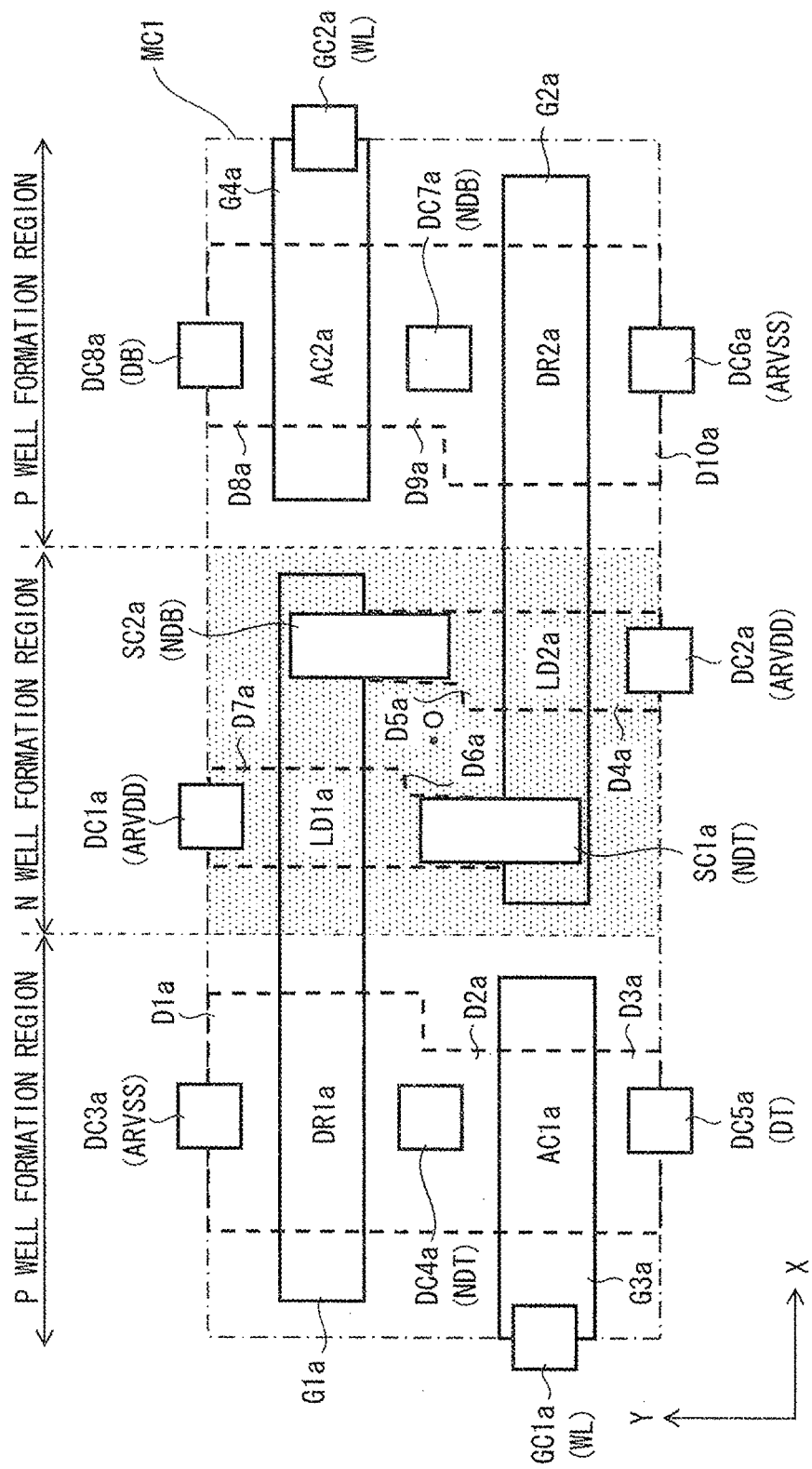
FIG. 3A is a layout diagram of a memory cell MC1 in SRAM according to the first embodiment.
Figure 3B:
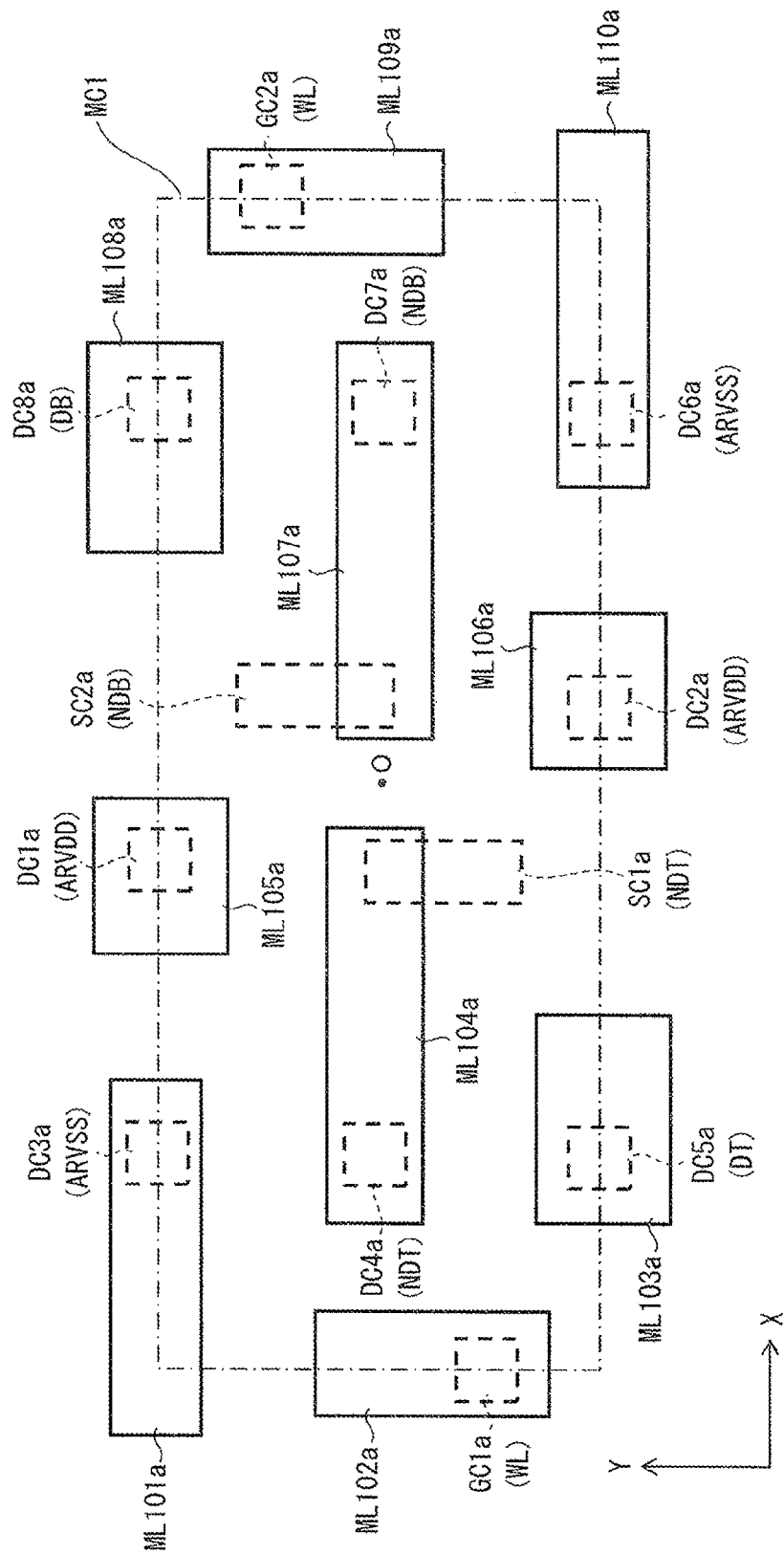
FIG. 3B is a layout diagram of a first layer line in the memory cell MC1.
Figure 3C:
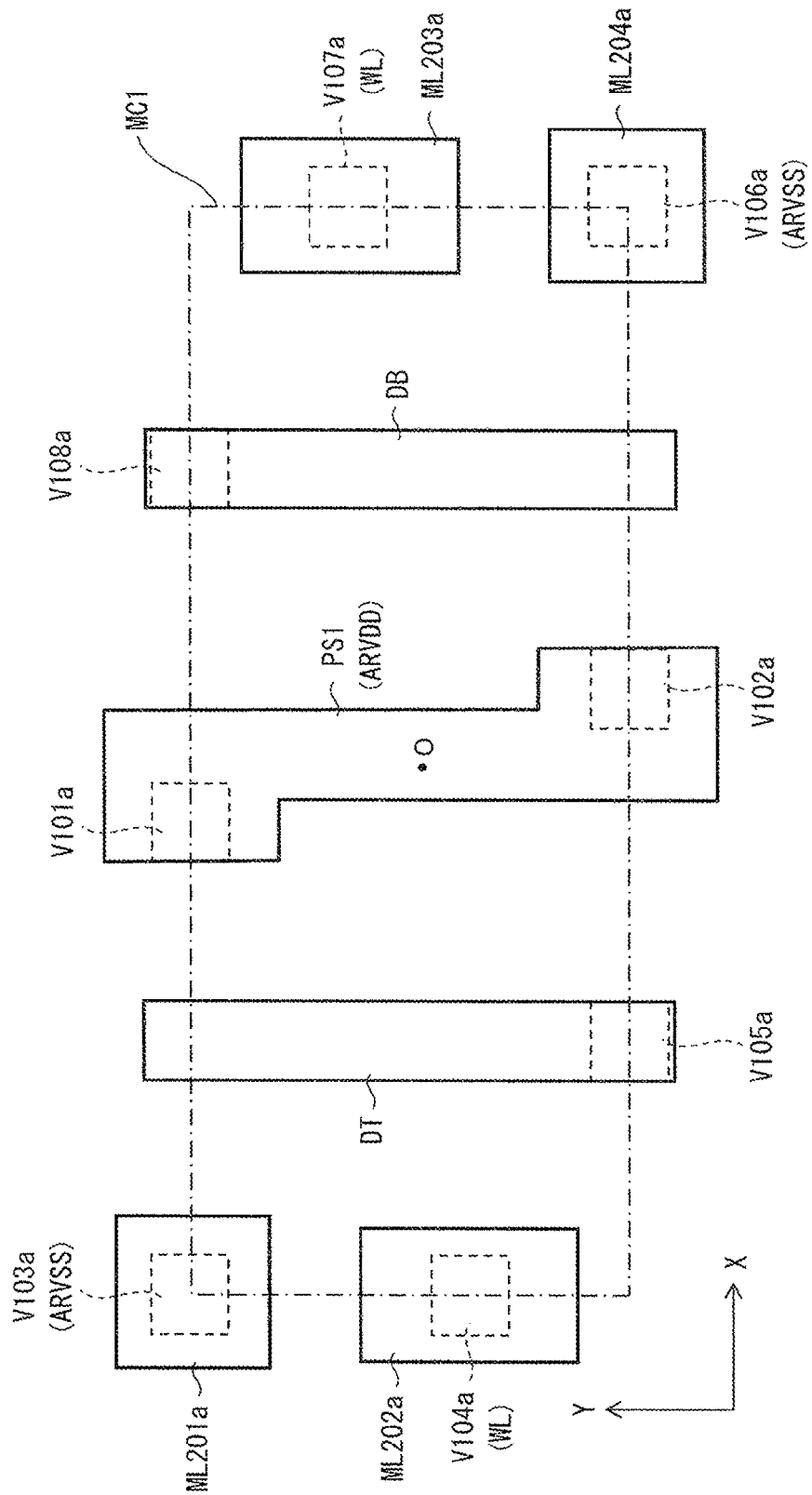
FIG. 3C is a layout diagram of a second layer line in the memory cell MC1.
Figure 3D:
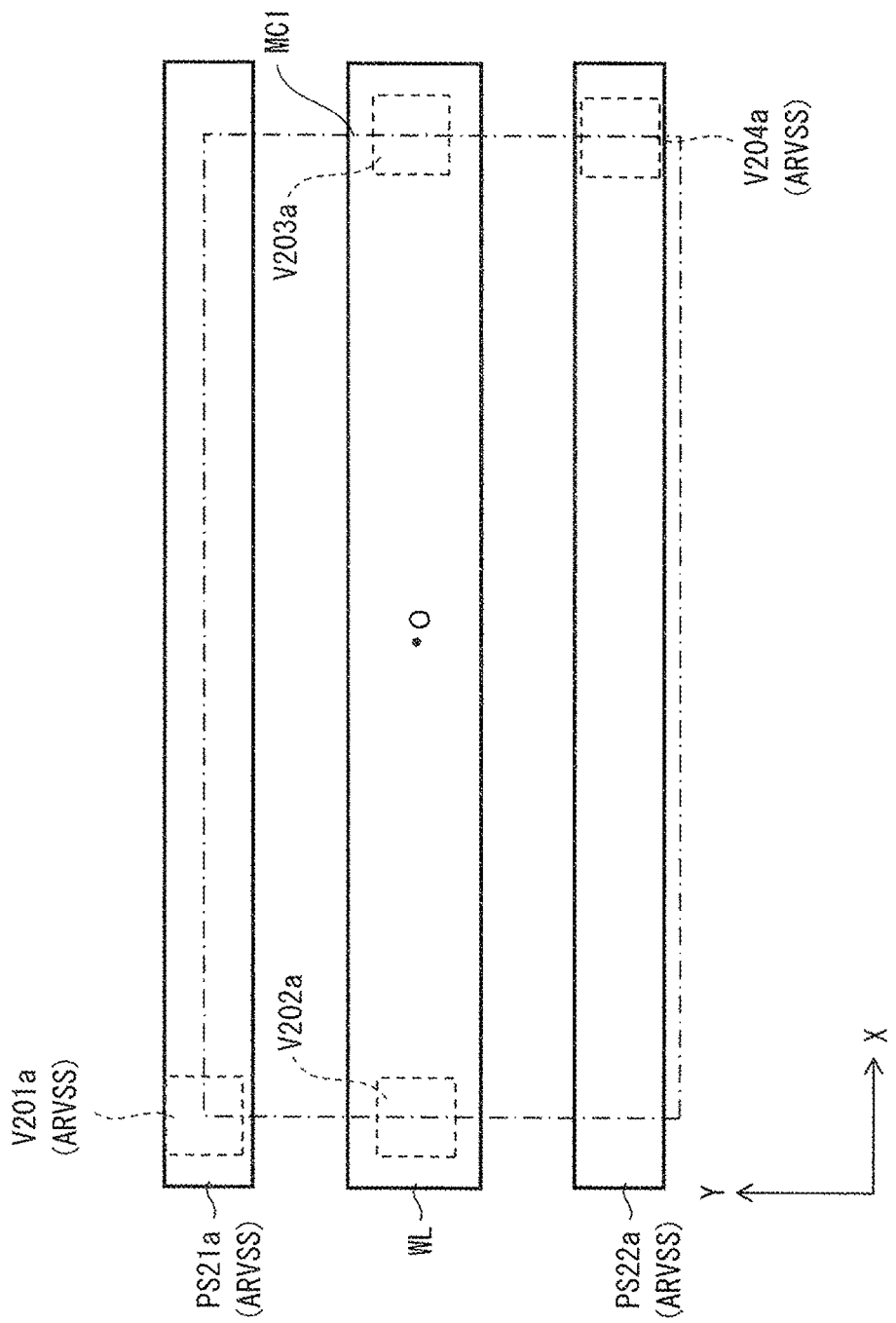
FIG. 3D is a layout diagram of a third layer line in the memory cell MC1.

The layout of a memory cell of the SRAM according to the first embodiment is described hereinafter with reference to FIGS. 3A to 3D. FIG. 3A is a layout diagram of a memory cell MC1 in the SRAM according to the first embodiment. The memory cell MC1 is one of MC in FIG. 2. The memory cell MC1 is the part enclosed by alternate long and short dashed lines in FIG. 3A. The part outside the alternate long and short dashed lines belongs to adjacent cells. FIG. 3B is a layout diagram of a first layer line in the memory cell MC1. FIG. 3C is a layout diagram of a second layer line in the memory cell MC1. FIG. 3D is a layout diagram of a third layer line in the memory cell MC1. Note that the first layer line is formed on a gate formation layer (which is formed using gate polysilicon or gate metal) of the memory cell MC1. Further, the second layer line is formed on the first layer line, and the third layer line is formed on the second layer line. As shown in FIG. 3A, the memory cell MC1 includes four gate electrodes G1a to G4a, ten diffusion regions D1a to D10a, eight diffusion region contacts DC1a to DC8a, two gate contacts GC1a to GC2a, and two shared contacts SC1a and SC3a. Note that the four gate electrodes G1a to G4a are formed in the gate formation layer.

The outer shape of the memory cell MC1 enclosed by the border line indicated by the alternate long and short dashed lines is a rectangle. The memory cell MC1 has a layout structure that is point-symmetric about the center O. Accordingly, the gate electrodes G1a and G2a have the same shape, the P-type diffusion regions D4a and D7a have the same shape, the P-type diffusion regions D5a and D6a have the same shape, the gate electrodes G1a and G4a have the same shape, the N-type diffusion regions D1a and D10a have the same shape, the N-type diffusion regions D2a and D9a have the same shape, and the N-type diffusion regions D1a and D8a have the same shape. Further, the memory cells adjacent to the memory cell MC1 are arranged to be line-symmetric to the memory cell MC1 with respect to each of the border lines of the memory cell MC1 corresponding the four sides of the rectangle indicated by the alternate long and short dashed lines.

Further, the memory cell MC1 shown in FIG. 3A is a full-CMOS SRAM cell. Therefore, the memory cell MC1 includes four NMOS transistors formed in a P well formation region and two PMOS transistors formed in an N well formation region. Specifically, the memory cell MC1 includes two access transistors AC1a and AC2a, which are NMOS transistors, two drive transistors DR1a and DR2a, which are NMOS transistors, and two load transistors LD1a and LD2a, which are PMOS transistors. The drive transistor DR1a and the load transistor LD1a form an inverter. Likewise, the drive transistor DR2a and the load transistor LD2a form an inverter.

Figure 4:
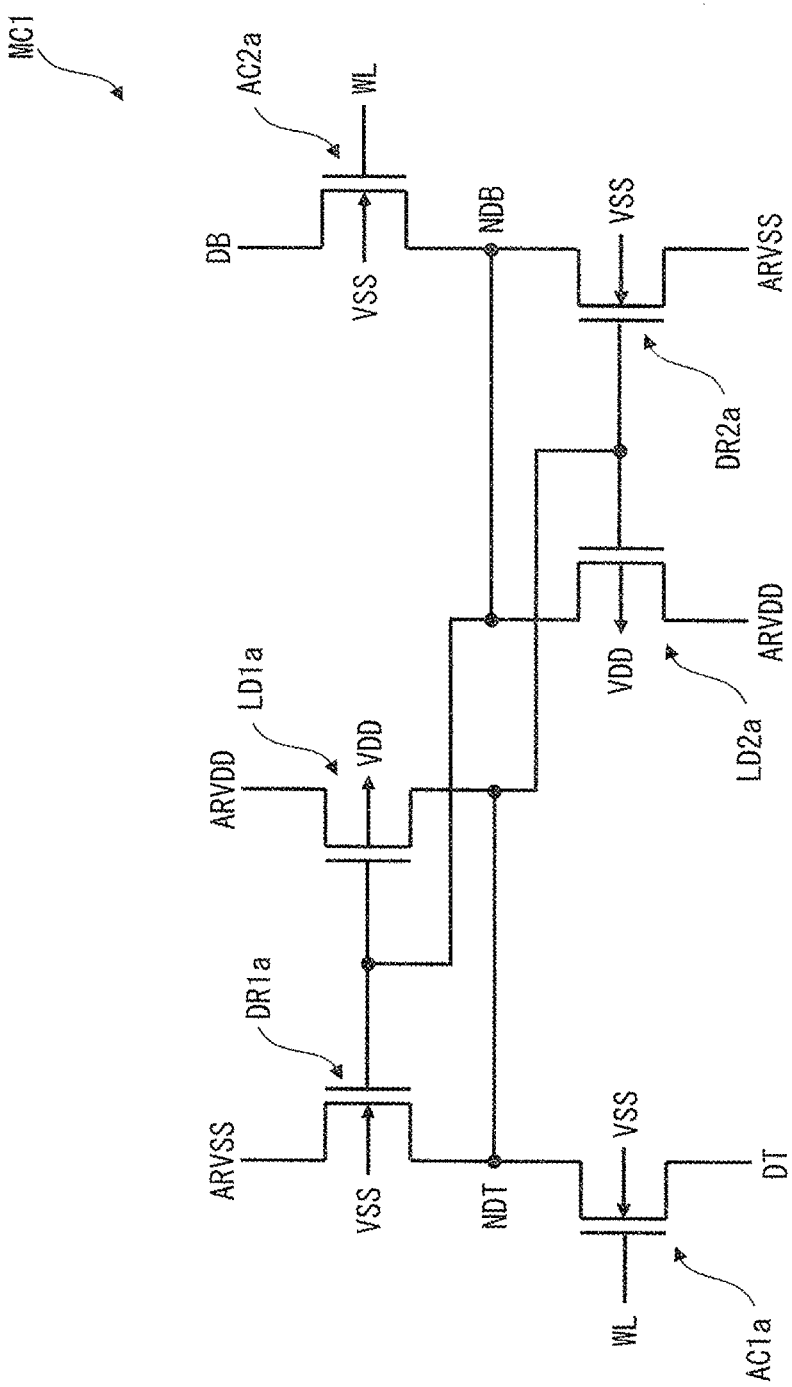
FIG. 4 is a circuit diagram of the memory cell MC1 corresponding to FIG. 3A.

FIG. 4 is a circuit diagram of the memory cell MC1 corresponding to FIG. 3A. As shown in FIG. 4, in the memory cell MC1, the sources of the load transistors LD1a and LD2a are both connected to a second high-voltage power supply (power supply voltage ARVDD). The drains of the load transistors LD1a and LD2a are connected to the drains of the drive transistors DR1a and DR2a, respectively. The sources of the drive transistors DR1a and DR2a are both connected to a second low-voltage power supply (power supply voltage ARVSS). The gates of the load transistor LD1a and the drive transistor DR1a are both connected to a storage node NDB to which the drains of the load transistor LD2a and the drive transistor DR2a are connected. On the other and, the gates of the load transistor LD2a and the drive transistor DR2a are both connected to a storage node NDT to which the drains of the load transistor LD1a and the drive transistor DR1a are connected.

One of the source and drain of the access transistor AC1a is connected to the storage node NDT and the other one is connected to a bit line DT. Further, one of the source and drain of the access transistor AC2a is connected to the storage node NDB and the other one is connected to a bit line DB. The gates of the access transistors AC1a and AC2a are both connected to a word line WL.

As shown in FIG. 3A, the access transistor AC1a is composed of the gate electrode G1a and the N-type diffusion regions D2a and D1a. The drive transistor DR1a is composed of the gate electrode G1a and the N-type diffusion regions D2a and D1a. Thus, the N-type diffusion region D2a is shared by the access transistor AC1a and the drive transistor DR1a. The load transistor LD1a is composed of the gate electrode G1a and the P-type diffusion regions D6a and D7a. Thus, the gate electrode G1a is shared by the load transistor LD1a and the drive transistor DR1a.

The N-type diffusion regions D1a, D2a and D3a lie linearly in the y direction and formed to be orthogonal to both of the gate electrodes G1a and G3a that lie substantially parallel to each other in the x direction. Further, the P-type diffusion regions D6a and D7a are formed to be parallel to the N-type diffusion regions D1a, D2a and D3a. Thus, the P-type diffusion regions D6a and D7a are orthogonal to the gate electrode G1a. Further, the P-type diffusion region D6a is formed to one end of the gate electrode G2a that is formed in parallel to the gate electrode G1a. Further, the gate electrode G3a is formed in a position on an extension of the one end of the gate electrode G2a.

Likewise, the access transistor AC2a is composed of the gate electrode G4a and the N-type diffusion regions D9a and D8a. The drive transistor DR2a is composed of the gate electrode G2a and the N-type diffusion regions D9a and D10a. Thus, the N-type diffusion region D9a is shared by the access transistor AC2a and the drive transistor DR2a. The load transistor LD2a is composed of the gate electrode G2a and the P-type diffusion regions D5a and D4a. Thus, the gate electrode G2a is shared by the load transistor LD2a and the drive transistor DR2a.

The N-type diffusion regions D10a, D9a and D8a lie linearly in the y direction and formed to be orthogonal to both of the gate electrodes G2a and G4a that lie substantially parallel to each other in the x direction. Further, the P-type diffusion regions D5a and D4a are formed to be parallel to the N-type diffusion regions D10a, D9a and D8a. Thus, the P-type diffusion regions D5a and D4a are orthogonal to the gate electrode G2a. Further, the P-type diffusion region D5a is formed to one end of the gate electrode G1a. Further, the gate electrode G4a is formed in a position on an extension of the one end of the gate electrode G1a.

FIG. 3B is a layout diagram of a first layer line in the memory cell MC1 according to the first embodiment. As in FIG. 3A, the part enclosed by alternate long and short dashed lines is the memory cell MC1. The part indicated by the alternate long and short dashed lines is the cell border of the memory cell MC1. The part outside the alternate long and short dashed lines belongs to adjacent cells. In FIG. 3B, the contacts shown in FIG. 3A are also shown by dotted lines. As shown in FIGS. 3A and 3B, the gate electrode G1a of the access transistor AC1a is connected to a first layer line ML102a, which is a relay line for connection to the word line WL, through the gate contact GC1a. Likewise, the gate electrode G4a of the access transistor AC2a is connected to a first layer line ML109a, which is a relay line for connection to the word line WL, through the gate contact GC2a. The gate contacts GC1a and GC2a are formed on the border line of the memory cell MC1.

As shown in FIGS. 3A and 3B, the N-type diffusion region D1a constituting the access transistor AC1a is connected to a first layer line ML103a, which is a relay line for connection to the bit line DT, which is described later, through the diffusion region contact DC5a. Likewise, the N-type diffusion region D8a constituting the access transistor AC2a is connected to a first layer line ML108a, which is a relay line for connection to the bit line DB, which is described later, through the diffusion region contact DC8a.

As shown in FIGS. 3A and 3B, the N-type diffusion region D1a constituting the source of the drive transistor DR1a is connected to a first layer line ML101a, which is a relay line for connection to the second low-voltage power supply ARVSS, through the diffusion region contact DC3a. Likewise, the N-type diffusion region D10a constituting the source of the drive transistor DR2a is connected to a first layer line ML110a, which is a relay line for connection to the second low-voltage power supply ARVSS, through the diffusion region contact DC6a.

As shown in FIGS. 3A and 3B, the P-type diffusion region D7a constituting the load transistor LD1a is connected to a first layer line ML105a, which is a relay line for connection to the second high-voltage power supply ARVDD, through the diffusion region contact DC1a. Likewise, the P-type diffusion region D4a constituting the load transistor LD2a is connected to a first layer line ML106a, which is a relay line for connection to the second high-voltage power supply ARVDD, through the diffusion region contact DC2a.

As shown in FIG. 3A, the gate electrode G1a that is shared by the drive transistor DR1a and the load transistor LD1a is connected to the P-type diffusion region D5a constituting the drain of the load transistor LD2a through the shared contact SC2a. Further, as shown in FIG. 3B, the shared contact SC2a is connected to the diffusion region contact DC7a through the first layer line ML107a. As shown in FIG. 3A, the diffusion region contact DC7a is formed on the N-type diffusion region D9a that is shared by the access transistor AC2a and the drive transistor DR2a.

Likewise, as shown in FIG. 3A, the gate electrode G2a that is shared by the drive transistor DR2a and the load transistor LD2a is connected to the P-type diffusion region D6a constituting the drain of the load transistor LD1a through the shared contact SC1a. Further, as shown in FIG. 3B, the shared contact SC1a is connected to the diffusion region contact DC4a through the first layer line ML104a. As shown in FIG. 3A, the diffusion region contact DC4a is formed on the N-type diffusion region D2a that is shared by the access transistor AC1a and the drive transistor DR1a.

The plane layout of the first layer line is described hereinafter with reference to FIG. 3B.

The first layer line ML101a lies along the border line in the x direction where the diffusion region contact DC3a is formed, from the formation position of the diffusion region contact DC3a to the corner of the adjacent memory cell MC1.

The first layer line ML110a lies along the border line in the x direction where the diffusion region contact DC6a is formed, from the formation position of the diffusion region contact DC6a to the corner of the adjacent memory cell MC1.

The diffusion region contacts DC3a and DC6a are arranged point-symmetrically to each other about the center O of the memory cell MC1. Accordingly, the first layer lines ML110a and ML101a are also arranged point-symmetrically to each other.

The first layer line ML102a lies along the border line in the y direction where the gate contact GC1a is formed, from the formation position of the gate contact GC1a to the center of the border line.

The first layer line ML109a lies along the border line in the y direction where the gate contact GC2a is formed, from the formation position of the gate contact GC2a to the center of the border line.

The gate contacts GC1a and GC2a are arranged point-symmetrically to each other about the center O of the memory cell MC1. Accordingly, the first layer lines ML102a and ML110a are also arranged point-symmetrically to each other.

The first layer line ML103a lies along the border line in the x direction where the diffusion region contact DC5a is formed, from the formation position of the diffusion region contact DC5a, slightly extending toward the center of the memory cell MC1.

The first layer line ML108a lies along the border line in the x direction where the diffusion region contact DC8a is formed, from the formation position of the diffusion region contact DC8a, slightly extending toward the center of the memory cell MC1.

The diffusion region contacts DC5a and DC8a are arranged point-symmetrically to each other about the center O of the memory cell MC1. Accordingly, the first layer lines ML103a and ML108a are also arranged point-symmetrically to each other.

The first layer line ML104a lies in the center of the memory cell MC1 in the y direction, along the x direction from the formation position of the diffusion region contact DC4a to the formation position of the shared contact SC1a.

The first layer line ML107a lies in the center of the memory cell MC1 in the y direction, along the x direction from the formation position of the diffusion region contact DC7a to the formation position of the shared contact SC2a.

The first layer lines ML104a and ML107a are also arranged point-symmetrically to each other.

The first layer line ML105a is formed on the diffusion region contact DC1a so that it is slightly larger than the diffusion region contact DC1a.

The first layer line ML106a is formed on the diffusion region contact DC2a so that it is slightly larger than the diffusion region contact DC2a.

The diffusion region contacts DC1a and DC2a are arranged point-symmetrically to each other about the center O of the memory cell MC1. Accordingly, the first layer lines ML105a and ML106a are also arranged point-symmetrically to each other.

The plane layout of the second layer line is described hereinafter with reference to FIG. 3C. As in FIG. 3A, the part enclosed by alternate long and short dashed lines is the memory cell MC1. The part outside the alternate long and short dashed lines belongs to adjacent cells. In FIG. 3C, eight first vias V101a to V108a that are placed between each first layer line and each second layer line are also shown by dotted lines.

The second layer line ML201a is formed above the first via V103a that is connected to the second low-voltage power supply ARVSS so that it is slightly larger than the first via V103a. On the first layer line ML101a, the first via V103a is located at the corner of the memory cell MC1.

The second layer line ML204a is formed above the first via V106a that is connected to the second low-voltage power supply ARVSS so that it is slightly larger than the first via V106a. On the first layer line ML101a, the first via V106a is located at the corner of the memory cell MC1.

The first vias V103a and 106a are arranged point-symmetrically to each other about the center O of the memory cell MC1. Accordingly, the second layer lines ML201a and ML204a are also arranged point-symmetrically to each other.

The second layer line ML202a is formed above the first via V104a that is connected to the word line WL so that it is slightly larger than the first via V104a. The first via V104a is located at the center of the first layer line ML102a that is located on the border line in the y direction.

The second layer line ML203a is formed above the first via V107a that is connected to the word line WL so that it is slightly larger than the first via V107a. The first via V107a is located at the center of the first layer line ML109a that is located on the border line in the y direction.

The first vias V104a and 107a are arranged point-symmetrically to each other about the center O of the memory cell MC1. Accordingly, the second layer lines ML202a and ML203a are also arranged point-symmetrically to each other.

The bit line DT formed in the second line layer lies in the y direction so that it runs across the first via V105a. The first via V105a is located on the first layer line ML103a that is located on the border line in the x direction.

Further, the bit line DB formed in the second line layer lies in the y direction so that it runs across the first via V108a. The first via V108a is located on the first layer line ML108a that is located on the border line in the x direction.

The first vias V105a and 108a are arranged point-symmetrically to each other about the center O of the memory cell MC1. Accordingly, the bit lines DT and DB are also located at the equal distance from the center O of the memory cell MC1.

The power supply line PS1 formed in the second line layer lies in the y direction so that it runs across the first vias V101a and V102a. The first via V101a is located on the first layer line ML105a that is located on the border line in the x direction. The first via V102a is located on the first layer line ML106a that is located on the border line in the x direction. The power supply line PS1 is connected to the second high-voltage power supply ARVDD.

The first vias V101a and 102a are arranged point-symmetrically to each other about the center O of the memory cell MC1. Further, the power supply line PS1 has a point-symmetric shape including the center O of the memory cell MC1.

The plane layout of the third layer line is described hereinafter with reference to FIG. 3D. As in FIG. 3A, the part enclosed by alternate long and short dashed lines is the memory cell MC1. The part outside the alternate long and short dashed lines belongs to adjacent cells. In FIG. 3D, four second vias V201a to V204a that are located between the second layer line and the third layer line are also shown by dotted lines.

The power supply line PS21a formed in the third line layer lies along the border line in the x direction so that it runs across the second via V201a. The second via V201a is located on the second layer line ML201a at the corner of the memory cell MC1.

The power supply line PS22a formed in the third line layer lies along the border line in the x direction so that it runs across the second via V204a. The second via V204a is located on the second layer line ML204a at the corner of the memory cell MC1.

The second vias V201a and 204a are arranged point-symmetrically to each other about the center O of the memory cell MC1. Therefore, the power supply lines PS21a and PS22a lie along the border lines in the x direction which are opposed to each other. The power supply lines PS21a and PS22a are both connected to the second low-voltage power supply ARVSS.

The word line WL formed in the third line layer lies in the x direction so that it runs across the second vias V202a and V203a. The second via V202a is located on the second layer line ML202a that is located on the border line in the y direction. The second via V203a is located on the second layer line ML203a that is located on the border line in the y direction.

The second vias V202a and 203a are arranged point-symmetrically to each other about the center O of the memory cell MC1. Further, the word line WL has a point-symmetric shape including the center O of the memory cell MC1.

Figure 5:
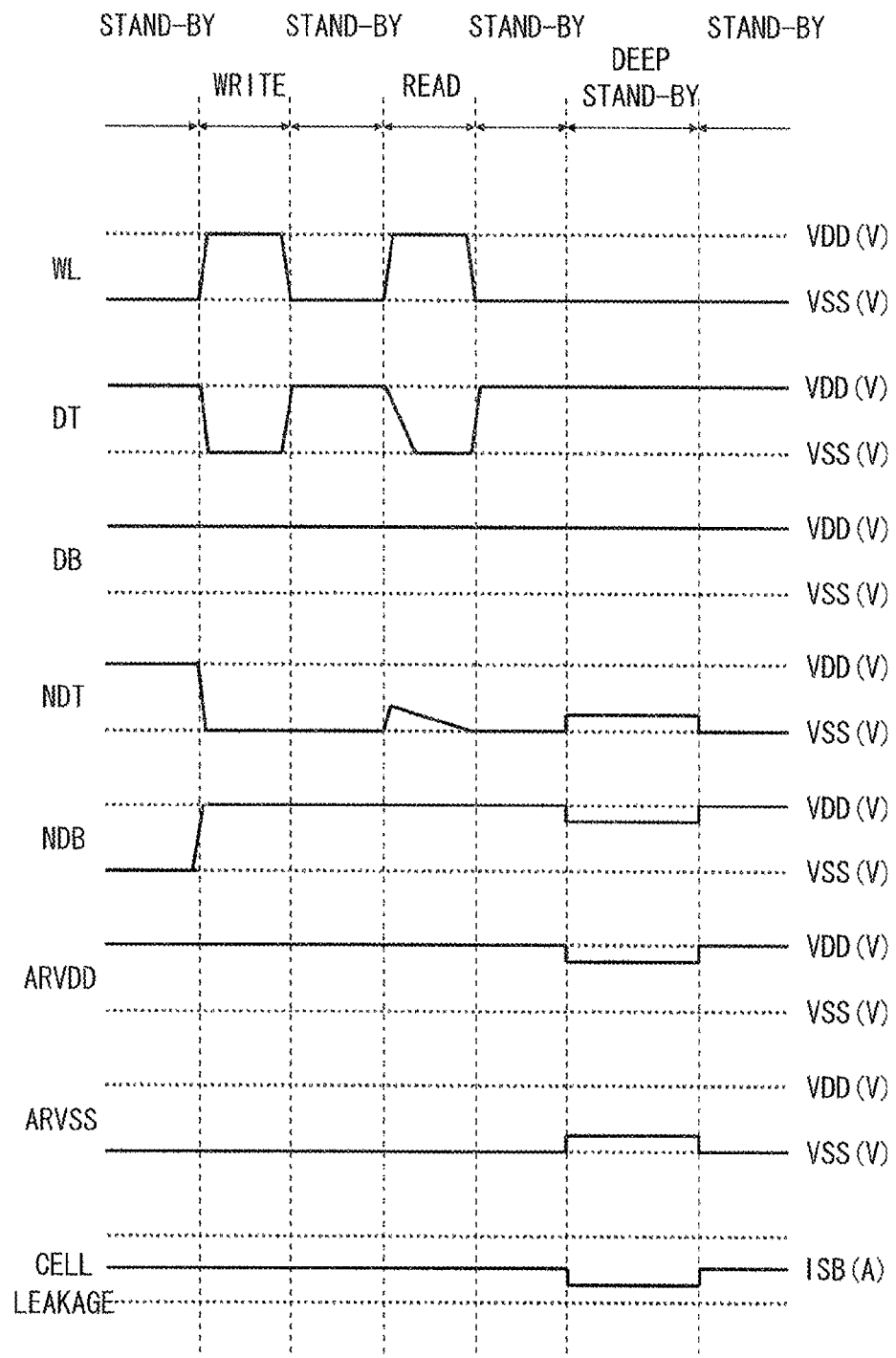
FIG. 5 is a timing chart illustrating the operation of SRAM according to the first embodiment.

The operation of the SRAM according to this embodiment is described hereinafter with reference to FIG. 5. FIG. 5 is a timing chart illustrating the operation of the SRAM according to this embodiment.

As shown in FIG. 5, in normal standby mode which is on standby for reading or writing, the word line WL is L(VSS). Further, the bit line pair DT and DB is pre-charged to H(VDD). The storage nodes NDT and NDB maintain their values. On the other hand, in write or read operation, the word line WL is H.

In the example of FIG. 5, the value initially stored in the storage node NDT is H, and the value initially stored in the storage node NDB is L. During the write operation, the bit line DT becomes L and the bit line DB becomes H, and the value of the storage node NDT is changed from H to L, and the value of the storage node NDB is changed from L to H. After that, during the read operation, the values of the storage nodes NDT and NDB are read through the bit lines DT and DB, respectively. Because the bit line DT is pre-charged to H, the voltage of the storage node NDT rises slightly at the start of reading.

Deep standby mode is low power consumption mode where the operation is suspended with the data retained. In the SRAM according to this embodiment, the second low-voltage power supply voltage ARVSS is set higher than the first low-voltage power supply VSS in the deep standby mode. For example, the second low-voltage power supply voltage ARVSS is set higher than the first low-voltage power supply VSS by about 0.1V to 0.2V. Further, the second high-voltage power supply voltage ARVDD is set lower than the first high-voltage power supply VDD. For example, the second high-voltage power supply voltage ARVDD is set lower than the first high-voltage power supply VDD by about 0.1V to 0.2V.

Decreasing the second high-voltage power supply ARVDD leads to reducing a GIDL component and a gate leakage component. Further, increasing the second low-voltage power supply voltage ARVSS, which is a source voltage of the NMOS transistor, leads to decreasing a gate-source voltage Vgs and increasing a threshold due to a back-bias effect, thus reducing a subthreshold leakage component. As a result, standby consumption current ISB, especially, can be reduced. Note that the standby consumption current ISB can be reduced only by increasing the second low-voltage power supply voltage ARVSS or decreasing the second high-voltage power supply voltage ARVDD.

Figure 6:
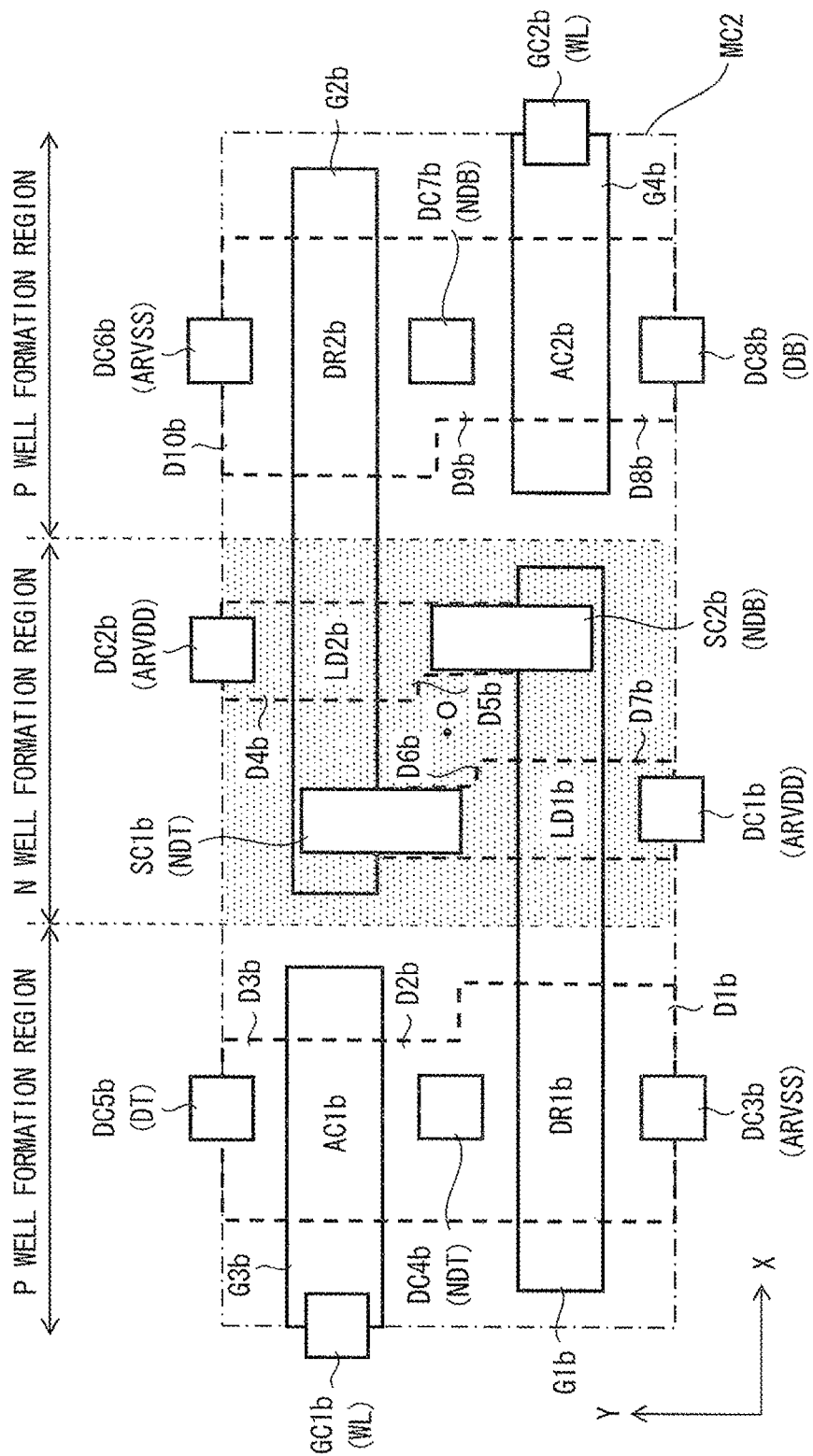
FIG. 6 is a layout diagram of a memory cell MC2 having a layout that is line-symmetric to the memory cell MC1 with respect to the border line of the memory cell MC1.

FIG. 6 shows a layout of a memory cell MC2, which is the layout where the memory cell MC1 is reversed line-symmetrically about the x-axis with respect to the border line of the memory cell MC1. In the memory cell array CA shown in FIG. 2, the memory cell MC1 shown in FIG. 3A and the memory cell MC2 shown in FIG. 6 are arranged alternately in column along the y direction.

Figure 9A:
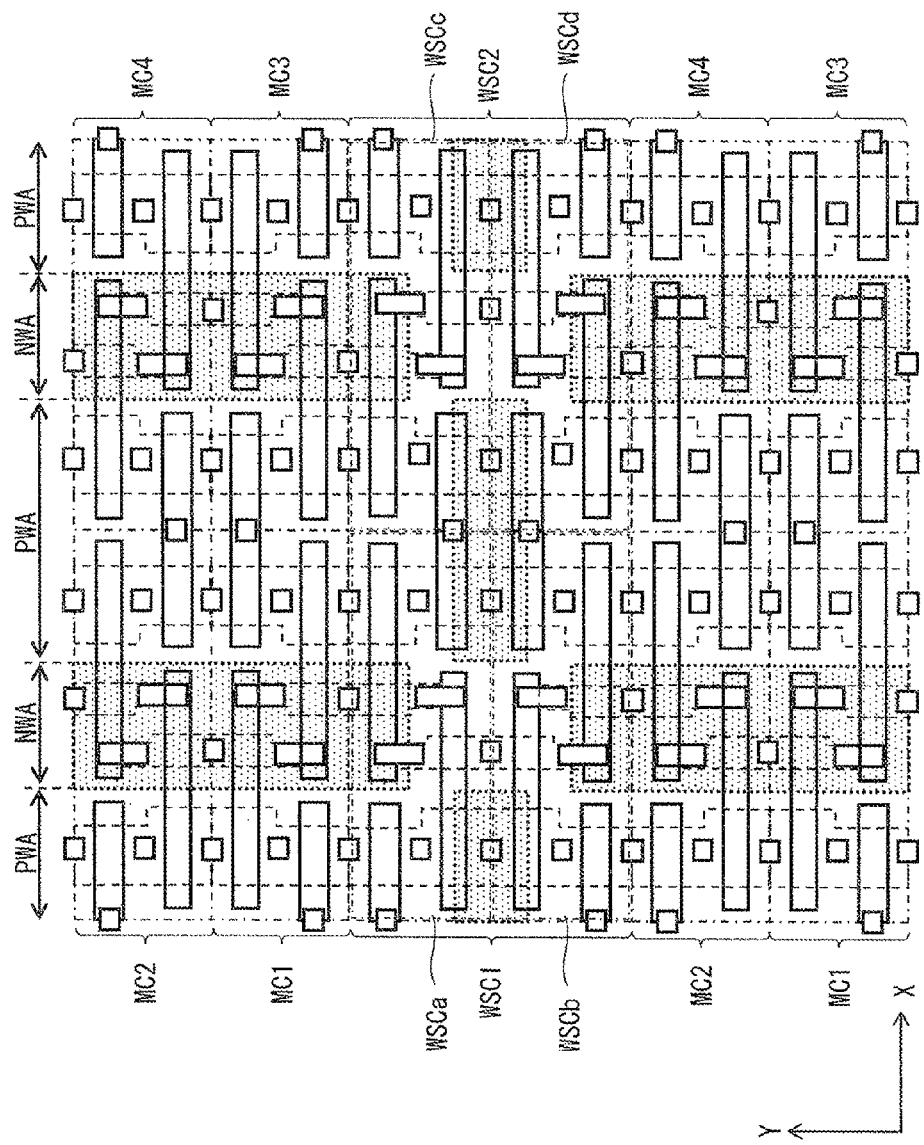
FIG. 9A is a diagram showing a layout example of memory cells and well voltage supply cells in the area A1 in FIG. 2.

Further, a memory cell MC3, which is a memory cell having a layout where the memory cell MC1 is reversed line-symmetrically about the y-axis, and a memory cell MC4, which is a memory cell having a layout where the memory cell MC3 is further reversed line-symmetrically about the x-axis, are arranged alternately in column along the y direction (MC3 and MC4 are shown in FIG. 9A). Further, the column composed of MC1 and MC2 and the column composed of MC3 and MC4 are arranged adjacent to each other so that the MC1 and MC3 are next to each other.

Note that, because the memory cell MC1 is point-symmetric about the center of MC1, MC4 and MC1, and MC2 and MC3 have the same layout, respectively.

In other words, the memory cell array CA shown in FIG. 2 includes the memory cells MC1, MC2, MC3 and MC4 as the memory cells MC of the memory cell array CA, and one memory cell MC has the reverse layout to the adjacent memory cell MC about the x axis or the y axis. Thus, the memory cell array CA has a uniform layout structure with substantially one type of memory cells MC.

As shown in FIG. 6, the memory cell MC2 includes four gate electrodes G1b to G4b, diffusion regions D1b to D10b, eight diffusion region contacts DC1b to DC8b, two gate contacts GC1b and GC2b, and two shared contacts SC1b and SC2b. The gate electrodes G1b to G4b are arranged line-symmetrically to the gate electrodes G1a to G4a of the memory cell MC1, respectively. The diffusion regions D1b to D10b are arranged line-symmetrically to the diffusion regions D1a to D10a of the memory cell MC1, respectively. The diffusion region contacts DC1b to DC8b are arranged line-symmetrically to the diffusion region contacts DC1a to DC8a of the memory cell MC1, respectively. The gate contacts GC1b and GC2b are arranged line-symmetrically to the gate contacts GC1a and GC2a of the memory cell MC1, respectively. The shared contacts SC1b and SC2b are arranged line-symmetrically to the shared contacts SC1a and SC2a of the memory cell MC1, respectively.

Figure 7A:
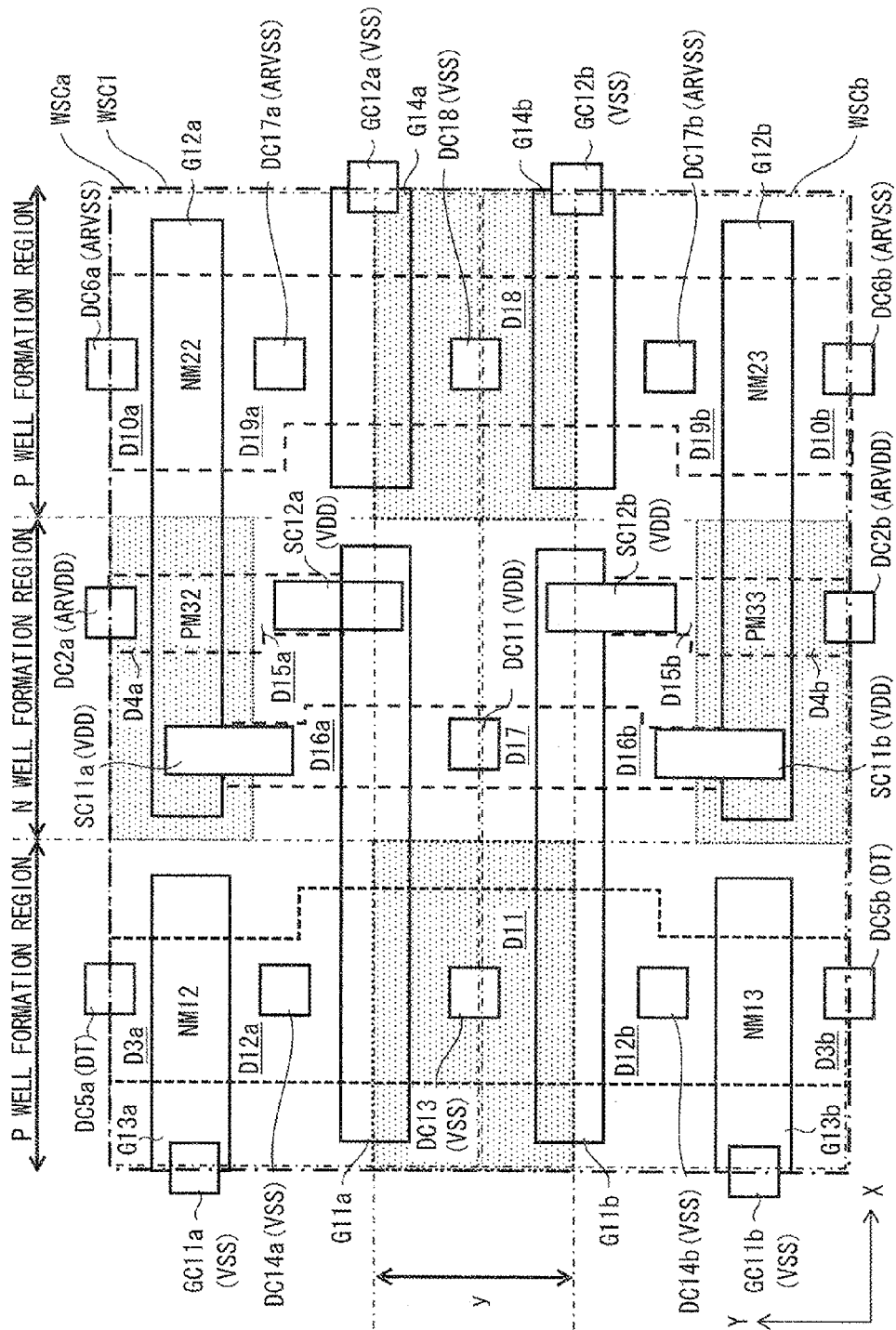
FIG. 7A is a layout diagram of a well voltage supply cell WSC1 in SRAM according to the first embodiment.
Figure 7B:
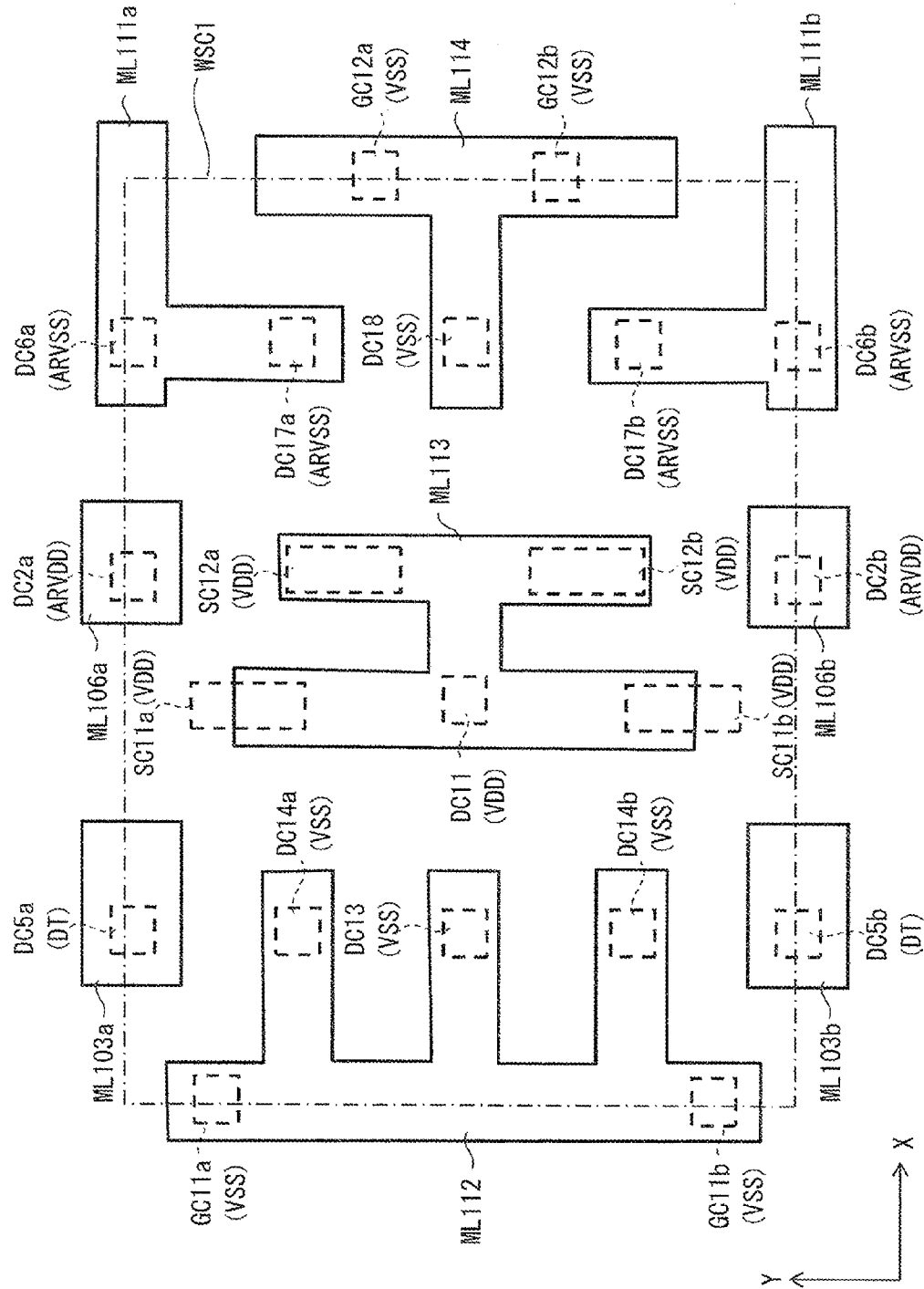
FIG. 7B is a layout diagram of a first layer line in the well voltage supply cell WSC1.
Figure 7C:
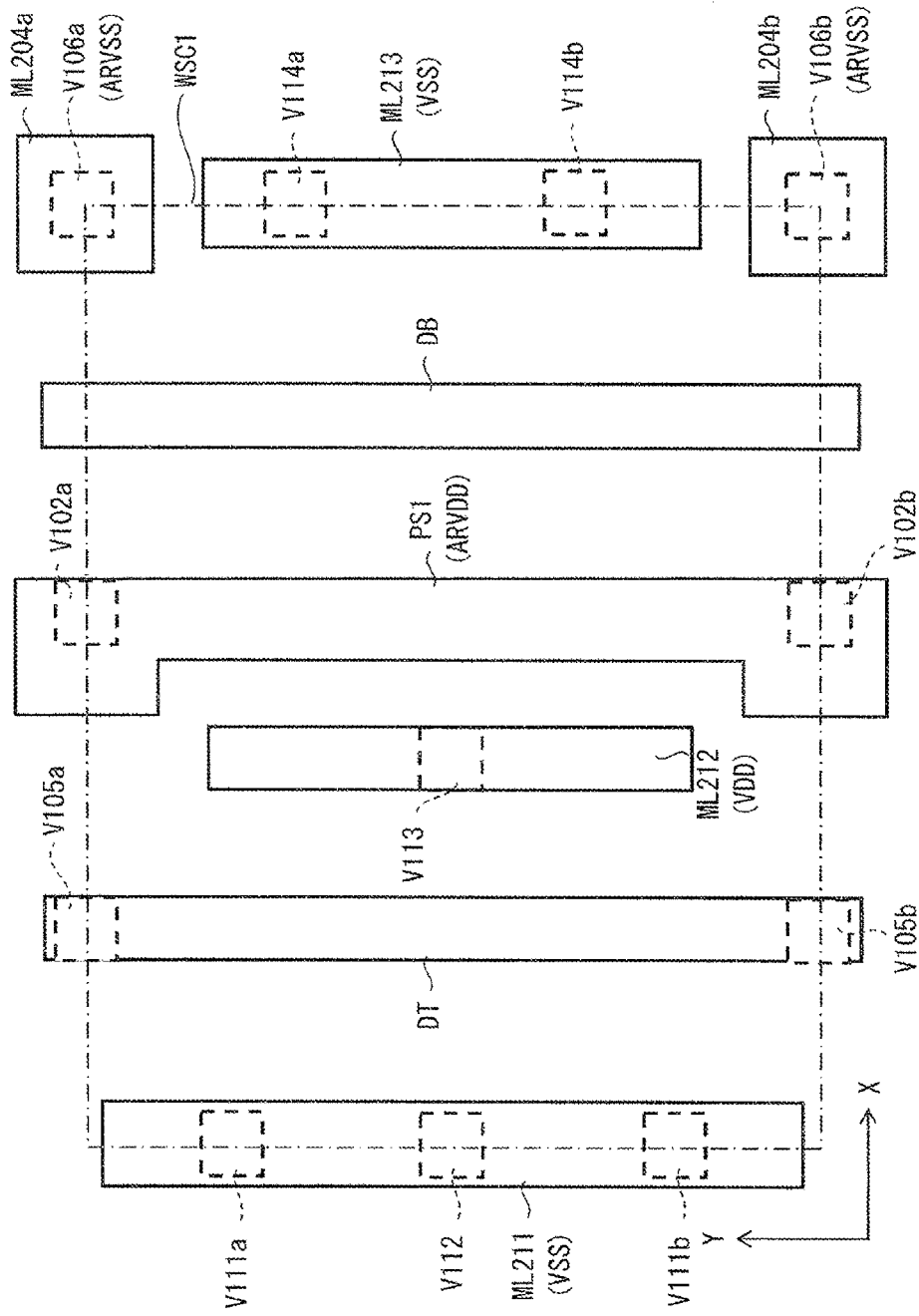
FIG. 7C is a layout diagram of a second layer line in the well voltage supply cell WSC1.
Figure 7D:
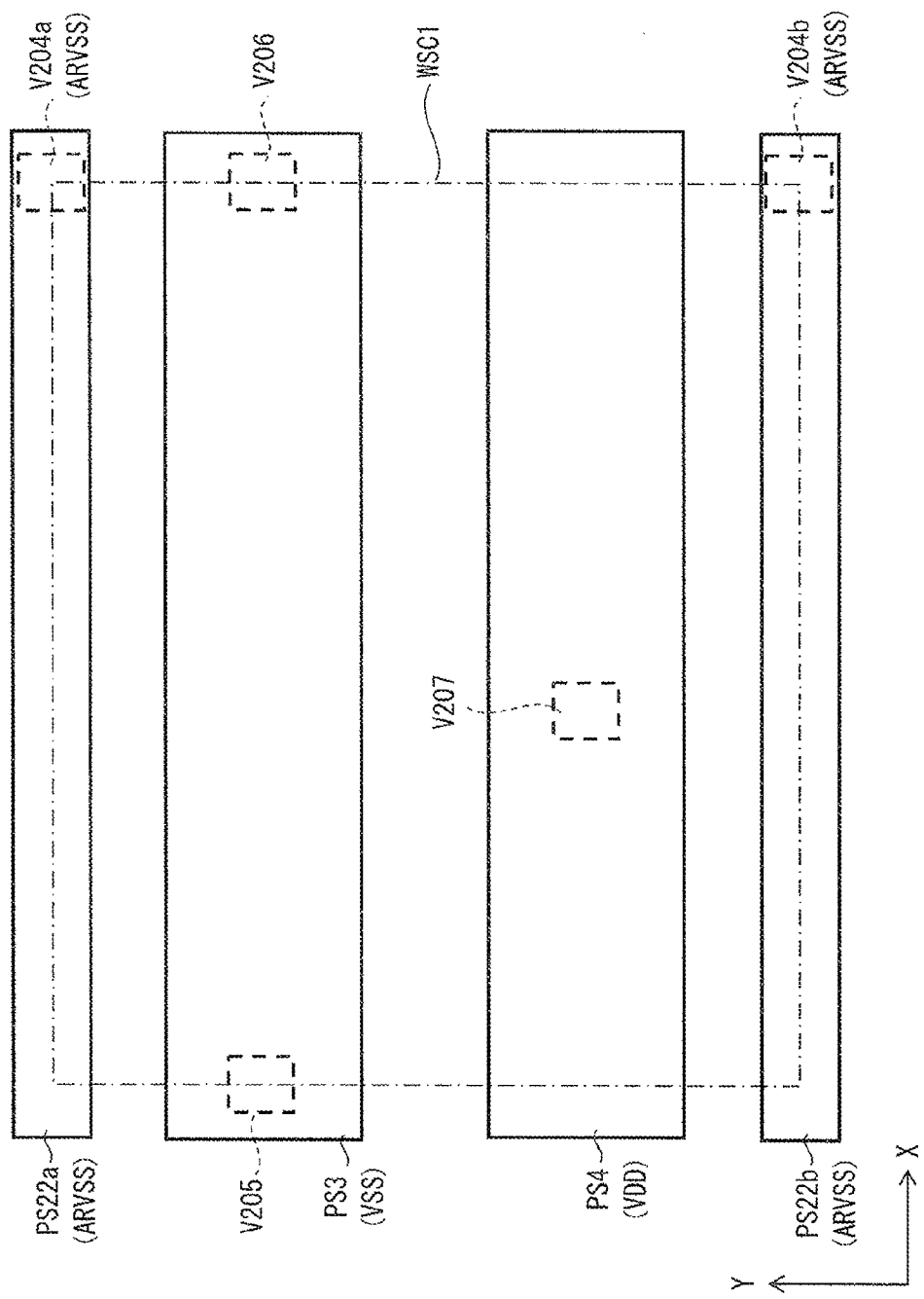
FIG. 7D is a layout diagram of a third layer line in the well voltage supply cell WSC1.

The layout of a well voltage supply cell of the SRAM according to the first embodiment is described hereinafter with reference to FIGS. 7A to 7D. FIG. 7A is a layout diagram of a well voltage supply cell WSC1 in the SRAM according to the first embodiment. FIG. 7B is a layout diagram of the first layer line in the well voltage supply cell WSC1. FIG. 7C is a layout diagram of the second layer line in the well voltage supply cell WSC1. FIG. 7D is a layout diagram of the third layer line in the well voltage supply cell WSC1.

As shown in FIG. 7A, the well voltage supply cell WSC1 includes eight gate electrodes G11a to G14a and G11b to G14b, seventeen diffusion regions D1a, D3b, D4a, D4b, D10a, D10b, D11, D12a, D12b, D15a, D15b, D16a, D16b, D17, D18, D19a and D19b, thirteen diffusion region contacts DC2a, DC2b, DC5a, DC5b, DC6a, DC6b, DC11, DC13, DC14a, DC14b, DC17a, DC17b and DC18, four gate contacts GC11a, GC11b, GC12a and GC12b, and four shared contacts SC11a, SC11b, SC12a and SC12b.

The well voltage supply cell WSC1 is composed of a well voltage supply cell WSCa and a well voltage supply cell WSCb. As shown in FIG. 7A, the well voltage supply cell WSCa and the well voltage supply cell WSCb are adjacent to each other and line-symmetric to each other with respect to their border line as an axis. In other words, the well voltage supply cell WSCb is line-symmetric to the well voltage supply cell WSCa about the x-axis.

In FIG. 7A, as in FIG. 3A, the well voltage supply cells WSCa and WSCb are formed in a unit enclosed by alternate long and short dashed lines. A combination of the well voltage supply cells WSCa and WSCb is one well voltage supply cell WSC1. The part outside the alternate long and short dashed lines belongs to adjacent cells. The part indicated by the alternate long and short dashed lines is the cell border of the well voltage supply cells WSCa and WSCb.

Further, like the memory cell MC1, a well voltage supply cell WSC2 having a layout structure where the well voltage supply cell WSC1 is reversed with respect to the y-axis is provided. The well voltage supply cell WSC2 includes a well voltage supply cell WSCc having a layout structure where the well voltage supply cell WSCa is reversed with respect to the y-axis and a well voltage supply cell WSCd having a layout structure where the well voltage supply cell WSCb is reversed with respect to the y-axis (WSC2, WSCc and WSCd are shown in FIG. 9A).

In the well voltage supply cell WSC shown in FIG. 2, the well voltage supply cells WSC1 and WSC2 having such a structure are arranged. The well voltage supply cells WSC1 and WSC2 are arranged alternately as the well voltage supply cells WSC.

The memory cell MC1 shown in FIG. 3A is placed above the well voltage supply cell WSC1. Thus, the diffusion regions D1a, D4a and D10a and the diffusion region contacts DC2a, DC5a and DC6a are shared with the memory cell MC1 shown in FIG. 3A.

The diffusion region contacts DC2a, DC5a and DC6a belong half and half to the memory cell MC1 and the well voltage supply cell WSC1, and since the memory cell MC1 and the well voltage supply cell WSC1 are arranged adjacent to each other, each of the diffusion region contacts DC2a, DC5a and DC6a serves as one diffusion region contact. Note that, in the upper line layers shown in FIGS. 7B to 7D also, a line placed on the cell border indicated by the alternate long and short dashed lines belongs half and half to the memory cell MC1 and the well voltage supply cell WSC1, and each serves as one line since the memory cell MC1 and the well voltage supply cell WSC1 are arranged adjacent to each other.

Further, the upper region of the well voltage supply cell WSC1 has a layout that is line-symmetric to the memory cell MC1 shown in FIG. 3A with respect to the upper border line of the well voltage supply cell WSC1 as the axis of symmetry. Specifically, the gate electrodes G11a to G14a are arranged line-symmetrically to the gate electrodes G1a to G4a of the memory cell MC1, respectively. The diffusion regions D12a, D15a, D16a and D19a are arranged line-symmetrically to the diffusion regions D2a, D5a, D6a and D9a of the memory cell MC1, respectively. The diffusion region contacts DC14a and DC17a are arranged line-symmetrically to the diffusion region contacts DC4a and DC7a of the memory cell MC1, respectively. The gate contacts GC11a and GC12a are arranged line-symmetrically to the gate contacts GC1a and GC2a of the memory cell MC1, respectively. The shared contacts SC11a and SC12a are arranged line-symmetrically to the shared contacts SC1a and SC2a of the memory cell MC1, respectively.

In other words, the well voltage supply cell WSCa and the memory cell MC1 have layouts that are line-symmetric with respect to the border line as the axis of symmetry.

On the other hand, the memory cell MC2 shown in FIG. 6 is placed below the well voltage supply cell WSC1. Thus, the diffusion regions D3b, D4b and D10b and the diffusion region contacts DC2b, DC5b and DC6b are shared with the memory cell MC2 shown in FIG. 6.

The diffusion region contacts DC2b, DC5b and DC6b belong half and half to the memory cell MC2 and the well voltage supply cell WSC1, and since the memory cell MC2 and the well voltage supply cell WSC1 are arranged adjacent to each other, each of the diffusion region contacts DC2b, DC5b and DC6b serves as one diffusion region contact.

Further, the lower region of the well voltage supply cell WSC1 has a layout that is line-symmetric to the memory cell MC2 shown in FIG. 6 with respect to the lower border line of the well voltage supply cell WSC1 as the axis of symmetry. Specifically, the gate electrodes G11b to G14b are arranged line-symmetrically to the gate electrodes G1b to G4b of the memory cell MC2, respectively. The diffusion regions D12b, D15b, D16b and D19b are arranged line-symmetrically to the diffusion regions D2b, D5b, D6b and D9b of the memory cell MC2, respectively. The diffusion region contacts DC14b and DC17b are arranged line-symmetrically to the diffusion region contacts DC4b and DC7b of the memory cell MC2, respectively. The gate contacts GC11b and GC12b are arranged line-symmetrically to the gate contacts GCib and GC2b of the memory cell MC2, respectively. The shared contacts SC11b and SC12b are arranged line-symmetrically to the shared contacts SCib and SC2b of the memory cell MC2, respectively.

In other words, the well voltage supply cell WSCb and the memory cell MC2 have layouts that are line-symmetric with respect to the border line as the axis of symmetry.

In this manner, the well voltage supply cell WSC1 has the same regularity as the memory cells located above and below it for the layout of the diffusion regions (i.e. the isolation layer STI), the gate electrodes and the contacts. It is thereby possible to suppress fluctuations in characteristics and shape of transistors in the memory cells adjacent to the well voltage supply cell WSC1 and enhance reliability. Note that, ideally, it is preferred that the diffusion region contacts DC11, DC13 and DC18 in the well voltage supply cell WSC1 are also arranged line-symmetrically to the diffusion region contacts DC1a, DC3a and DC8a of the memory cell MC1, respectively. Further, it is preferred that the diffusion region contacts DC11, DC13 and DC18 in the well voltage supply cell WSC1 are arranged line-symmetrically to the diffusion region contacts DC1b, DC3b and DC8b of the memory cell MC2. However, the distance y between the gate electrodes G11a and G11b indicated by the arrow in FIG. 7A may be determined arbitrarily. For example, when the distance y is larger, the size of the well voltage supply cell WSC1 increases but the formation of well contacts becomes easier.

In the memory cells MC1 and MC2, $N^+$ ions are implanted into a P well formation region to form an N-type diffusion region, and $P^+$ ions are implanted into an N well formation region to form a P-type diffusion region.

On the other hand, in the well voltage supply cell WSC1, a P-type diffusion region for supplying the first low-voltage power supply VSS to a P well is formed at the center of the P well formation region in the y direction. Further, an N-type diffusion region for supplying the first high-voltage power supply VDD to an N well is formed at the center of the N well formation region in the y direction.

In the case of FIG. 7A, in the P well formation region, $P^+$ ions are implanted into the region from the center line of the gate electrode G11a to the center line of the gate electrode G11b. Further, $P^+$ ions are implanted into the region from the center line of the gate electrode G14a to the center line of the gate electrode G14b. In the N well formation region, $N^+$ ions are implanted into the region from the position between the gate electrode G12a and the gate electrode G11a to the position between the gate electrode G12b and the gate electrode G11b. Note that, in FIG. 7A, the hatched area is the $P^+$ ion implanted region, and the other area is the $N^+$ ion implanted region. The same applies to FIGS. 3A, 6 and the like.

Figure 8:
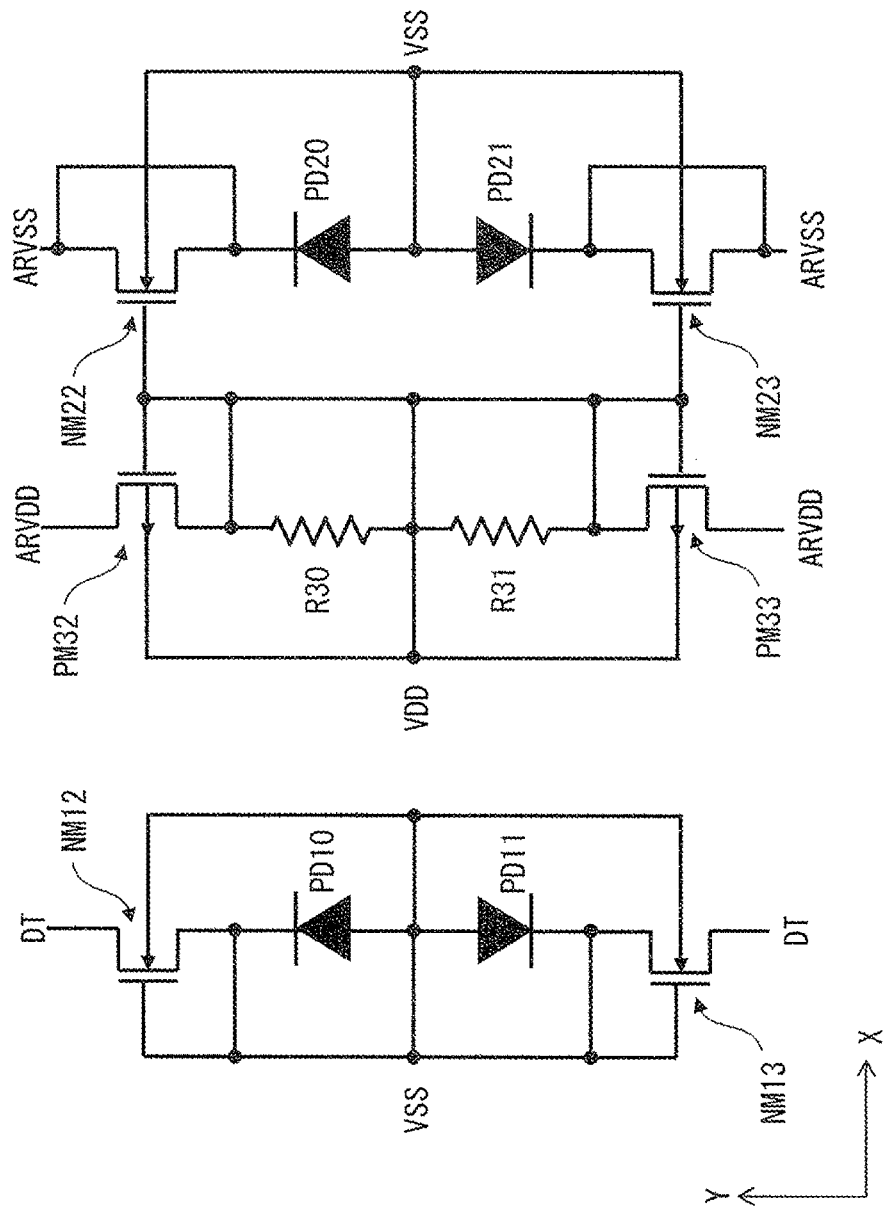
FIG. 8 is a circuit diagram of the well voltage supply cell WSC1 corresponding to FIG. 7A.

FIG. 8 is a circuit diagram of the well voltage supply cell WSC1 corresponding to FIG. 7A. As shown in FIG. 8, the well voltage supply cell WSC1 includes NMOS transistors NM12, NM13, NM22 and NM23, PMOS transistor PM32 and PM33, parasitic diodes PD10, PD11, PD20 and PD21, and parasitic resistors R30 and R31.

The NMOS transistor NM12 is a dummy transistor composed of the gate electrode G13a. One of the source and drain of the NMOS transistor NM12 is connected to the bit line DT, and the other one is connected to the first low-voltage power supply VSS. Further, the gate and the well (backgate) of the NMOS transistor NM12 is also connected to the first low-voltage power supply VSS. Therefore, the NMOS transistor NM12 is always off and thereby prevented to operate.

Likewise, the NMOS transistor NM13 is a dummy transistor composed of the gate electrode G13b. One of the source and drain of the NMOS transistor NM13 is connected to the bit line DT, and the other one is connected to the first low-voltage power supply VSS. Further, the gate and the well (backgate) of the NMOS transistor NM13 is also connected to the first low-voltage power supply VSS. Therefore, the NMOS transistor NM13 is always off and thereby prevented to operate.

The parasitic diode PD10 is composed of a $P^+$ diffusion region, a P well and an $N^+$ diffusion region that are formed under a dummy gate electrode G11a made of polysilicon into which both of $P^+$ ions and $N^+$ ions are implanted. The cathode is connected to the other one of the source and drain of the NMOS transistor NM12. The anode is connected to the anode of the parasitic diode PD11. The cathode and anode of the parasitic diode PD10 are both connected to the first low-voltage power supply VSS.

Likewise, the parasitic diode PD11 is composed of a $P^+$ diffusion region, a P well and an $N^+$ diffusion region that are formed under a dummy gate electrode G11b made of polysilicon into which both of $P^+$ ions and $N^+$ ions are implanted. The cathode is connected to the other one of the source and drain of the NMOS transistor NM13. The cathode and anode of the parasitic diode PD11 are both connected to the first low-voltage power supply VSS.

The PMOS transistor PM32 is a dummy transistor composed of the gate electrode G12a. One of the source and drain of the PMOS transistor PM32 is connected to the second high-voltage power supply ARVDD, and the other one is connected to the first high-voltage power supply VDD. Further, the gate and the well (backgate) of the PMOS transistor PM32 is also connected to the first high-voltage power supply VDD. Therefore, the PMOS transistor PM32 is always off and thereby prevented to operate.

Likewise, the PMOS transistor PM33 is a dummy transistor composed of the gate electrode G12b. One of the source and drain of the PMOS transistor PM33 is connected to the second high-voltage power supply ARVDD, and the other one is connected to the first high-voltage power supply VDD. Further, the gate and the well (backgate) of the PMOS transistor PM33 is also connected to the first high-voltage power supply VDD. Therefore, the PMOS transistor PM33 is always off and thereby prevented to operate.

The parasitic resistor R30 is composed of an $N^+$ diffusion region, an N well and an $N^+$ diffusion region that are formed under the gate electrode G11a. One end of the parasitic resistor R30 is connected to the other one of the source and drain of the PMOS transistor PM32. The other end of the parasitic resistor R30 is connected to one end of the parasitic resistor R31. Further, both ends of the parasitic resistor R30 are connected to the first high-voltage power supply VDD.

The parasitic resistor R31 is composed of an $N^+$ diffusion region, an N well and an $N^+$ diffusion region that are formed under the gate electrode G11b. The other end of the parasitic resistor R31 is connected to the other one of the source and drain of the PMOS transistor PM33. Further, both ends of the parasitic resistor R31 are connected to the first high-voltage power supply VDD.

The NMOS transistor NM22 is a dummy transistor composed of the gate electrode G12a. Both of the source and drain of the NMOS transistor NM22 are connected to the second low-voltage power supply ARVSS. Further, the gate of the NMOS transistor NM22 is connected to the first high-voltage power supply VDD, and the well (backgate) is connected to the first low-voltage power supply VSS. Therefore, the NMOS transistor NM22 is always on and thereby prevented to operate.

Likewise, the NMOS transistor NM23 is a dummy transistor composed of the gate electrode G12b. Both of the source and drain of the NMOS transistor NM23 are connected to the second low-voltage power supply ARVSS. Further, the gate of the NMOS transistor NM23 is connected to the first high-voltage power supply VDD, and the well (backgate) is connected to the first low-voltage power supply VSS. Therefore, the NMOS transistor NM23 is always on and thereby prevented to operate.

The parasitic diode PD20 is composed of a P+ diffusion region, a P well and an N+ diffusion region that are formed under a dummy gate electrode G12a made of polysilicon into which both of P+ ions and N+ ions are implanted. The cathode is connected to the source and drain of the NMOS transistor NM22. The anode is connected to the anode of the parasitic diode PD21. Further, the anode of the parasitic diode PD20 is connected to the first low-voltage power supply VSS.

Likewise, the parasitic diode PD21 is composed of a P+ diffusion region, a P well and an N+ diffusion region that are formed under a dummy gate electrode G12b made of polysilicon into which both of P+ ions and N+ ions are implanted. The cathode is connected to the source and drain of the NMOS transistor NM23. The anode is connected to the first low-voltage power supply VSS. Because the second low-voltage power supply ARVSS is a higher voltage than the first low-voltage power supply VSS, the parasitic diodes PD20 and PD21 are reverse-biased diodes, and the second low-voltage power supply ARVSS and the first low-voltage power supply VSS are separated from each other.

FIG. 7B is a layout diagram of a first layer line in the well voltage supply cell WSC1 according to the first embodiment. In FIG. 7B, the contacts shown in FIG. 7A are also shown by dotted lines.

As shown in FIGS. 7A and 7B, the gate electrode G13a of the NMOS transistor NM12 is connected to a first layer line ML112, which is a relay line for connection to the first low-voltage power supply VSS, through the gate contact GC11a. Likewise, the gate electrode G13b of the NMOS transistor NM13 is connected to a first layer line ML112, which is a relay line for connection to the first low-voltage power supply VSS, through the gate contact GC11b. The gate contacts GC11a and GC11b are formed on the border line of the well voltage supply cell WSC1 in the y direction.

The N-type diffusion region D1a constituting the NMOS transistor NM12 is connected to a first layer line ML103a, which is a relay line for connection to the bit line DT, through the diffusion region contact DC5a. Likewise, the N-type diffusion region D3b constituting the NMOS transistor NM13 is connected to a first layer line ML103b, which is a relay line for connection to the bit line DT, through the diffusion region contact DC5b.

The N-type diffusion region D12a constituting the NMOS transistor NM12 is connected to a first layer line ML112, which is a relay line for connection to the first low-voltage power supply VSS, through the diffusion region contact DC14a. Likewise, the N-type diffusion region D12b constituting the NMOS transistor NM13 is connected to a first layer line ML112, which is a relay line for connection to the first low-voltage power supply VSS, through the diffusion region contact DC14b.

The P-type diffusion region D11 for supplying the first low-voltage power supply VSS to the P well is connected to the first layer line ML112, which is a relay line for connection to the first low-voltage power supply VSS, through the diffusion region contact DC11.

The N-type diffusion region D10a constituting the NMOS transistor NM22 is connected to a first layer line ML111a, which is a relay line for connection to the second low-voltage power supply ARVSS, through the diffusion region contact DC6a. Likewise, the N-type diffusion region D10b constituting the NMOS transistor NM23 is connected to a first layer line ML111b, which is a relay line for connection to the second low-voltage power supply ARVSS, through the diffusion region contact DC6b.

The N-type diffusion region D19a constituting the NMOS transistor NM22 is connected to a first layer line ML111a, which is a relay line for connection to the second low-voltage power supply ARVSS, through the diffusion region contact DC17a. Likewise, the N-type diffusion region D19b constituting the NMOS transistor NM23 is connected to a first layer line ML111b, which is a relay line for connection to the second low-voltage power supply ARVSS, through the diffusion region contact DC17b.

The gate electrode G14a is connected to a first layer line ML114, which is a relay line for connection to the first low-voltage power supply VSS, through the gate contact GC12a. Likewise, the gate electrode G14b is connected to a first layer line ML114, which is a relay line for connection to the first low-voltage power supply VSS, through the gate contact GC12b. The gate contacts GC12a and GC12b are formed on the border line of the well voltage supply cell WSC1 in the y direction.

The P-type diffusion region D18 for supplying the first low-voltage power supply VSS to the P well is connected to the first layer line ML114, which is a relay line for connection to the first low-voltage power supply VSS, through the diffusion region contact DC18.

The P-type diffusion region D4a constituting the PMOS transistor PM32 is connected to a first layer line ML106a, which is a relay line for connection to the second high-voltage power supply ARVDD, through the diffusion region contact DC2a. Likewise, the P-type diffusion region D4b constituting the PMOS transistor PM33 is connected to a first layer line ML106b, which is a relay line for connection to the second high-voltage power supply ARVDD, through the diffusion region contact DC2b.

The gate electrode G12a that is shared by the PMOS transistor PM32 and the NMOS transistor NM22 is connected to the diffusion region D16a through the shared contact SC11a. The shared contact SC11a is connected to a first layer line ML113, which is a relay line for connection to the first high-voltage power supply VDD. Likewise, the gate electrode G12b that is shared by the PMOS transistor PM33 and the NMOS transistor NM23 is connected to the diffusion region D16b through the shared contact SC11b. The shared contact SC11b is connected to the first layer line ML113, which is a relay line for connection to the first high-voltage power supply VDD.

The gate electrode G11a is connected to the diffusion region D15a through the shared contact SC12a. The shared contact SC12a is connected to the first layer line ML113, which is a relay line for connection to the first high-voltage power supply VDD. Likewise, the gate electrode G11b is connected to the diffusion region D15b through the shared contact SC12b. The shared contact SC12b is connected to the first layer line ML113, which is a relay line for connection to the first high-voltage power supply VDD.

The N-type diffusion region D17 for supplying the first high-voltage power supply VDD to the N well is connected to the first layer line ML113, which is a relay line for connection to the first high-voltage power supply VDD, through the diffusion region contact DC11.

The plane layout of the first layer line is described hereinafter with reference to FIG. 7B.

The first layer line ML103a that is connected to the bit line DT lies along the border line in the x direction where the diffusion region contact DC5a is formed, from the formation position of the diffusion region contact DC5a, slightly extending toward the center of the well voltage supply cell WSC1. Likewise, the first layer line ML103b that is connected to the bit line DT lies along the border line in the x direction where the diffusion region contact DC5b is formed, from the formation position of the diffusion region contact DC5b, slightly extending toward the center of the well voltage supply cell WSC1. The first layer line ML103a and the first layer line ML103b are arranged opposite to each other on the opposite border lines.

The first layer line ML106a connected to the second high-voltage power supply ARVDD is formed on the diffusion region contact DC2a so that it is slightly larger than the diffusion region contact DC2a. Likewise, the first layer line ML106b connected to the second high-voltage power supply ARVDD is formed on the diffusion region contact DC2b so that it is slightly larger than the diffusion region contact DC2b. The first layer line ML106a and the first layer line ML106b are arranged opposite to each other on the opposite border lines in the x direction.

The first layer line ML111a for connection to the second low-voltage power supply ARVSS has a first linear part that lies along the border line in the x direction where the diffusion region contact DC6a is formed, from the formation position of the diffusion region contact DC6a to the corner of the adjacent well voltage supply cell WSC1. It further has a second linear part that lies in the y direction from the diffusion region contact DC6a to the diffusion region contact DC17a. Thus, the first layer line ML111a is substantially L-shaped. Likewise, the first layer line ML111b for connection to the second low-voltage power supply ARVSS has a first linear part that lies along the border line in the x direction where the diffusion region contact DC6b is formed, from the formation position of the diffusion region contact DC6b to the corner of the adjacent well voltage supply cell WSC1. It further has a second linear part that lies in the y direction from the diffusion region contact DC6b to the diffusion region contact DC17b. Thus, the first layer line ML111b is substantially L-shaped. Note that the first layer line ML111a and the first layer line ML111b are arranged opposite to each other on the opposite border lines in the x direction.

The first layer line ML112 for connection to the first low-voltage power supply VSS has a first linear part that lies along the border line in the y direction from the gate contact GC11a to the gate contact GC11b. It further has three second linear parts that lie along the x direction from the first linear part to the three diffusion region contacts DC13, DC14a and DC14B. Thus, the first layer line ML112 is comb-shaped.

The first layer line ML113 for connection to the first high-voltage power supply VDD has a first linear part that lies in the y direction from the shared contact SC11a to the shared contact SC11b through the diffusion region contact DC11. It further has a second linear part that lies in the y direction from the shared contact SC12a to the shared contact SC12b. It further has a third linear part that lies in the x direction from the center of the first linear part to the center of the second linear part. Thus, the first layer line ML113 is substantially H-shaped.

The first layer line ML114 for connection to the first low-voltage power supply VSS has a first linear part that lies on the border line in the y direction from the gate contact GC12a to the gate contact GC12b. It further has a second linear part that lies in the x direction from the first linear part to the diffusion region contact DC18. Thus, the first layer line ML114 is substantially T-shaped.

The plane layout of the second layer line is described hereinafter with reference to FIG. 7C. In FIG. 7C, twelve first vias V102a, V102b, V105a, V105b, V106a, V106b, V111a, V111b, V112, V113, V114a and V114b that are made between the first layer line and the second layer line are also shown by dotted lines.

The second layer line ML204a is formed above the first via V106a that is connected to the second low-voltage power supply ARVSS so that it is slightly larger than the first via V106a. The first via V106a is located at the corner of the well voltage supply cell WSC1 on the first layer line ML111a. Likewise, the second layer line ML204b is formed above the first via V106b that is connected to the second low-voltage power supply ARVSS so that it is slightly larger than the first via V106b. The first via V106b is located at the corner of the well voltage supply cell WSC1 on the first layer line ML111b. Thus, the second layer line ML204a and the second layer line ML204b are provided at both ends in the y direction.

The second layer line ML211 for connection to the first low-voltage power supply VSS lies along the border line in the y direction from the first via V111a to the first via V111b across the first via V112. The first vias V111a, V111b and V112 are made at equal intervals on the border line in the y direction in the first layer line ML112.

The second layer line ML212 for connection to the first high-voltage power supply VDD lies in the y direction so that it runs across the first via V113. The first via V113 is located on the first layer line ML113.

The second layer line ML213 for connection to the first low-voltage power supply VSS lies along the border line in the y direction from the first via V114a to the first via V114b. The first vias V114a and V114b are located on the border line in the y direction in the first layer line ML114.

The bit line DT formed in the second line layer lies in the y direction so that it runs across the first vias V105a and V105b. The first vias V105a and V105b are located on the first layer lines ML103a and ML103b, respectively, on different border lines in the x direction.

Note that, as in the memory cell MC1, the bit line DB formed in the second line layer is arranged in parallel to the bit line DT. The first via connected to the bit line DB is not made in the well voltage supply cell WSC1.

The power supply line PS1 formed in the second line layer lies in the y direction so that it runs across the first vias V102a and V102b. The first vias V102a and V102b are located on the first layer lines ML106a and ML106b, respectively, on different border lines in the x direction. The power supply line PS1 is connected to the second high-voltage power supply ARVDD.

The plane layout of the third layer line is described hereinafter with reference to FIG. 7D. In FIG. 7D, five second vias V204a, V204b and V205 to V207 that are made between the second layer line and the third layer line are also shown by dotted lines.

The power supply line PS22a formed in the third line layer line lies along the border line in the x direction so that it runs across the second via V204a. The second via V204a is located at the corner of the well voltage supply cell WSC1 on the second layer line ML204a.

Further, the power supply line PS22b formed in the third line layer line for connection to the second low-voltage power supply ARVSS lies along the border line in the x direction so that it runs across the second via V204b. The second via V204b is located at the corner of the well voltage supply cell WSC1 on the second layer line ML204b. As a matter of course, the power supply lines PS22a and PS22b are located on different border lines. The power supply lines PS22a and PS22b are to be connected to the second low-voltage power supply ARVSS.

The power supply line PS3 formed in the third line layer lies in the x direction so that it runs across the second vias V205 and V206. The second via V205 is located on the second layer line ML211 that is formed on the border line in the y direction. The second via V206 is located on the second layer line ML213 that is formed on the border line in the y direction. The power supply line PS3 is to be connected to the first low-voltage power supply VSS.

The power supply line PS4 formed in the third line layer lies in the x direction so that it runs across the second via V207. The second via V207 is located on the second layer line ML212. The power supply line PS4 is to be connected to the first high-voltage power supply VDD.

Note that, although the memory cells MC1 to MC4 and the well voltage supply cells WSCa to WSCd described above have the layout components (gates, lines and contacts) only within a cell border (indicated by alternate long and short dashed lines), they may have the layout components across a cell border.

In the case where the memory cells MC1 to MC4, the well voltage supply cells WSCa to WSCd and the like are arranged with their cell borders in contact with each other so that the parts of the layout components protruding from the cell border exactly overlap each other, there is substantially no problem.

FIG. 9A is a diagram showing a layout example of memory cells and well voltage supply cells in the area A1 in FIG. 2. The reference symbols are omitted.

As shown in FIG. 9A, the memory cell MC1 is placed above the well voltage supply cell WSC1, and the memory cell MC2 shown in FIG. 6 is placed below the well voltage supply cell WSC1 shown in FIG. 7A. The memory cell MC2 is placed further above the memory cell MC1, and the memory cell MC1 is placed further below the memory cell MC2.

The well voltage supply cell WSC2 that is placed adjacent on the right to the well voltage supply cell WSC1 has a layout that is line-symmetric to the well voltage supply cell WSC1 with respect to their border line. Likewise, the memory cell MC3 that is placed adjacent on the right to the memory cell MC1 has a layout that is line-symmetric to the memory cell MC1 with respect to their border line. The memory cell MC4 that is placed adjacent on the right to the memory cell MC2 has a layout that is line-symmetric to the memory cell MC2 with respect to their border line. On the upside of the memory cell MC3, the memory cell MC4 is that is placed adjacently. On the downside of the memory cell MC4, the memory cell MC3 is placed adjacently.

As described above, because the memory cell MC1 is point-symmetric about the center of MC1, MC4 and MC1, and MC2 and MC3 have the same layout, respectively. Accordingly, it is equivalent to that MC2 is placed adjacently on the upside of the well voltage supply cell WSC2, and MC1 is placed adjacently on the downside of the well voltage supply cell WSC2.

It is apparent from FIG. 9A that the layout of the well voltage supply cell WSC1 has the same regularity as the memory cell.

Figure 9B:
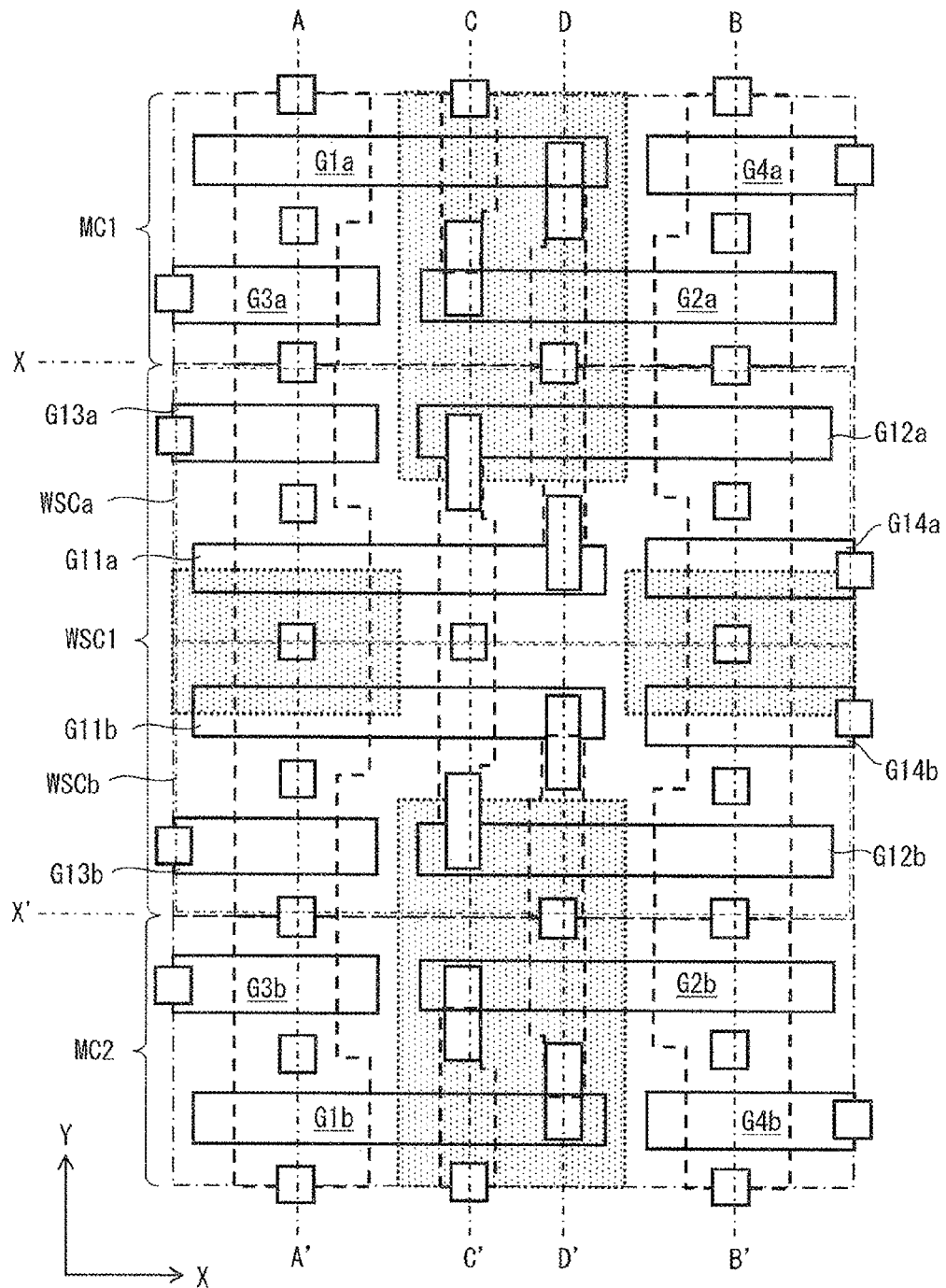
FIG. 9B is a diagram showing a state where only three cells, the memory cell MC1 shown in FIG. 3A, the well voltage supply cell WSC1 shown in FIG. 7A and the memory cell MC2 shown in FIG. 6, are arranged.

FIG. 9B is a diagram showing a state where only three cells, the memory cell MC1 shown in FIG. 3A, the well voltage supply cell WSC1 shown in FIG. 7A and the memory cell MC2 shown in FIG. 6, are arranged. The reference symbols are provided only for the gate electrodes.

The cross-sectional structures of the memory cell MC1, the well voltage supply cell WSC1 and the memory cell MC2 are described hereinafter with reference to FIGS. 10 to 13.

Figure 10:
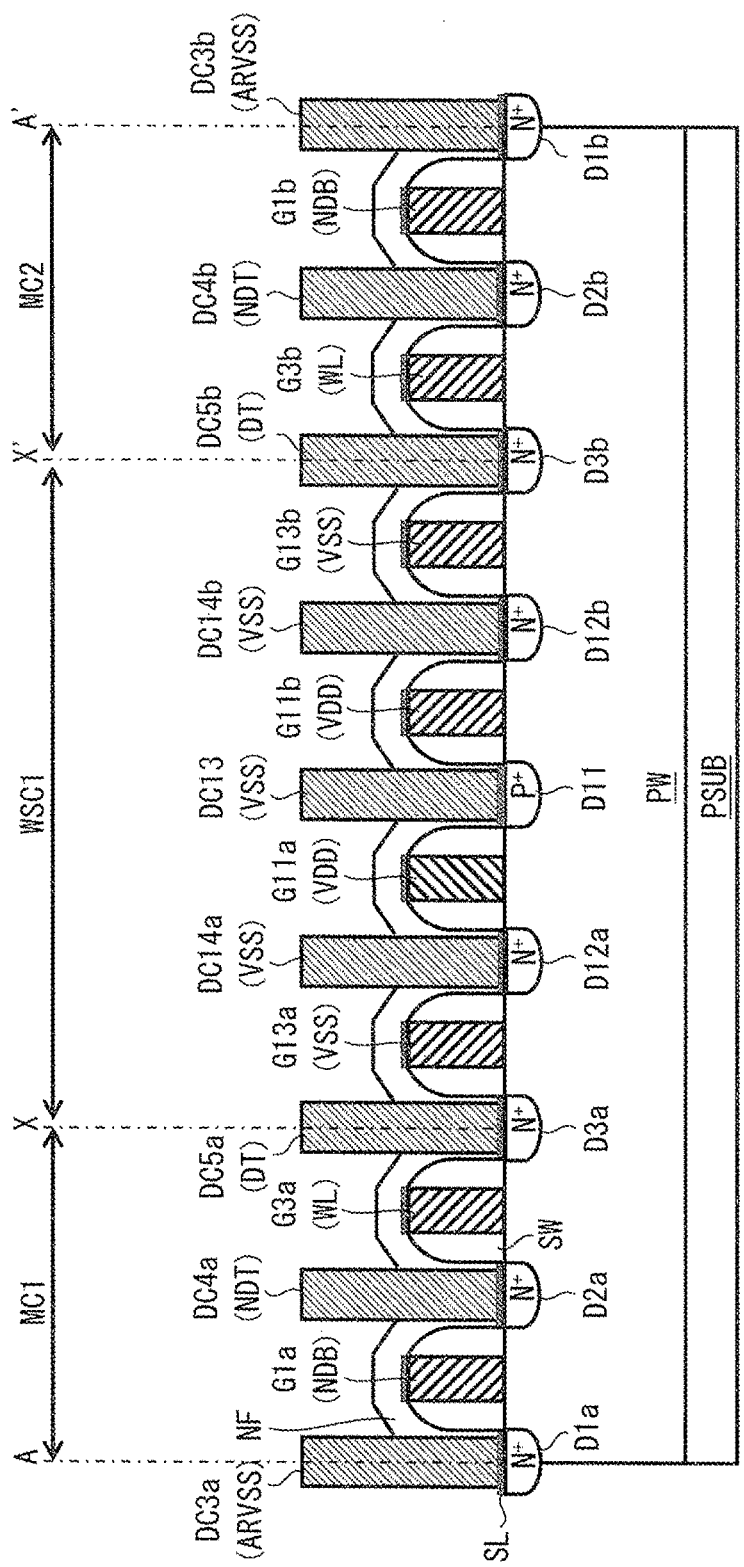
FIG. 10 is a cross-sectional view along line A-A' of FIG. 9B.
Figure 11:
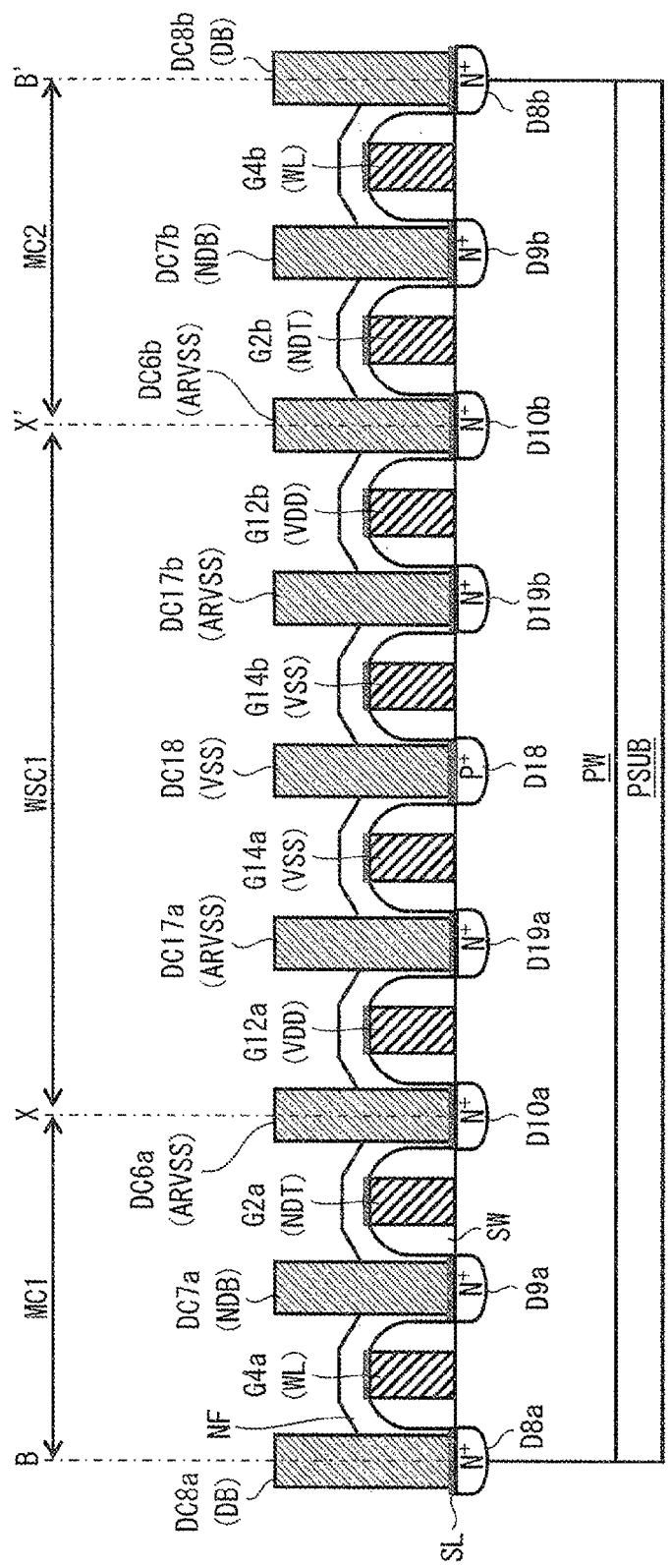
FIG. 11 is a cross-sectional view along line B-B' of FIG. 9B.
Figure 12:
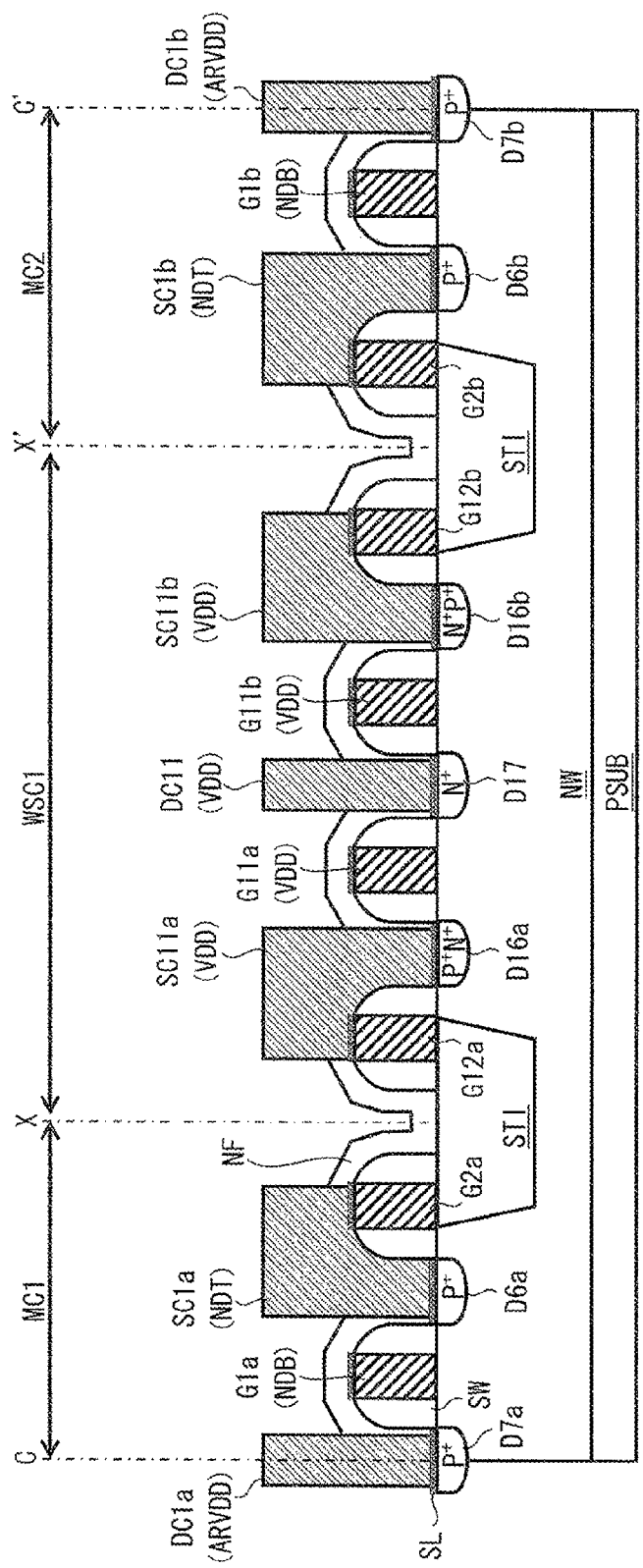
FIG. 12 is a cross-sectional view along line C-C' of FIG. 9B.
Figure 13:
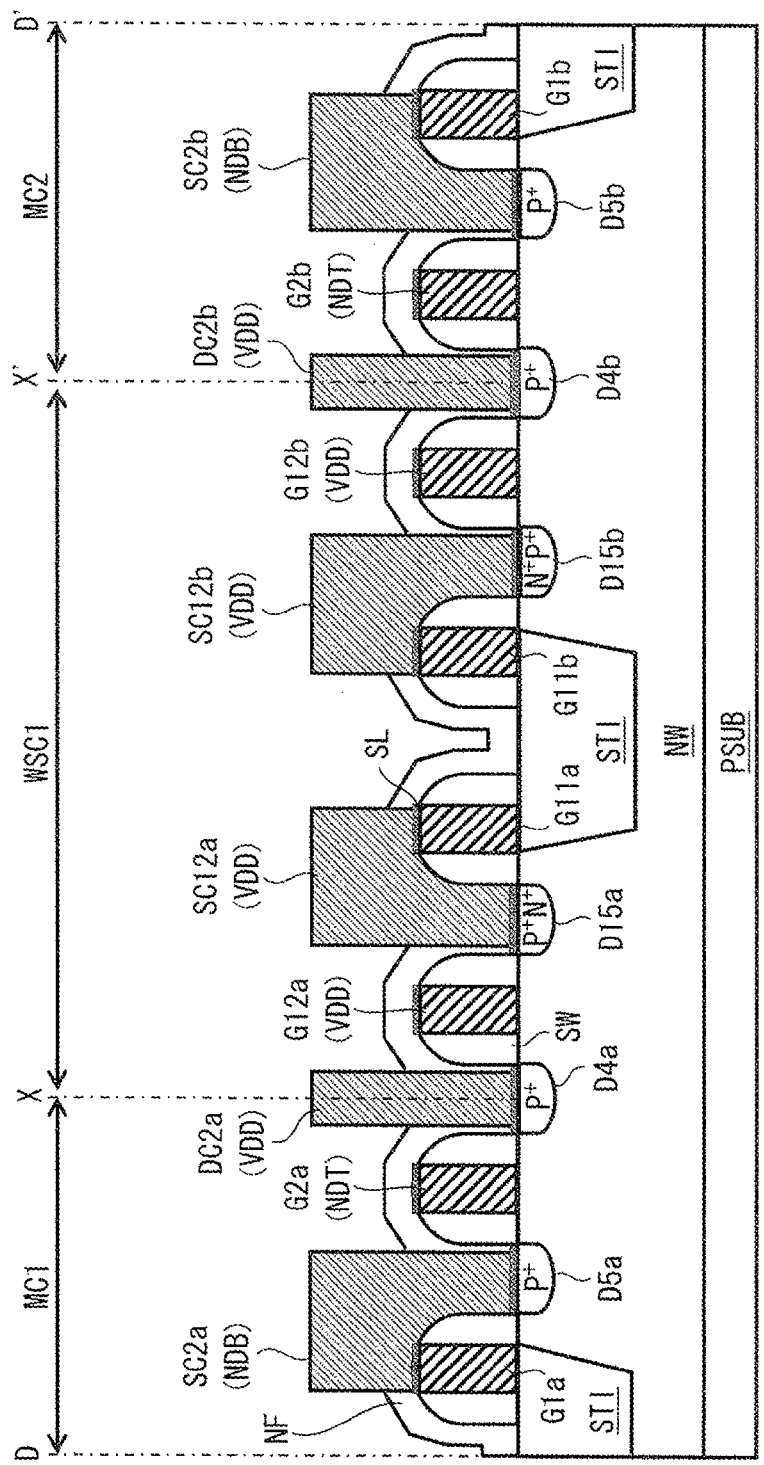
FIG. 13 is a cross-sectional view along line D-D' of FIG. 9B.

FIG. 10 is a cross-sectional view along line A-A' of FIG. 9B. FIG. 11 is a cross-sectional view along line B-B' of FIG. 9B. FIG. 12 is a cross-sectional view along line C-C' of FIG. 9B. FIG. 13 is a cross-sectional view along line D-D' of FIG. 9B. Note that the details of connections are described above, and only the cross-sectional structures are described below.

As shown in FIG. 10, in the P well formation region, a P well PW is formed on a P-type substrate PSUB. On the P well PW, the N-type diffusion regions D1$a$, D2$a$, D1$a$, D12$a$, D1$b$, D2$b$, D3$b$ and D12$b$ and the P-type diffusion region D11 are formed. On each diffusion region, a diffusion region contact is formed with a silicide layer SL interposed therebetween. For example, the diffusion region contact DC13 that is connected to the first low-voltage power supply VSS is formed above the P-type diffusion region D11 for supplying a well voltage.

The gate electrode is formed on the P well PW between the adjacent diffusion regions. For example, the gate electrode G1$a$ is formed between the diffusion regions D1$a$ and D2$a$.

A sidewall SW is formed on both sides of each gate electrode. Further, a silicide layer SL is also formed on each gate electrode. Further, a stopper nitride film NF is formed above each gate electrode.

FIG. 11 shows the P well formation region like FIG. 10 and thus has the similar cross-sectional structure. Specifically, a P well PW is formed on a P-type substrate PSUB. On the P well PW, the N-type diffusion regions D8$a$, D9$a$, D10$a$, D19$a$, D8$b$, D9$b$, D10$b$ and D19$b$ and the P-type diffusion region D18 are formed. On each diffusion region, a diffusion region contact is formed with a silicide layer SL interposed therebetween. For example, the diffusion region contact DC18 that is connected to the first low-voltage power supply VSS is formed above the P-type diffusion region D18 for supplying a well voltage.

As shown in FIG. 12, in the N well formation region, an N well NW is formed on a P-type substrate PSUB. On the N well NW, the P-type diffusion regions D6$a$, D7$a$, D6$b$ and D7$b$, the N-type diffusion region D17, and the diffusion regions D16$a$ and D16$b$ where N type and P type are mixed are formed. On each diffusion region, a diffusion region contact or a shared contact is formed with a silicide layer SL interposed therebetween. For example, the diffusion region contact DC11 that is connected to the first high-voltage power supply VDD is formed above the N-type diffusion region D17 for supplying a well voltage. Further, for example, the shared contact SC1$a$ is formed above the diffusion region D6$a$. The shared contact SC1$a$ is formed to extend above the gate electrode G2$a$. The same applies to the other shared contacts.

Further, an isolation layer STI is formed in an area other than the diffusion region. In FIG. 12, the diffusion region is not formed and the isolation layer STI is formed at the boundary between the memory cell MC1 and the well voltage supply cell WSC1 and the boundary between the memory cell MC2 and the well voltage supply cell WSC1.

FIG. 13 also shows the N well formation region, and an N well NW is formed on a P-type substrate PSUB. On the N well NW, the P-type diffusion regions D4$a$, D5$a$, D6$a$ and D7$b$, and the diffusion regions D15$a$ and D15$b$ where N type and P type are mixed are formed. In the cross-section of FIG. 13, the N-type diffusion region for supplying a well voltage is not formed. On each diffusion region, a diffusion region contact or a shared contact is formed with a silicide layer SL interposed therebetween.

In the cross-section of FIG. 13, the diffusion region is not formed and the isolation layer STI is formed at the center of the well voltage supply cell WSC1 and at the ends of the memory cells MC1 and MC2.

Figure 14A:
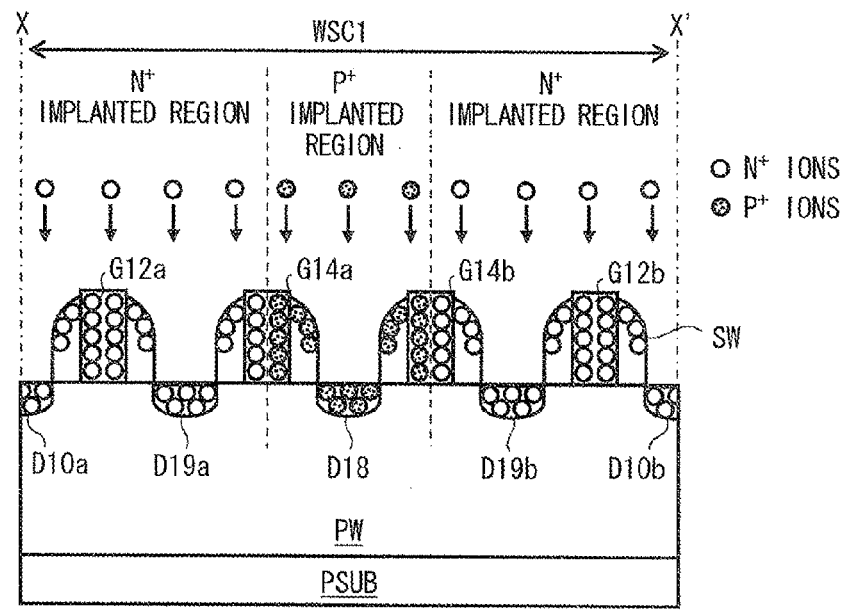
FIG. 14A is a cross-sectional image view at the time of ion implantation.
Figure 14B:
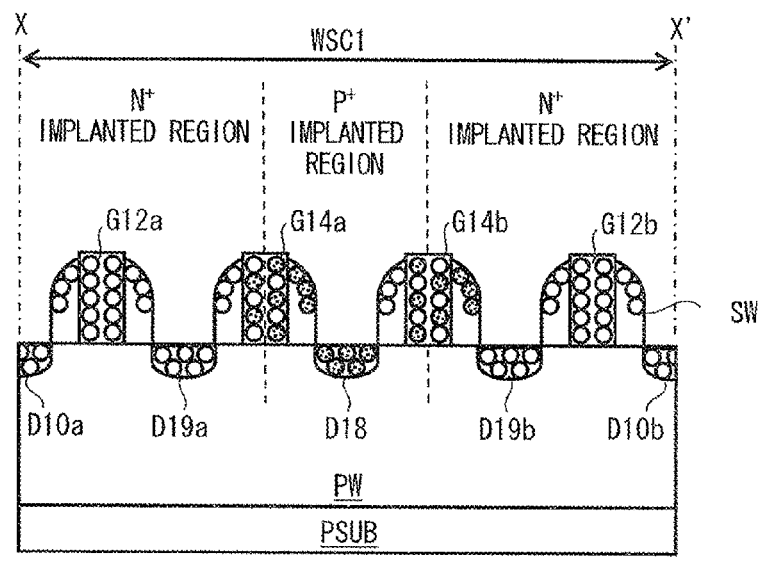
FIG. 14B is a cross-sectional image view after annealing.

A process of forming the P-type diffusion region D18 for supplying a well voltage is described hereinafter with reference to FIGS. 14A and 14B. FIG. 14A is a cross-sectional image view at the time of ion implantation. FIG. 14B is a cross-sectional image view after annealing. FIGS. 14A and 14B show the range of X-X' in the cross section along line B-B' in FIG. 11.

As shown in FIG. 14A, the boundary between a $P^+$ implanted region and an $N^+$ implanted region in ion implantation is on the gate electrodes G14a and G14b. Thus, at the time of ion implantation into the $P^+$ implanted region, $P^+$ is implanted by masking the $N^+$ implanted region with a resist and using the gate electrodes G14a and G14b and the sidewall as a hard mask. At the time of ion implantation into the $N^+$ implanted region, $N^+$ is implanted by masking the $P^+$ implanted region with a resist and using the gate electrodes G14a and G14b and the sidewall as a hard mask. Therefore, both of $P^+$ ions (for example, B) and $N^+$ ions (for example, As, P) are implanted into the gate electrode G14a. $N^+$ ions are implanted on the left side of the sidewall of the gate electrode G14a. $P^+$ ions are implanted on the right side of the sidewall of the gate electrode G14a. Both of $P^+$ ions (for example, B) and $N^+$ ions (for example, As, P) are implanted into the gate electrode G14b. $P^+$ ions are implanted on the left side of the sidewall of the gate electrode G14b. $N^+$ ions are implanted on the right side of the sidewall of the gate electrode G14b. In this step, the boundary between $P^+$ ions and $N^+$ ions is clear.

On the other hand, as shown in FIG. 14B, after annealing, $P^+$ ions and $N^+$ ions are diffused in the gate electrodes G14a and G14b, and the boundary between $P^+$ ions and $N^+$ ions becomes unclear. However, in the gate electrodes G14a and G14b, the concentration of $N^+$ ions is lower and the concentration of $P^+$ ions is higher than those in the other gate electrodes (for example, the gate electrodes G4a and G4b arranged symmetrically). The concentration of $N^+$ ions is high on the left side of the sidewall of the gate electrode G14a, and the concentration of $P^+$ ions is high on the right side of the sidewall of the gate electrode G14a (in other words, the concentration of $N^+$ ions is higher on the left side than on the right side of the sidewall of the gate electrode G14a). The concentration of $P^+$ ions is high on the left side of the sidewall of the gate electrode G14b, and the concentration of $N^+$ ions is high on the right side of the sidewall of the gate electrode G14b (in other words, the concentration of $N^+$ ions is higher on the right side than on the left side of the sidewall of the gate electrode G14b). This can be observed by EDX analysis of the transmission electron microscope (TEM) or atom probe analysis.

Figure 15A:
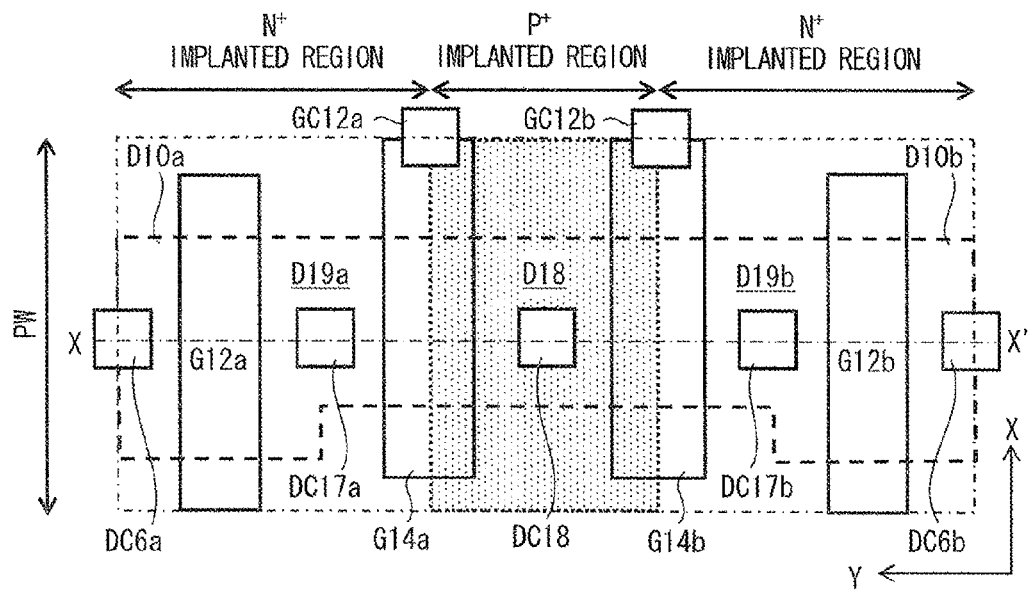
FIG. 15A is diagram where a P well formation region on the right of FIG. 7A is rotated at 90 degrees counterclockwise.
Figure 15B:
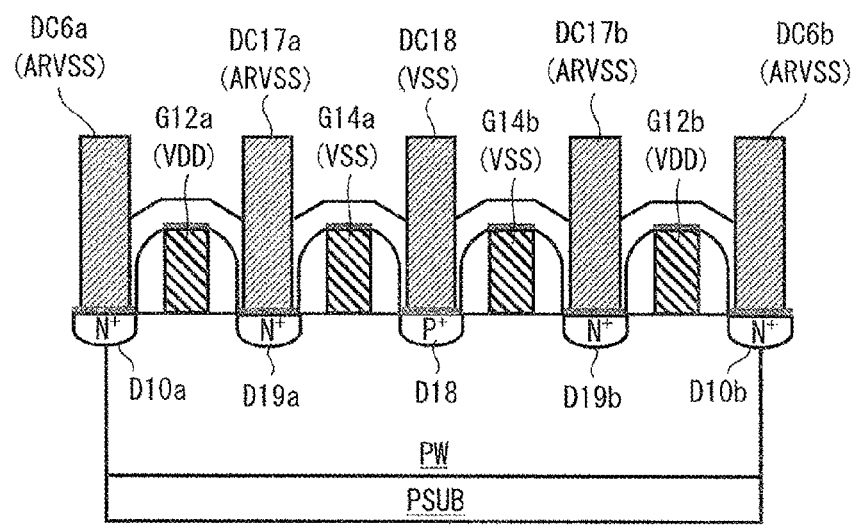
FIG. 15B is a cross-sectional view along line X-X' of FIG. 15A.
Figure 15C:
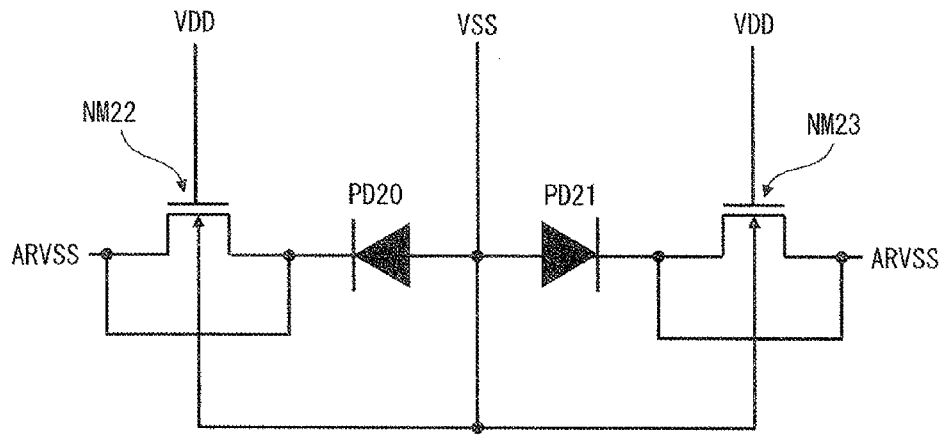
FIG. 15C is a circuit diagram corresponding to FIGS. 15A and 15B, showing a part of the circuit diagram of FIG. 8.

FIG. 15A is diagram where the P well formation region on the right of FIG. 7A is rotated at 90 degrees counterclockwise. FIG. 15B is a cross-sectional view along line X-X' of FIG. 15A, which corresponds to the range of X-X' in the cross section along line B-B' in FIG. 11. FIG. 15C is a circuit diagram corresponding to FIGS. 15A and 15B, showing a part of the circuit diagram of FIG. 8. Thus, FIGS. 15A to 15C are described above and the description thereof is omitted. The diffusion region D18 for supplying a well voltage is particularly described below.

Figure 16A:
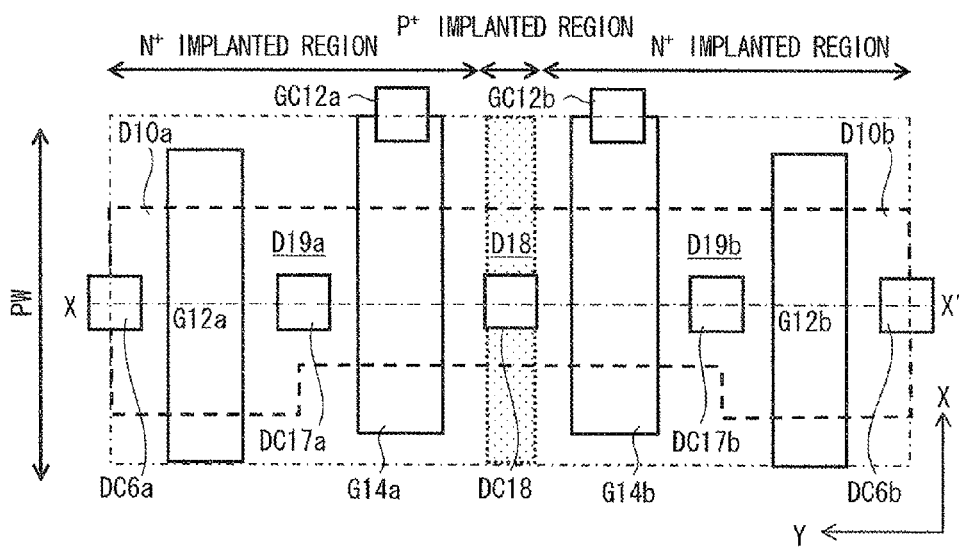
FIG. 16A is a diagram in the case where a $P^+$ implanted region is narrower than in FIG. 15A.
Figure 16B:
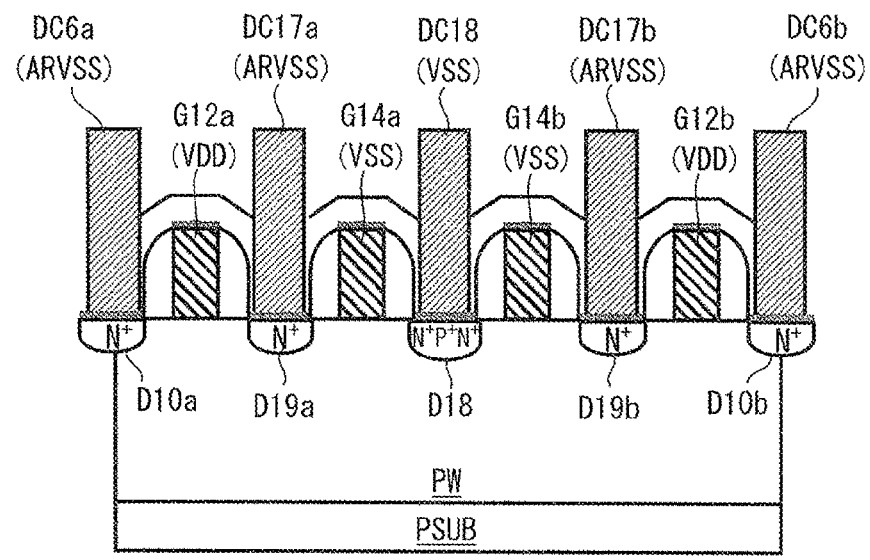
FIG. 16B is a cross-sectional view along line X-X' of FIG. 16A.
Figure 16C:
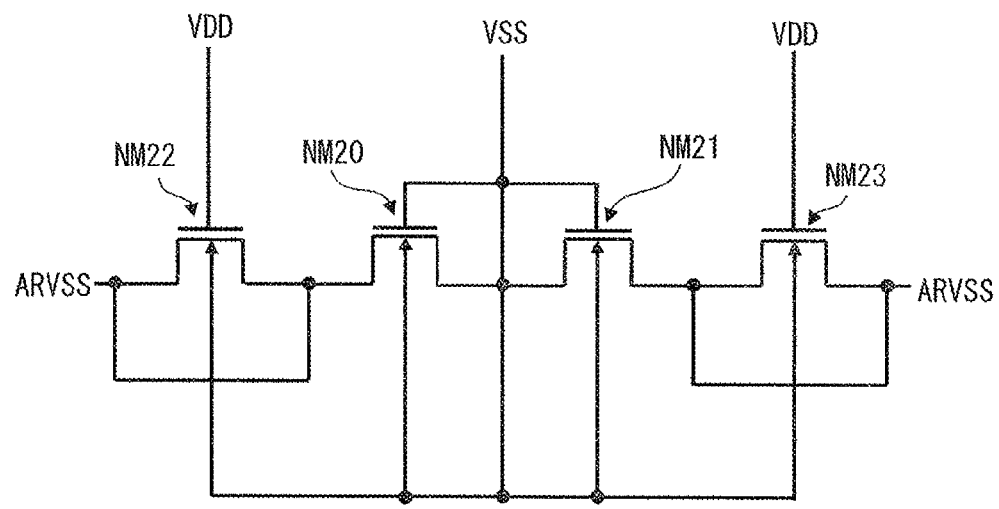
FIG. 16C is a circuit diagram corresponding to FIGS. 16A and 16B.

FIGS. 16A to 16C are diagrams in the case where the $P^+$ implanted region is narrower than that in FIGS. 15A to 15C. As shown in FIGS. 16A and 16B, the N-type diffusion region is formed on both sides of the gate electrode G14a and the gate electrode G14b. Thus, the gate electrode G14a and the gate electrode G14b form an NMOS transistor.

As shown in FIG. 16C, the NMOS transistor NM20 is a dummy transistor composed of the gate electrode G14a. One of the source and drain of the NMOS transistor NM20 is connected to the second low-voltage power supply ARVSS. Further, the other one of the source and drain, the gate and the well (backgate) of the NMOS transistor NM20 are connected to the first low-voltage power supply VSS. Therefore, the NMOS transistor NM20 is always off.

Likewise, the NMOS transistor NM21 is a dummy transistor composed of the gate electrode G14b. One of the source and drain of the NMOS transistor NM21 is connected to the second low-voltage power supply ARVSS. Further, the other one of the source and drain, the gate and the well (backgate) of the NMOS transistor NM21 are connected to the first low-voltage power supply VSS. Therefore, the NMOS transistor NM21 is always off.

In this manner, even when the $P^+$ implanted region is narrowed, the first low-voltage power supply VSS, which is a well voltage, and the second low-voltage power supply ARVS can be separated from each other. However, as the $P^+$ implanted region is narrower, manufacturing becomes more difficult.

Figure 17A:
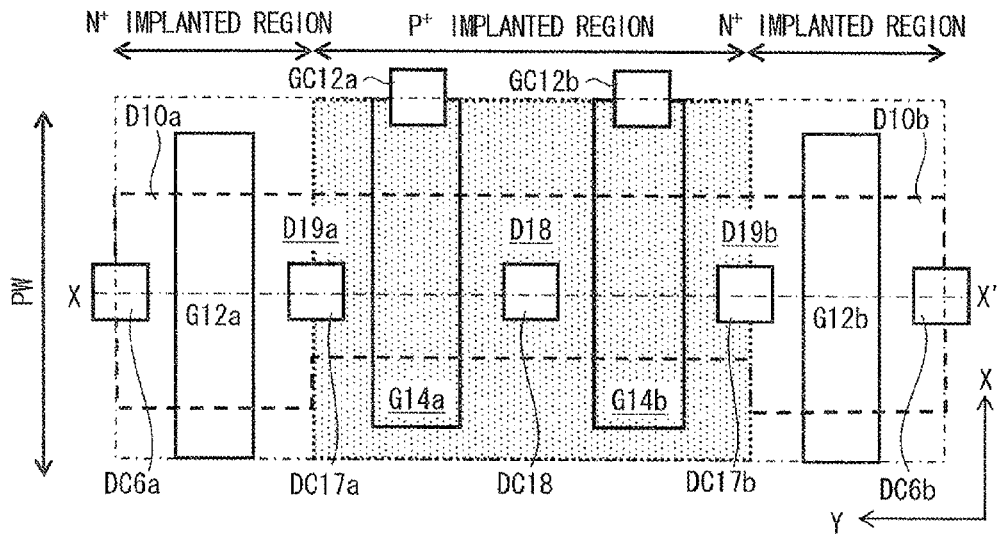
FIG. 17A is a diagram in the case where a $P^+$ implanted region is wider than in FIG. 15A.
Figure 17B:
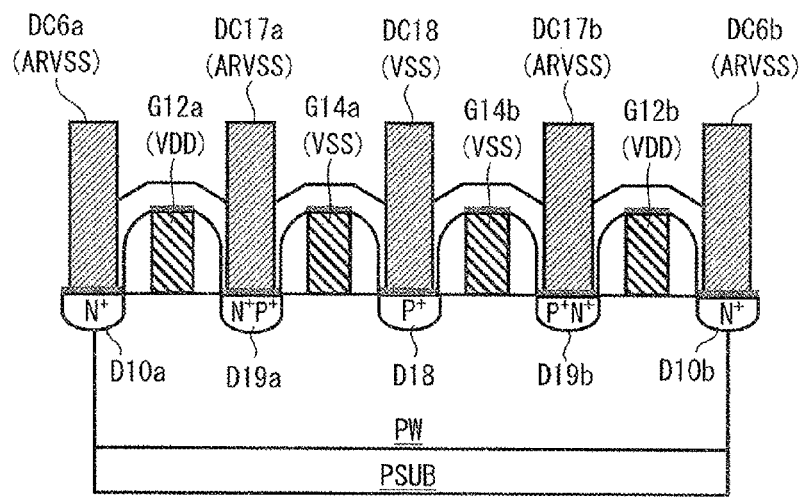
FIG. 17B is a cross-sectional view along line X-X' of FIG. 17A.
Figure 17C:
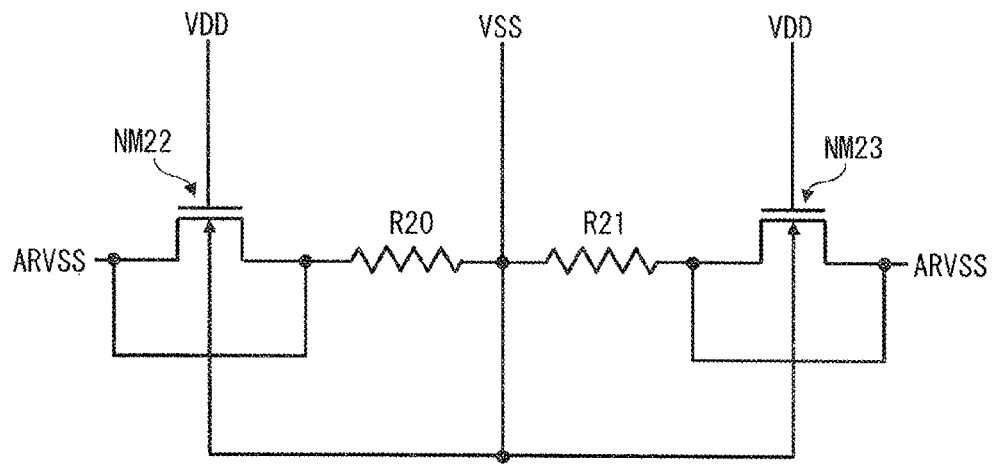
FIG. 17C is a circuit diagram corresponding to FIGS. 17A and 17B.

FIGS. 17A to 17C are diagrams in the case where the $P^+$ implanted region is wider than that in FIGS. 15A to 15C. As shown in FIGS. 17A and 17B, $P^+$ ions are implanted also into the diffusion regions D19a and D19b.

In this case, as shown in FIG. 16B, parasitic resistors R20 and R21 composed of a $P^+$ diffusion region, a P well and a $P^+$ diffusion region are formed under the gate electrodes G14a and G14b. Therefore, the first low-voltage power supply VSS, which is a well voltage, and the second low-voltage power supply ARVSS are short-circuited through the parasitic resistors R20 and R21. It is thus necessary not to implant $P^+$ ions into the diffusion regions D19a and D19b in the manufacturing process.

Figure 18A:
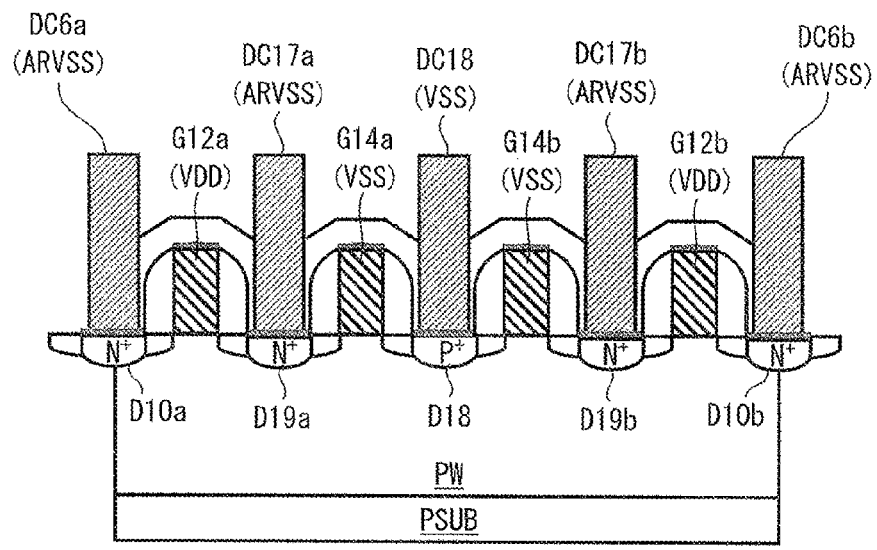
FIG. 18A is a diagram where an extension implanted region is added to the same cross-sectional view as in FIG. 15A.
Figure 18B:
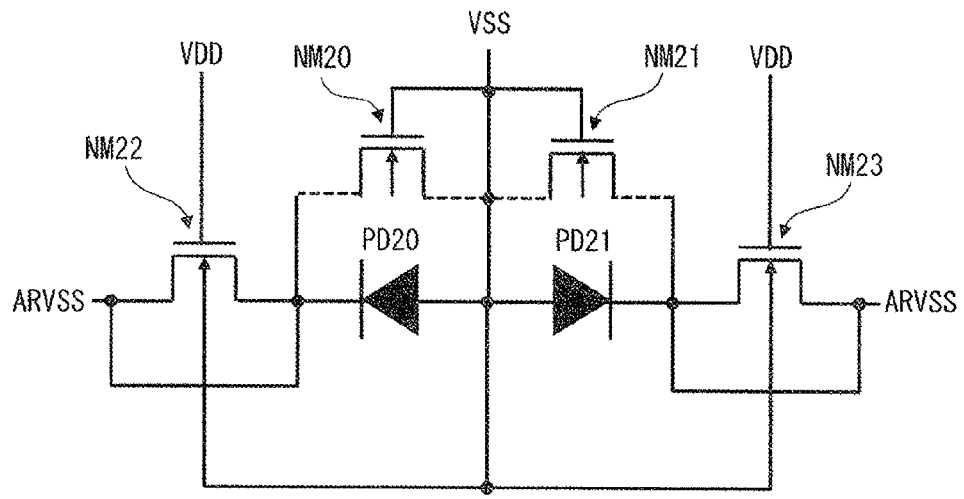
FIG. 18B shows an equivalent circuit in consideration of dummy transistors NM20 and NM21 of dummy gate electrodes G14a and G14b.

In the above description, extension (or LDD) implantation that is performed prior to ion implantation in the diffusion region is omitted. The extension implantation is performed before sidewall formation, and $N^+$ ions are implanted into the P well formation region, and $P^+$ ions are implanted into the N well formation region in general. FIG. 18A is a diagram where an extension implanted region is added to the same cross-sectional view as in FIG. 15A. FIG. 18B shows an equivalent circuit in consideration of dummy transistors NM20 and NM21 of dummy gate electrodes G14a and G14b.

The dummy gate electrodes G14a and G14b in which the source region is a well contact in the MOS structure does not operate as a normal transistor because it is not the MOS structure. However, when extension implantation is done in the well contact region as well, the dummy gate electrodes G14a and G14b can operate as dummy transistors, with the extension region ($N^+$) serving as the source and drain.

For example, a well contact diffusion layer ($P^+$) and an extension region ($N^+$) which serve as the source of the gate electrode G14b is PN junction and does not normally operate as a transistor. However, there can be cases where the extension region ($N^+$) and the P-type diffusion region ($P^+$) are metallically short-circuited by silicide on the silicon surface caused by recession of the sidewall due to contact etching, where the growth of silicide does not stop at the silicon surface of the diffusion region ($P^+$) and reaches the extension region ($N^+$), and where the PN separation position of the extension region ($N^+$) and the diffusion region ($P^+$) shifts to the side of the diffusion region during the manufacturing process. Therefore, when the left and right diffusion layers of the dummy gate electrode have different potentials, it is preferred that the dummy gate is fixed at power supply voltage (the gate of the P well formation region is at the first low-voltage power supply VSS, and the gate of the N well formation region is at the first high-voltage power supply VDD) in order to prevent short-circuit by the dummy transistor. The dummy gate electrodes G14a and G14b have such a structure.

As is obvious from FIG. 9B, the semiconductor device according to this embodiment includes a first SRAM cell (for example, MC1) having a first gate electrode group (for example, G1a to G4a) lying in a first direction (x direction) on a P well and an N well, the first gate electrode group including a first gate electrode (for example, G4a) constituting an access transistor (for example, AC2a); a second SRAM cell (for example, MC2) having a second gate electrode group (for example, G1b to G4b) located symmetrically to the first gate electrode group (for example, G1a to G4a) with respect to an axis in the first direction (x direction), the second gate electrode group including a second gate electrode (for example, G4b) constituting an access transistor (for example, AC2b); and a first well voltage supply cell (for example, WSC1) located between the first and second SRAM cells in a direction perpendicular to the first direction (x direction) and supplying voltages to the P well and the N well.

The first well voltage supply cell (for example, WSC1) has a third gate electrode group (for example, G11a to G14a) located symmetrically to the first gate electrode group with respect to a border line with the first SRAM cell (for example, MC1) located adjacently and including a third gate electrode (for example, G14a) corresponding to the first gate electrode (for example, G4a); a fourth gate electrode group (for example, G11b to G14b) located symmetrically to the second gate electrode group with respect to a border line with the second SRAM cell (for example, MC2) located adjacently and including a fourth gate electrode (for example, G14b) corresponding to the second gate electrode (for example, G4b); a P-type impurity diffusion region (for example, D18) located between the third gate electrode (for example, G14a) and the fourth gate electrode (for example, G14b) located opposite to each other on the P well; a first N-type impurity diffusion region (for example, D19a) located on a side of the third gate electrode (for example, G14a) closer to the first SRAM cell; and a second N-type impurity diffusion region (for example, D19b) located on a side of the fourth gate electrode (for example, G14b) closer to the second SRAM cell.

Therefore, according to this embodiment, it is possible to provide a layout of well voltage supply cells that can be provided with multiple power supplies without diminishing the regularity of memory cells. By separating the second power supply voltages ARVDD and ARVSS for driving the memory cells MC from the first power supply voltages VDD and VSS to be supplied to the well, it is possible to intensify the well voltage and improve soft error tolerance and single-event latch-up tolerance. Further, by controlling power supplies during write and read operations, it is possible to improve write and read margins.

Alternative Example 1

Figure 19:
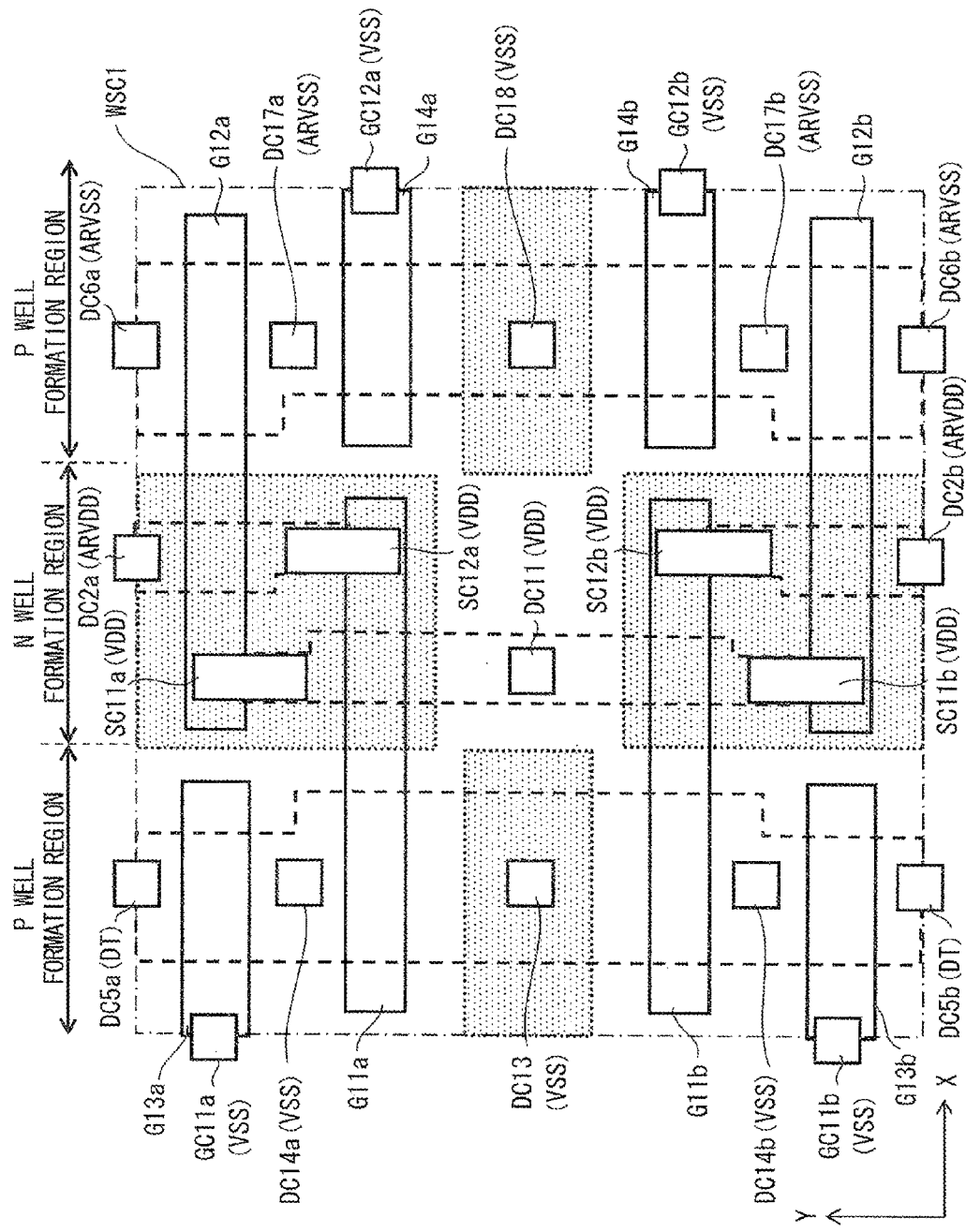
FIG. 19 is an alternative example of the layout diagram of the well voltage supply cell WSC1 of SRAM according to the first embodiment.

FIG. 19 is a layout diagram in the case where P+ ion and N+ ion implanted regions for well contact are narrowed in FIG. 7A, and all gate electrodes are made to have the MOS structure, so as to function as transistors.

Figure 20:
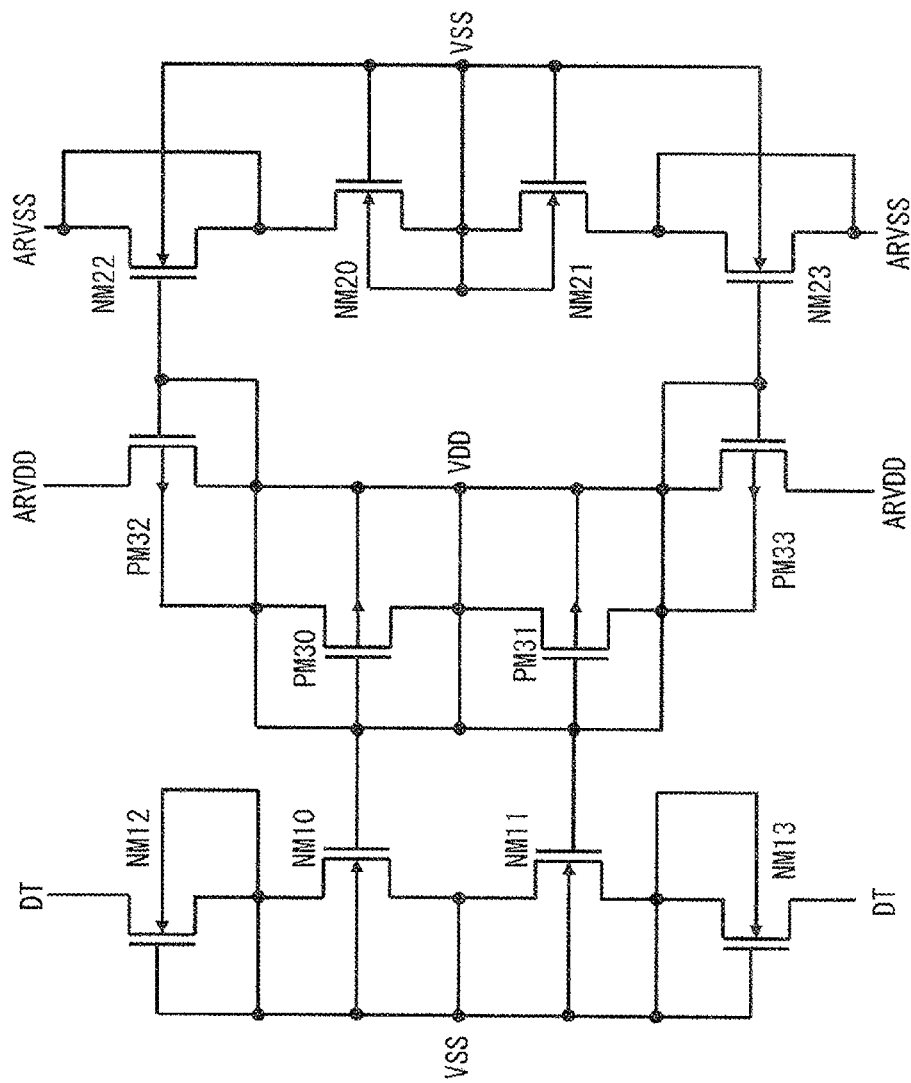
FIG. 20 is an equivalent circuit diagram of FIG. 19.

FIG. 20 is an equivalent circuit diagram of FIG. 19. In FIG. 20, the parasitic diodes PD10 and PD11 in the circuit diagram of FIG. 8 are replaced by NMOS transistors NM10 and NM11. The parasitic resistors R30 and R31 in the circuit diagram of FIG. 8 are replaced by PMOS transistors PM30 and PM31. Furthermore, the parasitic diodes PD20 and PD21 in the circuit diagram of FIG. 8 are replaced by NMOS transistors NM20 and NM21.

Alternative Example 2

Figure 21:
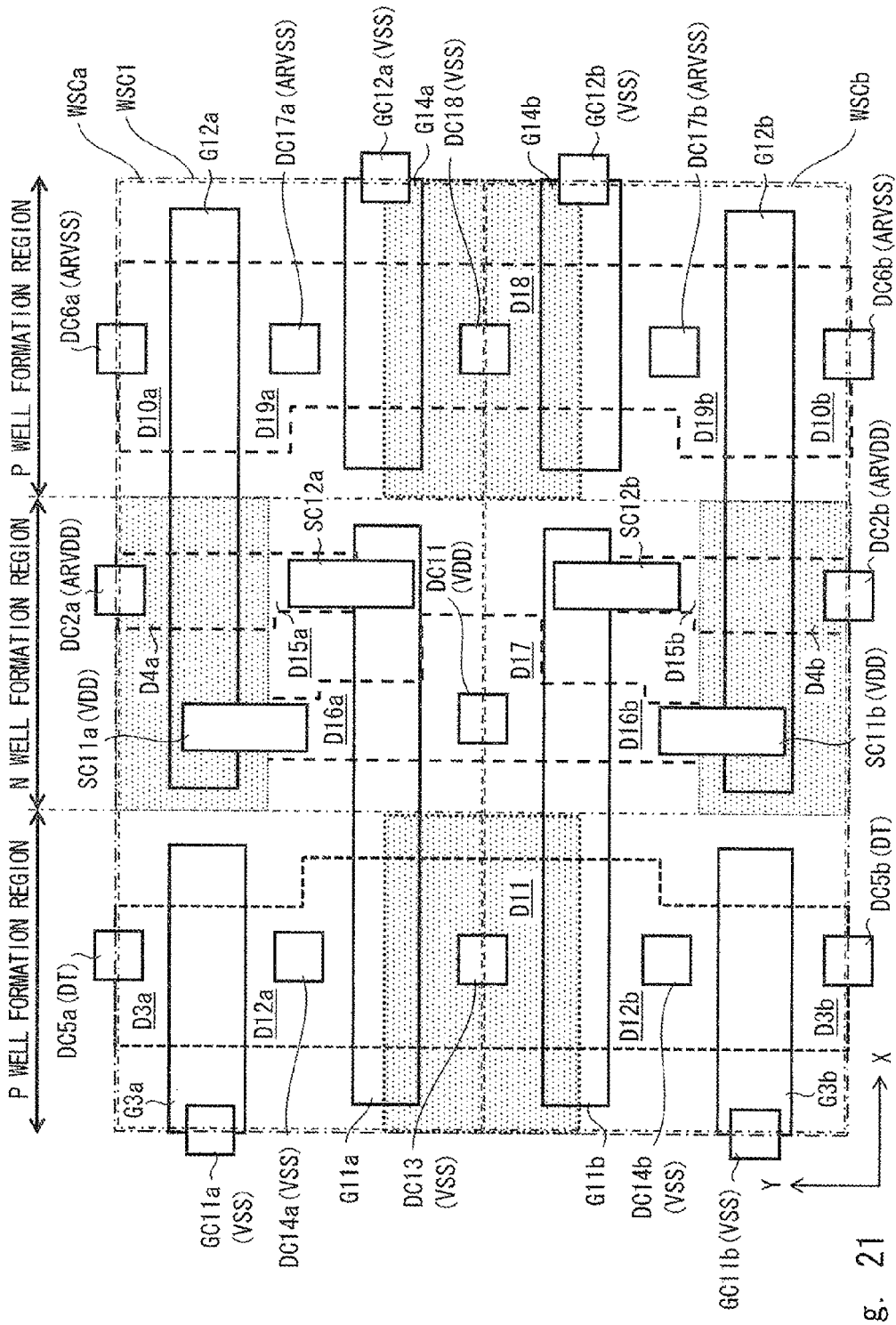
FIG. 21 is an alternative example of the layout diagram of the well voltage supply cell WSC1 of SRAM according to the first embodiment.

In the alternative example shown in FIG. 21, the diffusion region D17 is enlarged in the x direction, and the well contact region for the first high-voltage power supply VDD is enlarged. This ensures a sufficient well contact area without being affected by process variations or the like.

Second Embodiment

Figure 22A:
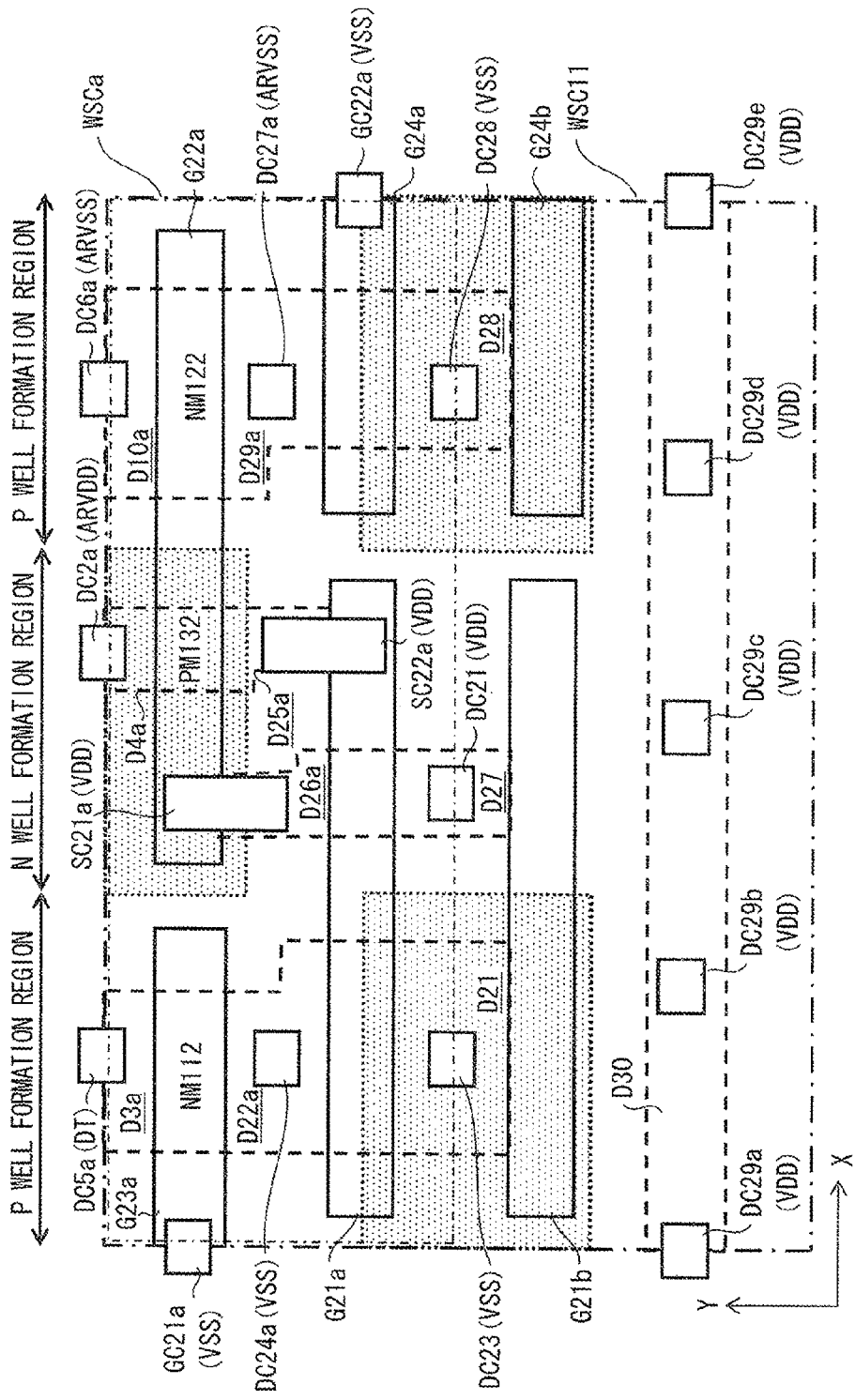
FIG. 22A is a layout diagram of a well voltage supply cell WSC11 of SRAM according to a second embodiment.
Figure 22B:
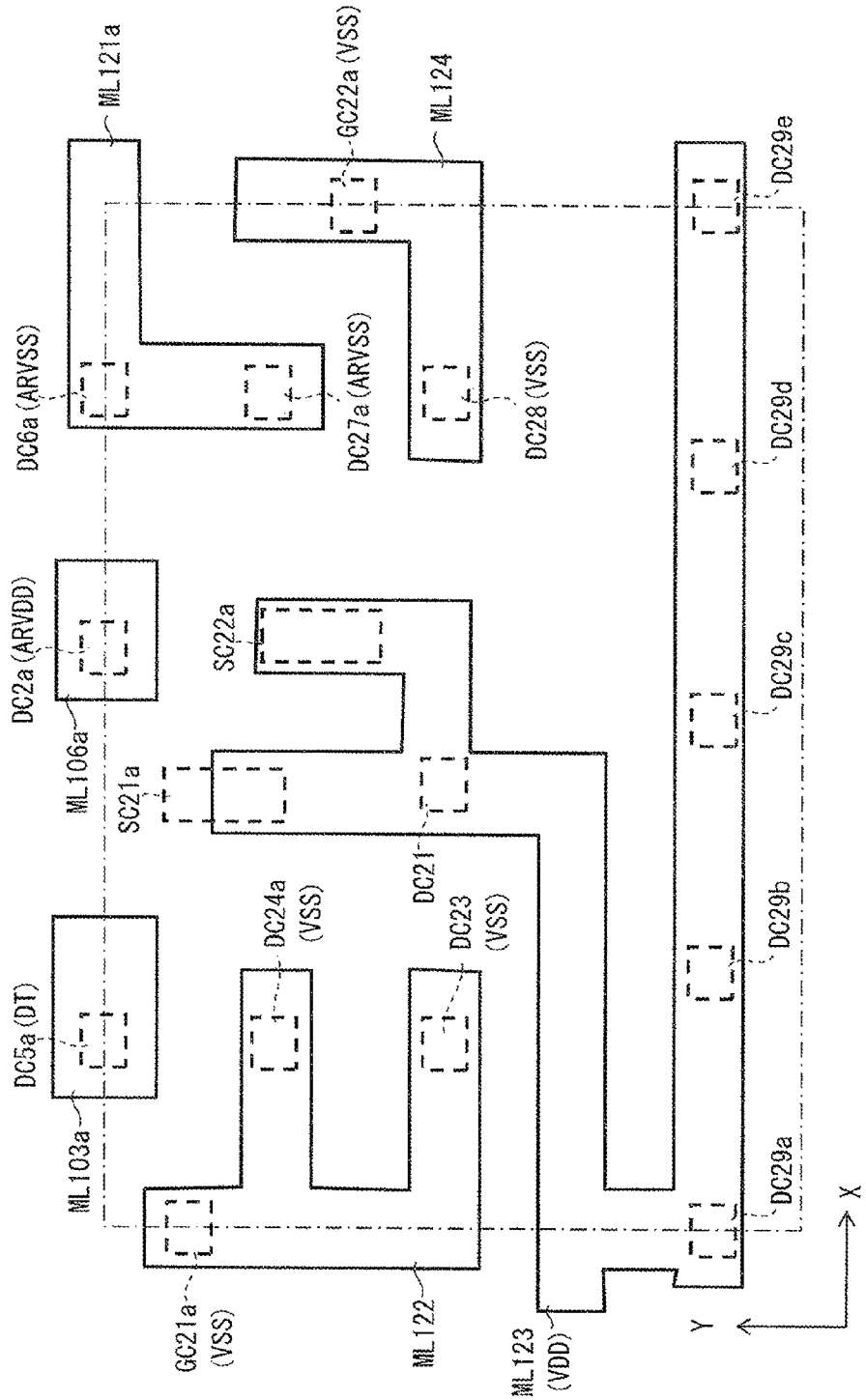
FIG. 22B is a layout diagram of a first layer line in the well voltage supply cell WSC11.
Figure 22C:
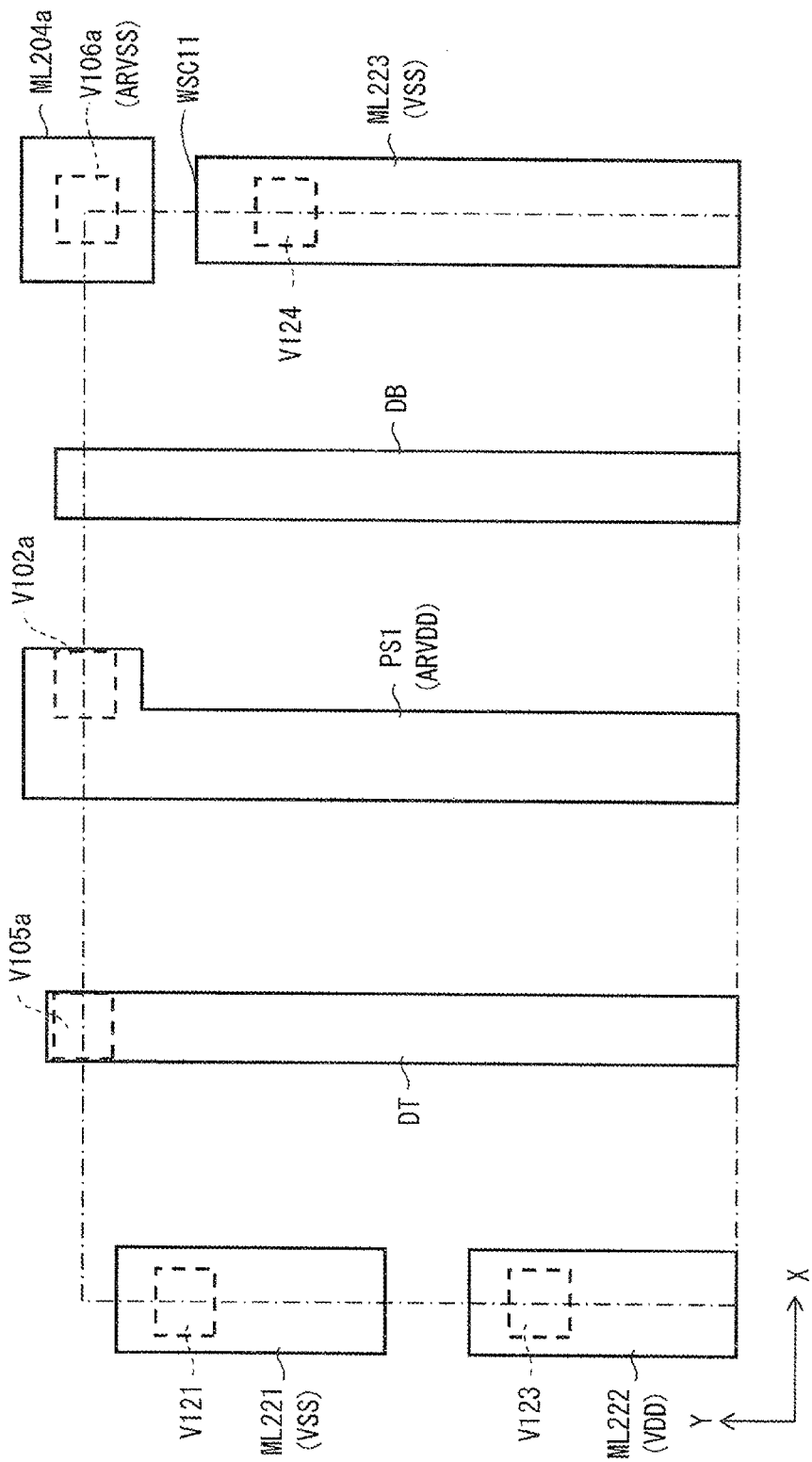
FIG. 22C is a layout diagram of a second layer line in the well voltage supply cell WSC11.
Figure 22D:
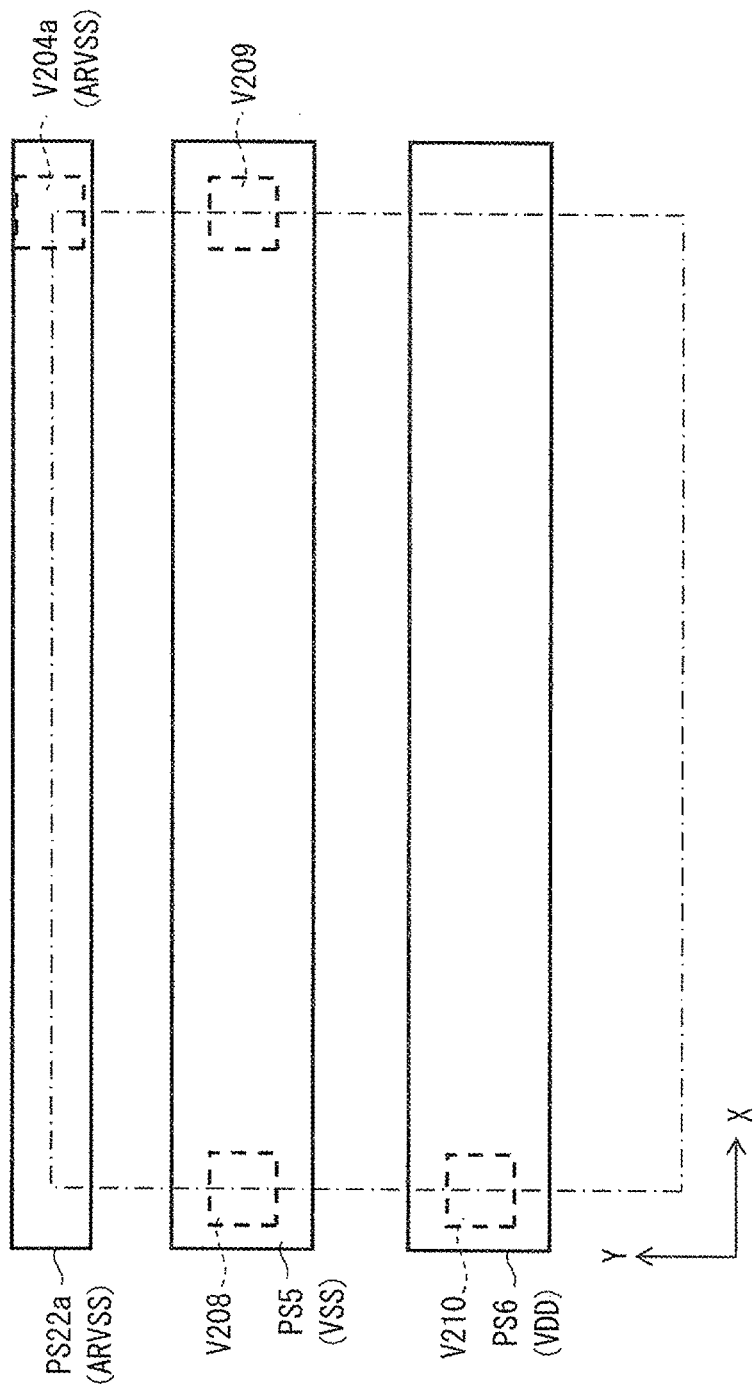
FIG. 22D is a layout diagram of a third layer line in the well voltage supply cell WSC11.

A layout of a well voltage supply cell of SRAM according to a second embodiment is described hereinafter with reference to FIGS. 22A to 22D. FIG. 22A is a layout diagram of a well voltage supply cell WSC11 of the SRAM according to the second embodiment. FIG. 22B is a layout diagram of a first layer line in the well voltage supply cell WSC11. FIG. 22C is a layout diagram of a second layer line in the well voltage supply cell WSC11. FIG. 22D is a layout diagram of a third layer line in the well voltage supply cell WSC11. The well voltage supply cell WSC11 according to the second embodiment is placed at the end.

As shown in FIG. 22A, the well voltage supply cell WSC11 includes six gate electrodes G21a to G24a, G21b and G24b, ten diffusion regions D1a, D4a, D10a, D21, D22a, D25a, D26a, D27, D28 and D29a, thirteen diffusion region contacts DC2a, DC5a, DC6a, DC21, DC23, DC24a, DC27a, DC28 and DC29a to DC29e, two gate contacts GC21a and GC22a, and four shared contacts SC21a and SC22a.

The memory cell MC1 shown in FIG. 3A is placed above the well voltage supply cell WSC1. Thus, the diffusion regions D1a, D4a and D10a and the diffusion region contacts DC2a, DC5a and DC6a are shared with the memory cell MC1 shown in FIG. 3A.

Further, the upper region of the well voltage supply cell WSC1 has a layout that is line-symmetric to the memory cell MC1 shown in FIG. 3A with respect to the upper border line of the well voltage supply cell WSC1 as the axis of symmetry. Specifically, the gate electrodes G21a to G24a are arranged line-symmetrically to the gate electrodes G1a to G4a of the memory cell MC1, respectively. The diffusion regions D22a, D25a, D26a and D29a are arranged line-symmetrically to the diffusion regions D2a, D5a, D6a and D9a of the memory cell MC1, respectively. The diffusion region contacts DC24a and DC27a are arranged line-symmetrically to the diffusion region contacts DC4a and DC7a of the memory cell MC1, respectively. The gate contacts GC21a and GC22a are arranged line-symmetrically to the gate contacts GC1a and GC2a of the memory cell MC1, respectively. The shared contacts SC21a and SC22a are arranged line-symmetrically to the shared contacts SC1a and SC2a of the memory cell MC1, respectively.

In this manner, the well voltage supply cell WSC11 has the same regularity as the memory cell MC1 located thereabove for the layout of the diffusion regions (i.e. the isolation layer STI), the gate electrodes and the contacts. It is thereby possible to suppress fluctuations in characteristics and shape of transistors in the memory cells adjacent to the well voltage supply cell WSC1 and enhance reliability. Note that, ideally, it is preferred that the diffusion region contacts DC21, DC23 and DC28 in the well voltage supply cell WSC11 are also arranged line-symmetrically to the diffusion region contacts DC1a, DC3a and DC8a of the memory cell MC1, respectively.

In the well voltage supply cell WSC11, a P-type diffusion region for supplying the first low-voltage power supply VSS to a P well is formed at the center of the P well formation region in the y direction. Further, an N-type diffusion region for supplying the first high-voltage power supply VDD to an N well is formed at the center of the N well formation region in the y direction.

In the case of FIG. 22A, in the P well formation region, P$^+$ ions are implanted into the region from the center line of the gate electrode G21a to the area including the gate electrode G21b. Further, P$^+$ ions are implanted into the region from the center line of the gate electrode G24a to the area including the gate electrode G24b. In the N well formation region, N$^+$ ions are implanted into the region from the position between the gate electrode G12a and the gate electrode G11a to the position between the gate electrode G12b and the gate electrode G11b. Note that, in FIG. 22A, the hatched area is the P$^+$ ion implanted region, and the other area is the N$^+$ ion implanted region.

Figure 23:
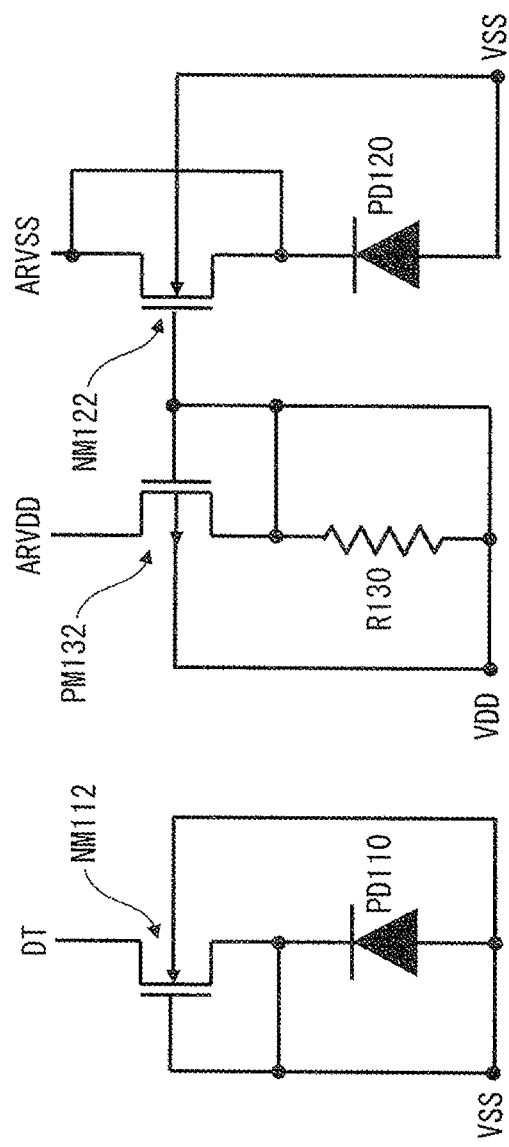
FIG. 23 is a circuit diagram of the well voltage supply cell WSC11 corresponding to FIG. 22A.

FIG. 23 is a circuit diagram of the well voltage supply cell WSC11 corresponding to FIG. 22A. As shown in FIG. 23, the well voltage supply cell WSC11 includes NMOS transistors NM112 and NM122, a PMOS transistor PM132, parasitic diodes PD110 and PD120, and a parasitic resistor R130.

The NMOS transistor NM112 is a dummy transistor composed of the gate electrode G23a. One of the source and drain of the NMOS transistor NM112 is connected to the bit line DT, and the other one is connected to the first low-voltage power supply VSS. Further, the gate and the well (backgate) of the NMOS transistor NM112 is also connected to the first low-voltage power supply VSS. Therefore, the NMOS transistor NM112 is always off and thereby prevented to operate.

The parasitic diode PD110 is composed of a P$^+$ diffusion region, a P well and an N$^+$ diffusion region that are formed under a dummy gate electrode G21a made of polysilicon into which both of P$^+$ ions and N$^+$ ions are implanted. The cathode is connected to the other one of the source and drain of the NMOS transistor NM112. The anode is connected to the first low-voltage power supply VSS.

The PMOS transistor PM132 is a dummy transistor composed of the gate electrode G22a. One of the source and drain of the PMOS transistor PM132 is connected to the second high-voltage power supply ARVDD, and the other one is connected to the first high-voltage power supply VDD. Further, the gate and the well (backgate) of the PMOS transistor PM132 is also connected to the first high-voltage power supply VDD. Therefore, the PMOS transistor PM132 is always off and thereby prevented to operate.

The parasitic diode R130 is composed of an N$^+$ diffusion region, an N well and an N$^+$ diffusion region that are formed under the gate electrode G21a. One end of the parasitic diode R130 is connected to the other one of the source and drain of the PMOS transistor PM132. The other end of the parasitic diode R130 is connected to the first high-voltage power supply VDD.

The NMOS transistor NM122 is a dummy transistor composed of the gate electrode G22a. Both of the source and drain of the NMOS transistor NM122 are connected to the second low-voltage power supply ARVSS. Further, the gate of the NMOS transistor NM122 is connected to the first high-voltage power supply VDD, and the well (backgate) of the NMOS transistor NM122 is connected to the first low-voltage power supply VSS. Therefore, the NMOS transistor NM122 is always on and thereby prevented to operate.

The parasitic diode PD120 is composed of a P$^+$ diffusion region, a P well and an N$^+$ diffusion region that are formed under a dummy gate electrode G22a made of polysilicon into which both of P$^+$ ions and N$^+$ ions are implanted. The cathode is connected to the source and drain of the NMOS transistor NM122. The anode is connected to the anode of the parasitic diode PD21. Further, the anode of the parasitic diode PD120 is connected to the first low-voltage power supply VSS. Further, the anode of the parasitic diode PD120 is connected to the first low-voltage power supply VSS. Because the second low-voltage power supply ARVSS is a lower voltage than the first low-voltage power supply VSS, the parasitic diode PD120 is a reverse-biased diode, and the second low-voltage power supply ARVSS and the first low-voltage power supply VSS are separated from each other.

FIG. 22B is a layout diagram of a first layer line in the well voltage supply cell WSC11 according to the second embodiment. In FIG. 22B, the contacts shown in FIG. 22A are also shown by dotted lines.

As shown in FIGS. 22A and 22B, the gate electrode G23a of the NMOS transistor NM112 is connected to a first layer line ML122, which is a relay line for connection to the first low-voltage power supply VSS, through the gate contact GC21a. The gate contact GC21a is formed on the border line of the well voltage supply cell WSC11 in the y direction.

The N-type diffusion region D1a constituting the NMOS transistor NM112 is connected to a first layer line ML103a, which is a relay line for connection to the bit line DT, through the diffusion region contact DC5a.

The N-type diffusion region D22a constituting the NMOS transistor NM112 is connected to a first layer line ML122, which is a relay line for connection to the first low-voltage power supply VSS, through the diffusion region contact DC24a.

The P-type diffusion region D21 for supplying the first low-voltage power supply VSS to the P well is connected to the first layer line ML122, which is a relay line for connection to the first low-voltage power supply VSS, through the diffusion region contact DC23.

The N-type diffusion region D10a constituting the NMOS transistor NM122 is connected to a first layer line ML121a, which is a relay line for connection to the second low-voltage power supply ARVSS, through the diffusion region contact DC6a.

The N-type diffusion region D29a constituting the NMOS transistor NM122 is connected to the first layer line ML121a, which is a relay line for connection to the second low-voltage power supply ARVSS, through the diffusion region contact DC27a.

The gate electrode G24a is connected to a first layer line ML124, which is a relay line for connection to the first low-voltage power supply VSS, through the gate contact GC22a. The gate contact GC22a is formed on the border line of the well voltage supply cell WSC11 in the y direction.

The P-type diffusion region D28 for supplying the first low-voltage power supply VSS to the P well is connected to the first layer line ML124, which is a relay line for connection to the first low-voltage power supply VSS, through the diffusion region contact DC28.

The P-type diffusion region D4a constituting the PMOS transistor PM132 is connected to a first layer line ML106a, which is a relay line for connection to the second high-voltage power supply ARVDD, through the diffusion region contact DC2a.

The gate electrode G22a that is shared by the PMOS transistor PM132 and the NMOS transistor NM122 is connected to the diffusion region D26a through the shared contact SC21a. The shared contact SC21a is connected to a first layer line ML123, which is a relay line for connection to the first high-voltage power supply VDD.

The gate electrode G21a is connected to the diffusion region D25a through the shared contact SC22a. The shared contact SC22a is connected to a first layer line ML123, which is a relay line for connection to the first high-voltage power supply VDD.

The N-type diffusion region D27 for supplying the first high-voltage power supply VDD to the N well is connected to the first layer line ML123, which is a relay line for connection to the first high-voltage power supply VDD, through the diffusion region contact DC21.

The plane layout of the first layer line is described hereinafter with reference to FIG. 22B.

The first layer line ML103a that is connected to the bit line DT lies along the border line in the x direction where the diffusion region contact DC5a is formed, from the formation position of the diffusion region contact DC5a, slightly extending toward the center of the well voltage supply cell WSC1.

The first layer line ML106a that is connected to the second high-voltage power supply ARVDD is formed on the diffusion region contact DC2a so that it is slightly larger than the diffusion region contact DC2a. The first layer line ML106a is located on the border line in the x direction.

The first layer line ML121a for connection to the second low-voltage power supply ARVSS has a first linear part that lies along the border line in the x direction where the diffusion region contact DC6a is formed, from the formation position of the diffusion region contact DC6a to the corner of the adjacent well voltage supply cell WSC11. It further has a second linear part that lies in the y direction from the diffusion region contact DC6a to the diffusion region contact DC27a. Thus, the first layer line ML121a is substantially L-shaped.

The first layer line ML122 for connection to the first low-voltage power supply VSS has a first linear part that lies along the border line in the y direction from the gate contact GC21a. It further has two second linear parts that lie in the x direction from the first linear part to the two diffusion region contacts DC23 and DC24a.

The first layer line ML123 for connection to the first high-voltage power supply VDD has a first linear part that lies in the y direction from the shared contact SC21a to the diffusion region contact DC21. Further, the first linear part is connected with a second linear part including the shared contact SC22a. Furthermore, the first linear part is connected with a third linear part that lies to pass through the diffusion region contacts DC29a to DC29e that are arranged in the x direction under the well voltage supply cell WSC1.

The first layer line ML124 for connection to the first low-voltage power supply VSS has a first linear part that lies along the border line in the y direction from the gate contact GC22a. It further has a second linear part that lies in the x direction from the first linear part to the diffusion region contact DC28. Thus, the first layer line ML124 is substantially L-shaped.

The plane layout of the second layer line is described hereinafter with reference to FIG. 22C. In FIG. 22C, six first vias V102a, V105a, V106a, V121, V123 and V124 that are made between the first layer line and the second layer line are also shown by dotted lines.

The second layer line ML204a is formed above the first via V106a that is connected to the second low-voltage power supply ARVSS so that it is slightly larger than the first via V106a. The first via V106a is located at the corner of the well voltage supply cell WSC11 on the first layer line ML111a.

The second layer line ML221 for connection to the first low-voltage power supply VSS lies along the border line from the first via V121 to the center in the y direction.

The second layer line ML222 for connection to the first high-voltage power supply VDD lies along the border line in the y direction from the first via V123 to the corner of the well voltage supply cell WSC11. The first via V123 is located in the first layer line ML123.

The second layer line ML223 for connection to the first low-voltage power supply VSS lies along the border line in the y direction from the first via V124 to the corner of the well voltage supply cell WSC11. The first via V124 is located on the border line in the y direction in the first layer line ML124.

The bit line DT formed in the second line layer lies in the y direction so that it runs across the first via V105a. The first via V105a is located on the first layer line ML103a that is located on the border line in the x direction.

Note that, as in the memory cell MC1, the bit line DB formed in the second line layer is placed in parallel to the bit line DT. The first via connected to the bit line DB is not made in the well voltage supply cell WSC11.

The power supply line PS1 formed in the second line layer lies in the y direction so that it runs across the first via V102a. The first via V102a is located on the first layer line ML106a that is located on the border line in the x direction. The power supply line PS1 is connected to the second high-voltage power supply ARVDD.

The plane layout of the third layer line is described hereinafter with reference to FIG. 22D. In FIG. 22D, four second vias V204a and V208 to V210 that are made between the second layer line and the third layer line are also shown by dotted lines.

The power supply line PS22a formed in the third line layer line lies along the border line in the x direction so that it runs across the second via V204a. The second via V204a is located at the corner of the well voltage supply cell WSC11 on the second layer line ML204a. The power supply line PS22a is to be connected to the second low-voltage power supply ARVSS.

The power supply line PS5 formed in the third line layer lies in the x direction so that it runs across the second vias V208 and V209. The second via V208 is located on the second layer line ML221 that is formed on the border line in the y direction. The second via V209 is located on the second layer line ML223 that is formed on the border line in the y direction. The power supply line PS5 is to be connected to the first low-voltage power supply VSS.

The power supply line PS6 formed in the third line layer lies in the x direction so that it runs across the second via V210. The second via V210 is located on the second layer line ML222. The power supply line PS6 is to be connected to the first high-voltage power supply VDD.

Figure 24A:
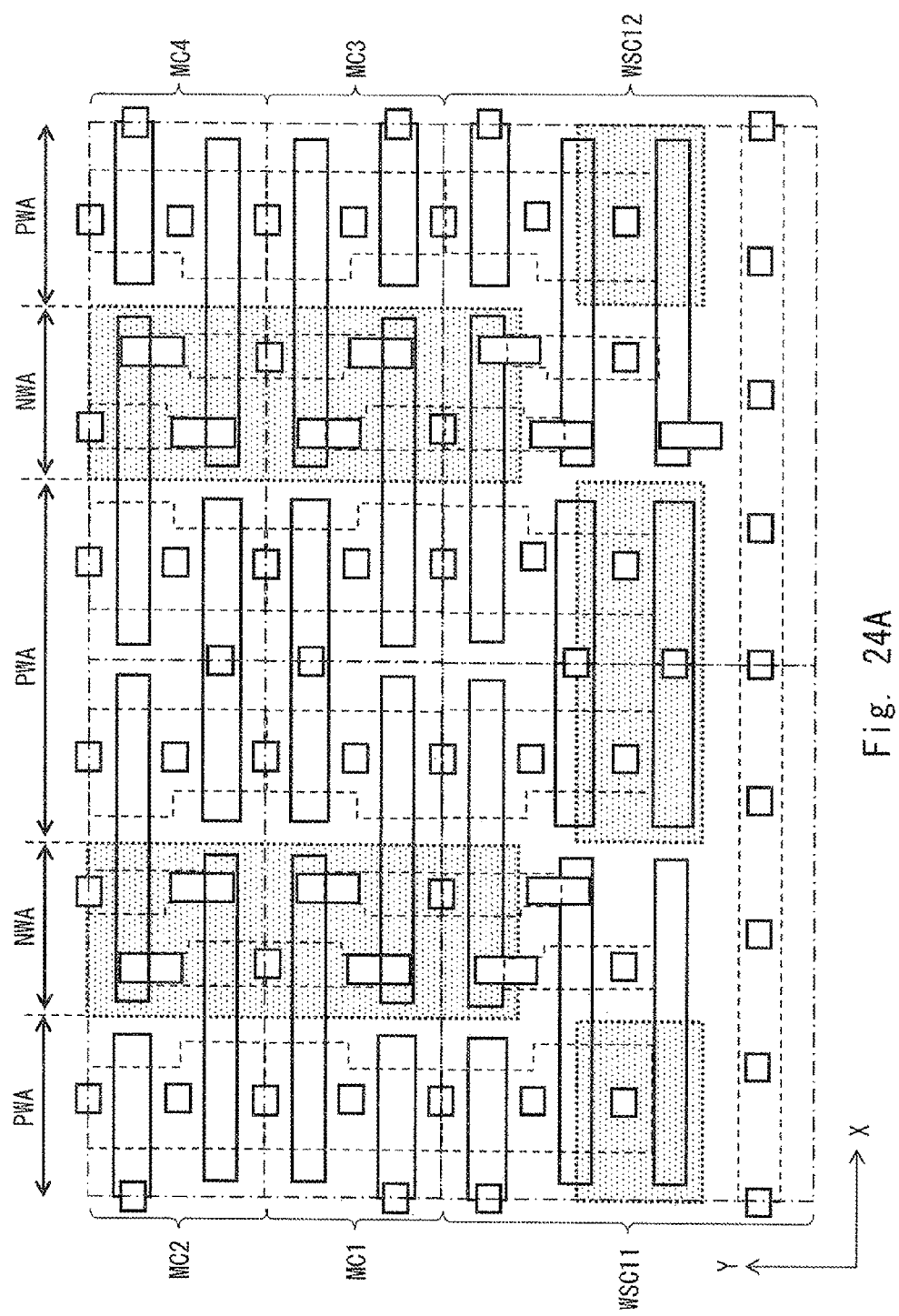
FIG. 24A is a diagram showing a layout example of memory cells and well voltage supply cells in the area A2 in FIG. 2.

FIG. 24A is a diagram showing a layout example of memory cells and well voltage supply cells in the area A2 in FIG. 2. Note that the reference symbols are omitted.

As shown in FIG. 24A, the memory cell MC1 is placed above the well voltage supply cell WSC11 shown in FIG. 22A. The memory cell MC2 shown in FIG. 6 is placed further above the memory cell MC1.

A well voltage supply cell 12 that is placed adjacent on the right to the well voltage supply cell WSC11 has a layout that is line-symmetric to the well voltage supply cell WSC11 with respect to their border line. Likewise, the memory cell MC3 that is placed adjacent on the right to the memory cell MC1 has a layout that is line-symmetric to the memory cell MC1 with respect to their border line. Thus, the memory cell MC3 has the same layout as the memory cell MC2. The memory cell MC4 that is placed adjacent on the right to the memory cell MC2 has a layout that is line-symmetric to the memory cell MC2 with respect to their border line. Thus, the memory cell MC4 has the same layout as the memory cell MC1.

As described above, because the memory cell MC1 is point-symmetric about the center of MC1, MC4 and MC1, and MC2 and MC3 have the same layout, respectively. Accordingly, it is equivalent to that MC2 is placed adjacently on the upside of the well voltage supply cell WSC12.

It is apparent from FIG. 24A that the layout of the well voltage supply cell WSC11 has the same regularity as the memory cell.

Figure 24B:
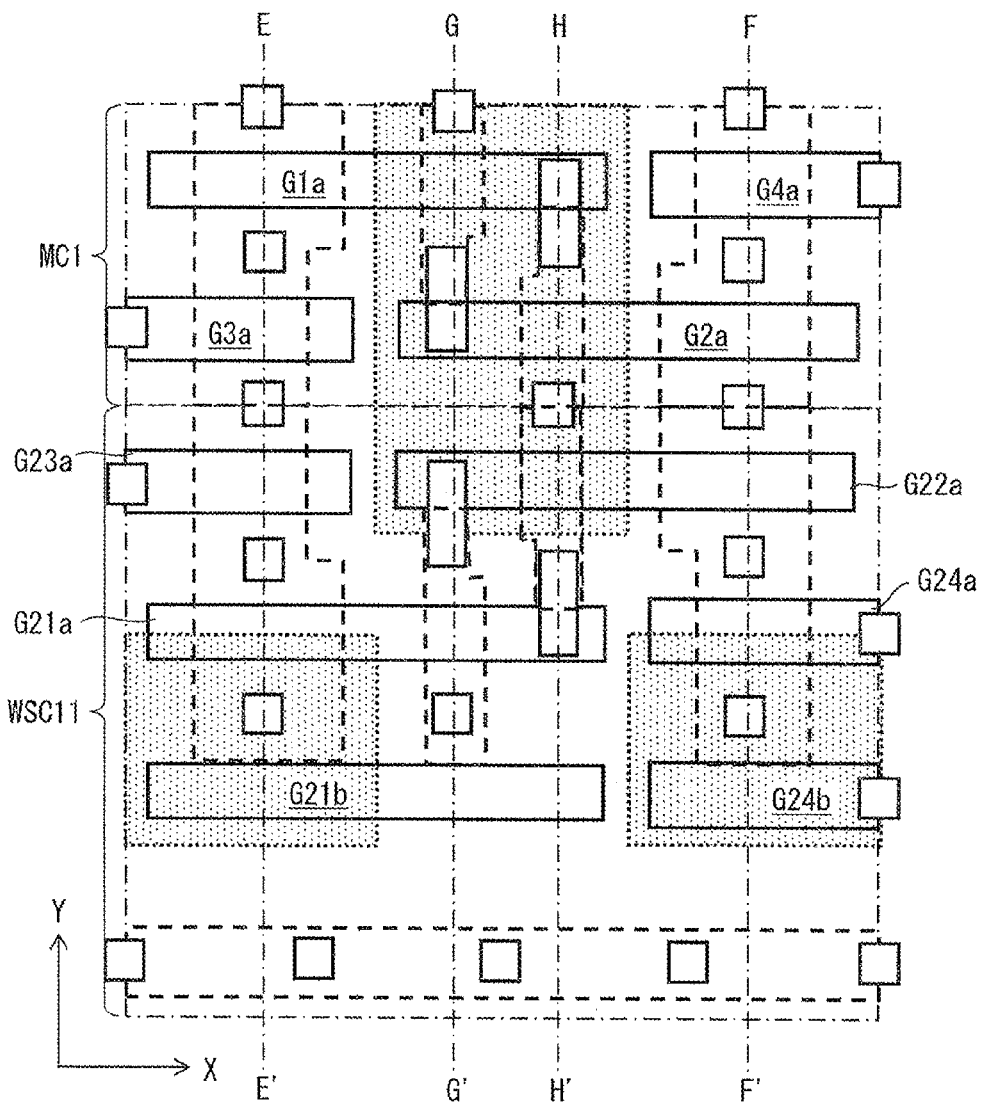
FIG. 24B is a diagram showing a state where only two cells, the memory cell MC1 shown in FIG. 3A and the well voltage supply cell WSC11 shown in FIG. 22A, are arranged.

FIG. 24B is a diagram showing a state where only two cells, the memory cell MC1 shown in FIG. 3A and the well voltage supply cell WSC11 shown in FIG. 22A, are arranged. The reference symbols are provided only for the gate electrodes.

The cross-sectional structures of the memory cell MC1 and the well voltage supply cell WSC11 are described hereinafter with reference to FIGS. 25 to 28.

Figure 25:
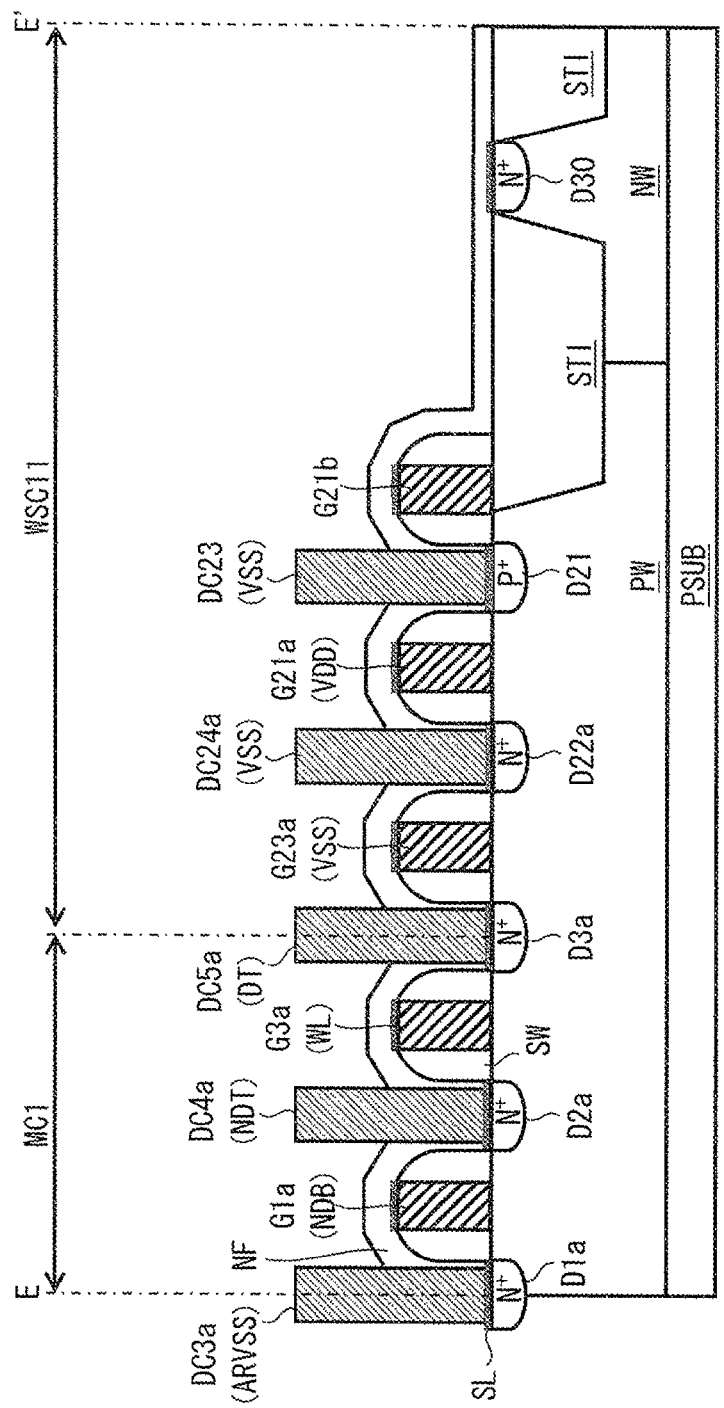
FIG. 25 is a cross-sectional view along line E-E' of FIG. 24B.
Figure 26:
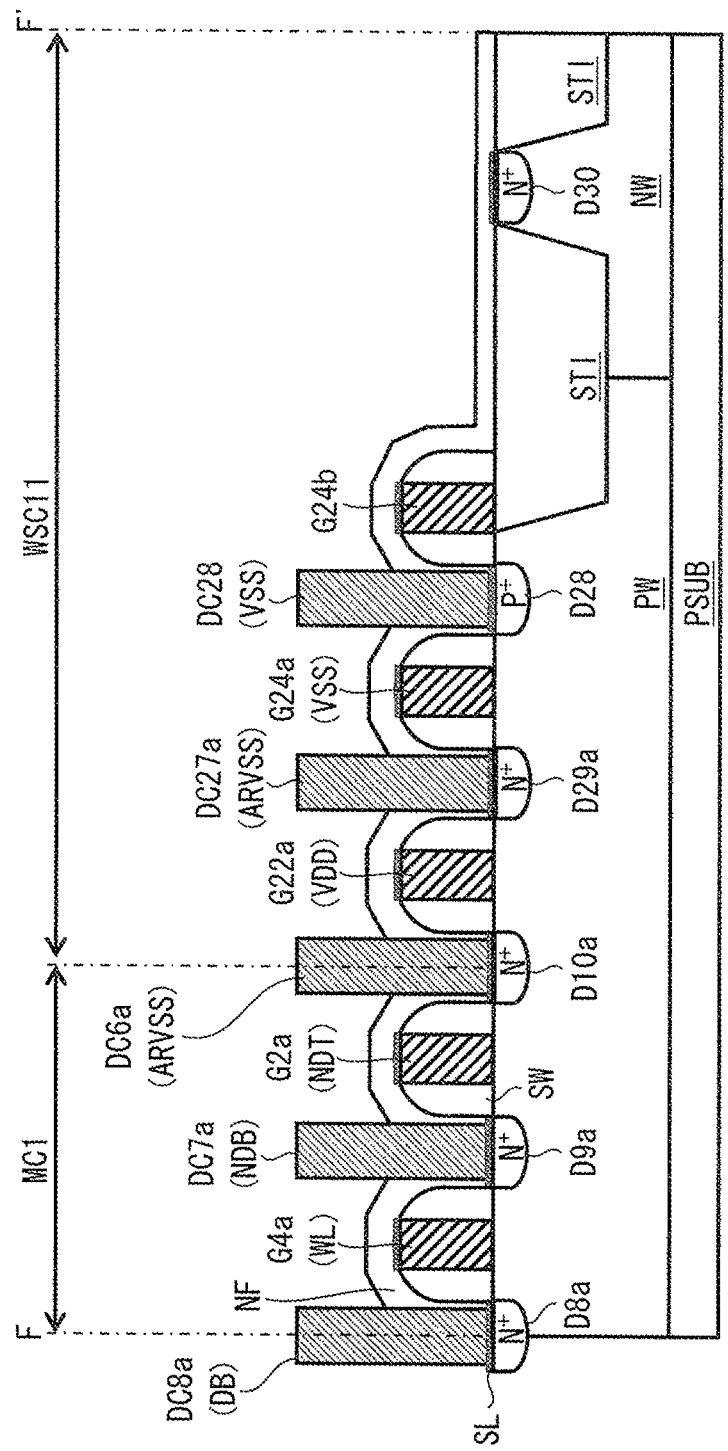
FIG. 26 is a cross-sectional view along line F-F' of FIG. 24B.
Figure 27:
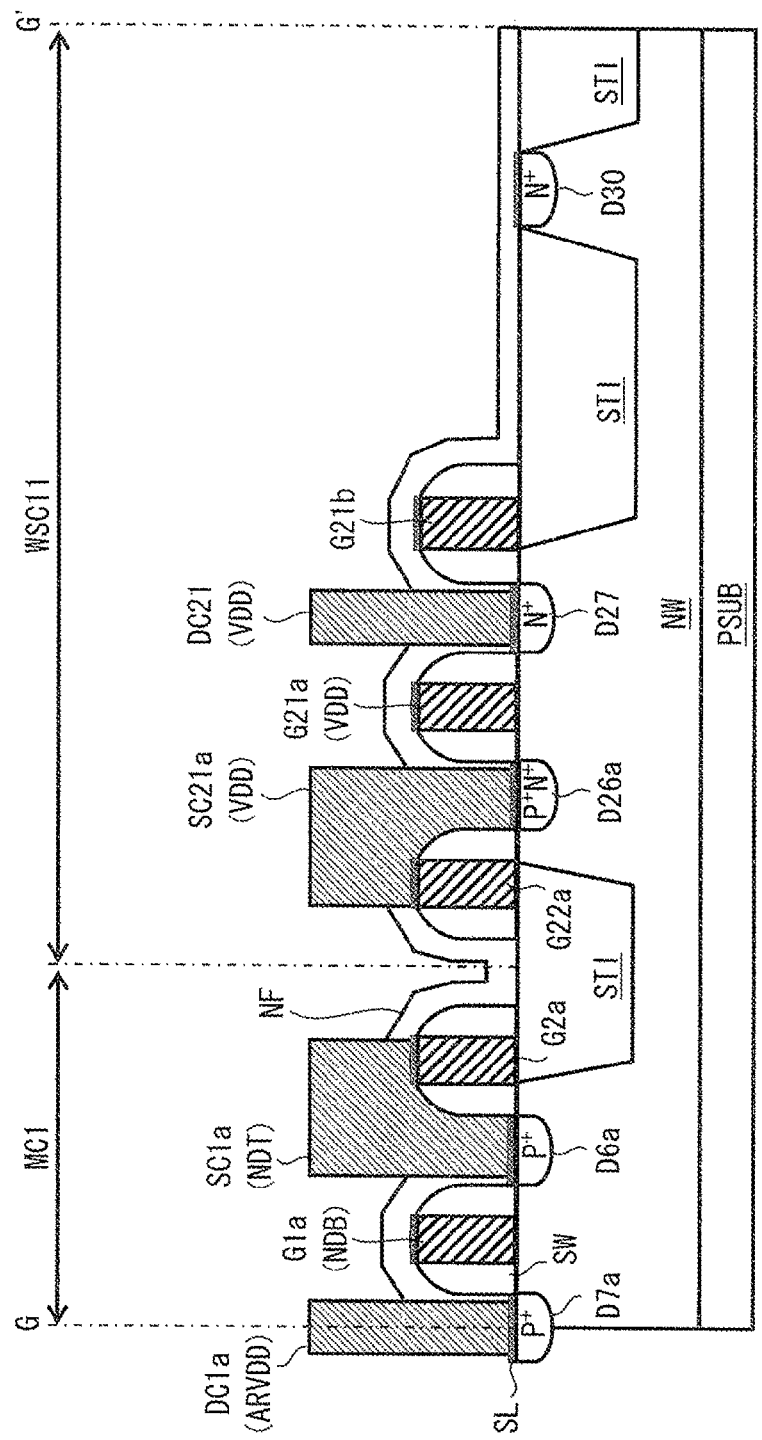
FIG. 27 is a cross-sectional view along line G-G' of FIG. 24B.
Figure 28:
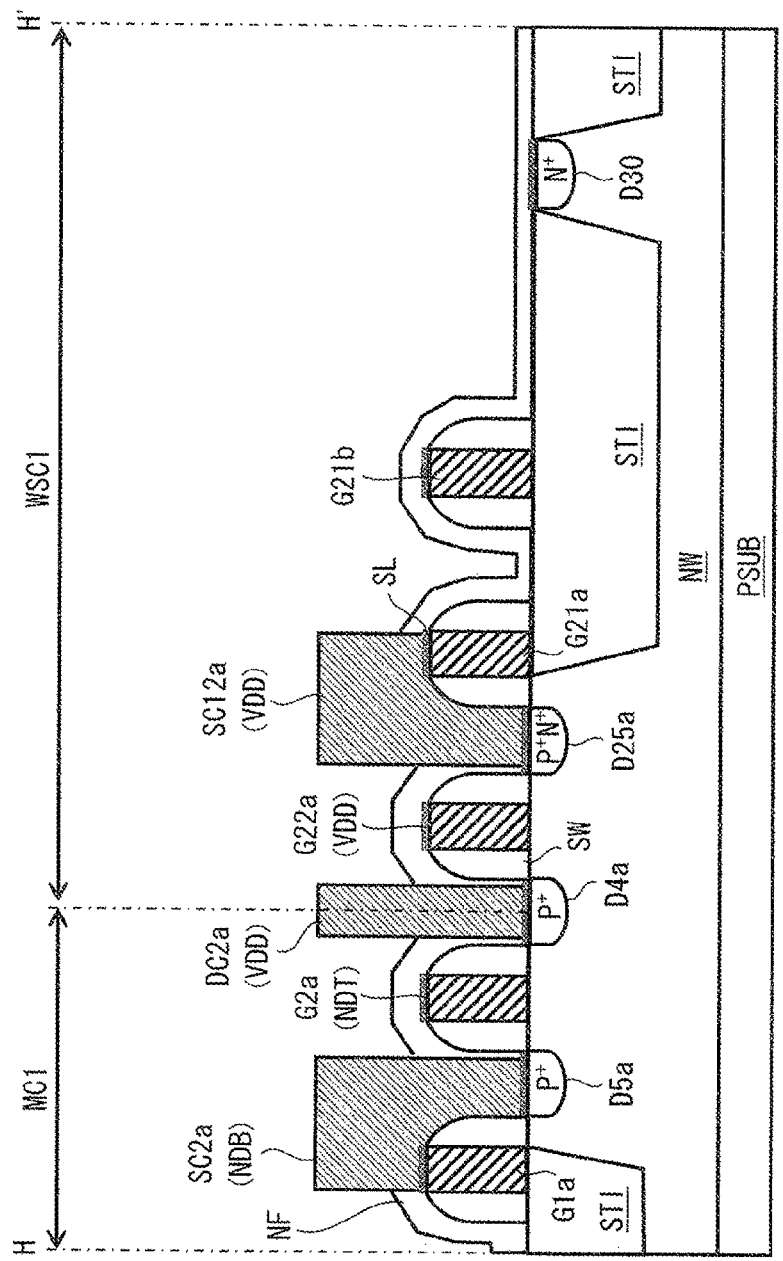
FIG. 28 is a cross-sectional view along line H-H' of FIG. 24B.

FIG. 25 is a cross-sectional view along line E-E' of FIG. 24B. FIG. 26 is a cross-sectional view along line F-F' of FIG. 24B. FIG. 27 is a cross-sectional view along line G-G' of FIG. 24B. FIG. 28 is a cross-sectional view along line H-H' of FIG. 24B. Note that the details of connections are described above, and only the cross-sectional structures are described below.

As shown in FIG. 25, in the P well formation region, a P well PW is formed on a P-type substrate PSUB. On the P well PW, the N-type diffusion regions D1a, D2a, D1a and D22a, and the P-type diffusion region D21 are formed. Further, an N well NW is formed at the end of the well voltage supply cell WSC11. On the N well NW, the diffusion region D30 is formed. On each diffusion region on the P well PW, a diffusion region contact is formed with a silicide layer SL interposed therebetween. For example, the diffusion region contact DC13 that is connected to the first low-voltage power supply VSS is formed above the P-type diffusion region D21 for supplying a well voltage.

The gate electrode is formed on the P well PW between the adjacent diffusion regions. For example, the gate electrode G1a is formed between the diffusion regions D1a and D2a.

A sidewall SW is formed on both sides of each gate electrode. Further, a silicide layer SL is also formed on each gate electrode. Further, a stopper nitride film NF is formed above each gate electrode.

FIG. 26 shows the P well formation region like FIG. 25 and thus has the similar cross-sectional structure. Specifically, a P well PW is formed on a P-type substrate PSUB. On the P well PW, the N-type diffusion regions D8a, D9a, D10a and D29a and the P-type diffusion region D28 are formed. Further, an N well NW is formed at the end of the well voltage supply cell WSC11. On the N well NW, the diffusion region D30 is formed. On each diffusion region on the P well PW, a diffusion region contact is formed with a silicide layer SL interposed therebetween. For example, the diffusion region contact DC28 that is connected to the first low-voltage power supply VSS is formed above the P-type diffusion region D28 for supplying a well voltage.

As shown in FIG. 27, in the N well formation region, an N well NW is formed on a P-type substrate PSUB. On the N well NW, the P-type diffusion regions D6a and D7a, the N-type diffusion region D27, and the diffusion region D26a where N type and P type are mixed are formed. Further, the N-type diffusion region D30 is formed at the end of the well voltage supply cell WSC11. On each diffusion region other than the diffusion region D30, a diffusion region contact or a shared contact is formed with a silicide layer SL interposed therebetween. For example, the diffusion region contact DC21 that is connected to the first high-voltage power supply VDD is formed above the N-type diffusion region D27 for supplying a well voltage. Further, for example, the shared contact SC1a is formed above the diffusion region D6a. The shared contact SC1a is formed to extend above the gate electrode G2a. The same applies to the other shared contacts.

FIG. 28 also shows the N well formation region, and an N well NW is formed on a P-type substrate PSUB. On the N well NW, the P-type diffusion regions D4a and D5a, and the diffusion region D25a where N type and P type are mixed are formed. Further, the N-type diffusion region D30 is formed at the end of the well voltage supply cell WSC11. In the cross-section of FIG. 28, the N-type diffusion region for supplying a well voltage is not formed. On each diffusion region, a diffusion region contact or a shared contact is formed with a silicide layer SL interposed therebetween.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   a first memory cell including a first gate electrode constituting a transistor lying in a first direction on a P well and an N well;
   a second memory cell including a second gate electrode constituting a transistor located symmetrically to the first gate electrode with respect to an axis in the first direction; and
   a first well voltage supply cell located between the first memory cell and the second memory cell in a direction perpendicular to the first direction and supplying voltages to the P well and the N well,
   wherein the first well voltage supply cell includes:
   a third gate electrode located symmetrically to the first gate electrode with respect to a border line with the first memory cell located adjacently;
   a fourth gate electrode located symmetrically to the second gate electrode with respect to a border line with the second memory cell located adjacently;
   a P-type impurity diffusion region located on the P well between the third gate electrode and the fourth gate electrode located opposite to each other;
   a first N-type impurity diffusion region located on a side of the third gate electrode closer to the first memory cell; and
   a second N-type impurity diffusion region located on a side of the fourth gate electrode closer to the second memory cell.

2. The semiconductor device according to claim 1,
   wherein the first N-type impurity diffusion region is formed in contact with the third gate electrode, and the second N-type impurity diffusion region is formed in contact with the fourth gate electrode.

3. The semiconductor device according to claim 1,
   wherein the first well voltage supply cell further includes a third N-type impurity diffusion region located on the N well between the third gate electrode and the fourth gate electrode.

4. The semiconductor device according to claim 1,
   wherein the P-type impurity diffusion region is formed in contact with the third gate electrode and the fourth gate electrode.

5. The semiconductor device according to claim 4,
wherein a P-type impurity concentration of the third gate electrode is higher than a P-type impurity concentration of the first gate electrode.

6. The semiconductor device according to claim 4,
wherein a P-type impurity concentration of the fourth gate electrode is higher than a P-type impurity concentration of the second gate electrode.

7. The semiconductor device according to claim 1,
wherein a first power supply voltage to be supplied to the P well through the P-type impurity diffusion region is lower than a second power supply voltage to cause transistors in the first and second memory cells to operate.

8. The semiconductor device according to claim 3,
wherein a first power supply voltage to be supplied to the N well through the third N-type impurity diffusion region is higher than a second power supply voltage to operate transistors in the first and second memory cells.

9. The semiconductor device according to claim 1, further comprising:
a second well voltage supply cell located adjacent to the first well voltage supply cell in the first direction,
wherein the first well voltage supply cell and the second well voltage supply cell are arranged line-symmetrically with respect to a border line.

10. The semiconductor device according to claim 3, wherein the third N-type impurity diffusion region is formed protruding toward the first direction.

11. The semiconductor device according to claim 3, wherein each of the third gate electrode and the fourth gate electrode forms a diode.

\* \* \* \* \*